(12) United States Patent
Yang et al.

(10) Patent No.: US 12,075,673 B2
(45) Date of Patent: Aug. 27, 2024

(54) DISPLAY PANEL COMPRISING A DATA LINE INCLUDING SUB-DATA LINES AND DISPLAY DEVICE HAVING THE SAME

(71) Applicant: Wuhan Tianma Micro-Electronics Co., Ltd., Wuhan (CN)

(72) Inventors: Xingxing Yang, Wuhan (CN); Yangzhao Ma, Wuhan (CN); Zhiqiang Xia, Wuhan (CN)

(73) Assignee: Wuhan Tianma Micro-Electronics Co., Ltd., Wuhan (CN)

(*) Notice: Subject to any disclaimer, the term of this patent is extended or adjusted under 35 U.S.C. 154(b) by 0 days.

(21) Appl. No.: 18/218,710

(22) Filed: Jul. 6, 2023

(65) Prior Publication Data

US 2023/0354661 A1 Nov. 2, 2023

Related U.S. Application Data

(63) Continuation of application No. 17/193,146, filed on Mar. 5, 2021, now Pat. No. 11,737,325.

(30) Foreign Application Priority Data

Aug. 27, 2020 (CN) .......................... 202010875868.1

(51) Int. Cl.
| | | |
|---|---|---|
| *H10K 59/12* | (2023.01) | |
| *H10K 59/121* | (2023.01) | |
| *H10K 59/131* | (2023.01) | |
| *H10K 59/88* | (2023.01) | |
| *H01L 27/12* | (2006.01) | |
| *H10K 59/35* | (2023.01) | |

(52) U.S. Cl.
CPC ....... *H10K 59/131* (2023.02); *H10K 59/1213* (2023.02); *H10K 59/1216* (2023.02); *H10K 59/88* (2023.02); *H01L 27/1214* (2013.01); *H10K 59/35* (2023.02)

(58) Field of Classification Search
CPC .. H10K 59/131; H10K 59/1213; H10K 59/88; H10K 59/1216; H10K 59/35
USPC ........................................................ 257/71
See application file for complete search history.

(56) References Cited

FOREIGN PATENT DOCUMENTS

| | | | | |
|---|---|---|---|---|
| CN | 108389881 A | * | 8/2018 | ......... H01L 27/3244 |
| CN | 108806513 A | | 11/2018 | |
| CN | 208386618 U | | 1/2019 | |
| CN | 109459879 A | | 3/2019 | |
| CN | 110265455 A | | 9/2019 | |

(Continued)

*Primary Examiner* — Phuc T Dang
(74) *Attorney, Agent, or Firm* — Anova Law Group, PLLC

(57) ABSTRACT

A display panel includes a first display region, a second display region, a third display region, a plurality of first pixel circuits, a plurality of second pixel circuits, a plurality of third pixel circuits, a plurality of first data lines, and a plurality of second data lines. The second display region at least partially surrounds the first display region, the third display region at least partially surrounds the second display region and the first display region, and a light transmittance of the first display region is greater than a light transmittance of the third display region. The plurality of first pixel circuits and the plurality of second pixel circuits are in the second display region, and the plurality of third pixel circuits is in the third display region. The plurality of first data lines are connected to the plurality of first pixel circuits and the plurality of third pixel circuits.

20 Claims, 38 Drawing Sheets

(56) References Cited

FOREIGN PATENT DOCUMENTS

| | | | | |
|---|---|---|---|---|
| CN | 111180494 | A | 5/2020 | |
| CN | 210515985 | U | 5/2020 | |
| CN | 111326560 | A | 6/2020 | |
| CN | 111430436 | A * | 7/2020 | ......... H01L 27/3225 |
| CN | 111951727 | A * | 11/2020 | ........... G09G 3/2074 |
| KR | 20190042784 | A * | 4/2019 | ............. G09G 3/323 |

* cited by examiner

DISPLAY PANEL COMPRISING A DATA LINE INCLUDING SUB-DATA LINES AND DISPLAY DEVICE HAVING THE SAME

CROSS-REFERENCE TO RELATED APPLICATIONS

This application is a continuation of application Ser. No. 17/193,146, filed on Mar. 5, 2021, now issued as U.S. Pat. No. 11,737,325 on Aug. 22, 2023, which claims the priority of Chinese patent application No. 202010875868.1, filed on Aug. 27, 2020, the entirety of all of which is incorporated herein by references.

FIELD OF THE DISCLOSURE

The present disclosure generally relates to the field of display technology and, more particularly, relates to a display panel and a display device.

BACKGROUND

In electronic devices including display panels, the pursuit of a high screen-to-body ratio with better visual experience has become one of the current trends in the development of display technology.

Taking mobile phones, tablet computers, etc. as examples, in the current full-screen solution, a part of the display region of the display panel is multiplexed as a photosensitive-element integration region. At this time, photosensitive elements such as front camera and infrared sensors can be arranged on the back of the photosensitive-element integration region of the display panel as device components, and light can pass through the photosensitive-element integration region to reach the photosensitive elements, and thus achieve corresponding functions of the device components such as front cameras, infrared sensors, etc.

In the above solution, the light transmittance of the photosensitive-element integration region has an important impact on the performance of the photosensitive elements. However, in existing display panels and display devices, the light transmittance of the photosensitive-element integration region may need to be further improved. The disclosed display panel and display device are directed to solve one or more problems set forth above and other problems in the art.

BRIEF SUMMARY OF THE DISCLOSURE

One aspect of the present disclosure provides a display panel. The display panel includes a first display region, a second display region, and a third display region, a plurality of first pixel circuits, a plurality of second pixel circuits, a plurality of third pixel circuits, a plurality of first data lines, and a plurality of second data lines. The second display region at least partially surrounds the first display region, the third display region at least partially surrounds the second display region and the first display region, and a light transmittance of the first display region is greater than a light transmittance of the third display region. The plurality of first pixel circuits and the plurality of second pixel circuits are located in the second display region, and the plurality of third pixel circuits is located in the third display region. The plurality of first data lines are connected to the plurality of first pixel circuits and the plurality of third pixel circuits. Each first data line includes a first sub-data line, a second sub-data line, and a third sub-data line. The plurality of second data lines are arranged along a first direction, extend along a second direction, and are connected to the plurality of second pixel circuits and the plurality of third pixel circuits. The first direction intersects with the second direction. A plurality of second sub-data lines, a plurality of third sub-data lines, and a plurality of second data lines extend along the second direction. A length of each of the plurality of first data lines is greater than a length of each of the plurality of second data lines.

Another aspect of the present disclosure provides a display device, including a display panel. The display panel includes a first display region, a second display region, and a third display region, a plurality of first pixel circuits, a plurality of second pixel circuits, a plurality of third pixel circuits, a plurality of first data lines, and a plurality of second data lines. The second display region at least partially surrounds the first display region, the third display region at least partially surrounds the second display region and the first display region, and a light transmittance of the first display region is greater than a light transmittance of the third display region. The plurality of first pixel circuits and the plurality of second pixel circuits are located in the second display region, and the plurality of third pixel circuits is located in the third display region. The plurality of first data lines are connected to the plurality of first pixel circuits and the plurality of third pixel circuits. Each first data line includes a first sub-data line, a second sub-data line, and a third sub-data line. The plurality of second data lines are arranged along a first direction, extend along a second direction, and are connected to the plurality of second pixel circuits and the plurality of third pixel circuits. The first direction intersects with the second direction. A plurality of second sub-data lines, a plurality of third sub-data lines, and a plurality of second data lines extend along the second direction. A length of each of the plurality of first data lines is greater than a length of each of the plurality of second data lines.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that unless specifically stated otherwise, the relative arrangement of the components and steps, numerical expressions and numerical values set forth in the embodiments do not limit the scope of the present disclosure. The following description of the at least one exemplary embodiment is merely illustrative, and by no means can be considered as limitations for the application or use of the present disclosure. In addition, it should be noted that, for illustrative purposes, the drawings show, instead of all of the structure, only a part of the structure related to the present disclosure.

It should be noted that techniques, methods, and apparatuses known to those of ordinary skill in the relevant art may not be discussed in detail, but where appropriate, the techniques, methods, and apparatuses should be considered as part of the specification.

It should be noted that in all the examples provided and discussed herein, any specific value should be interpreted as merely exemplary and not as a limitation. Therefore, other examples of the exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
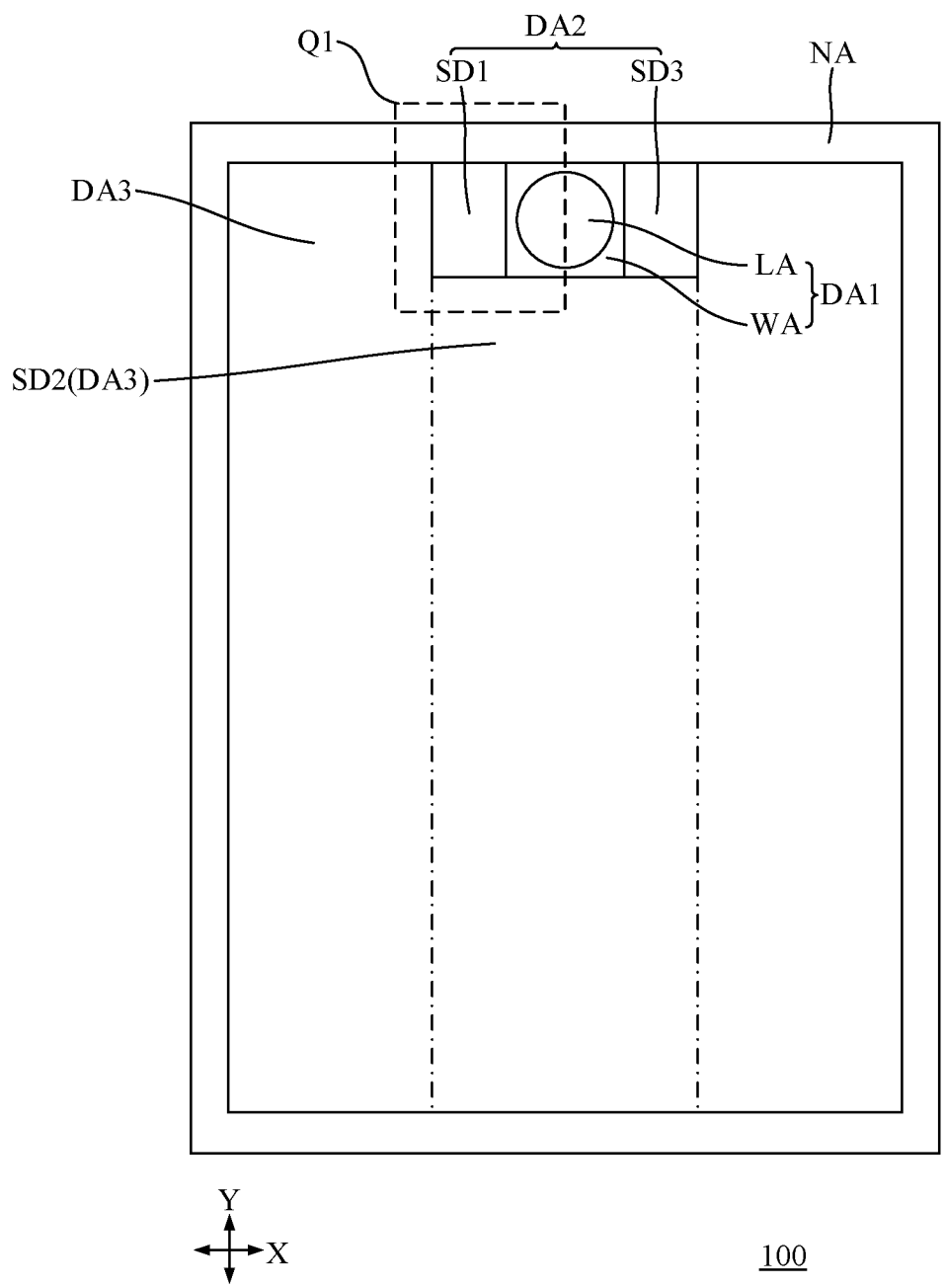
FIG. 1 illustrates a schematic top view of an exemplary display panel according to various embodiments of the present disclosure.
Figure 2:
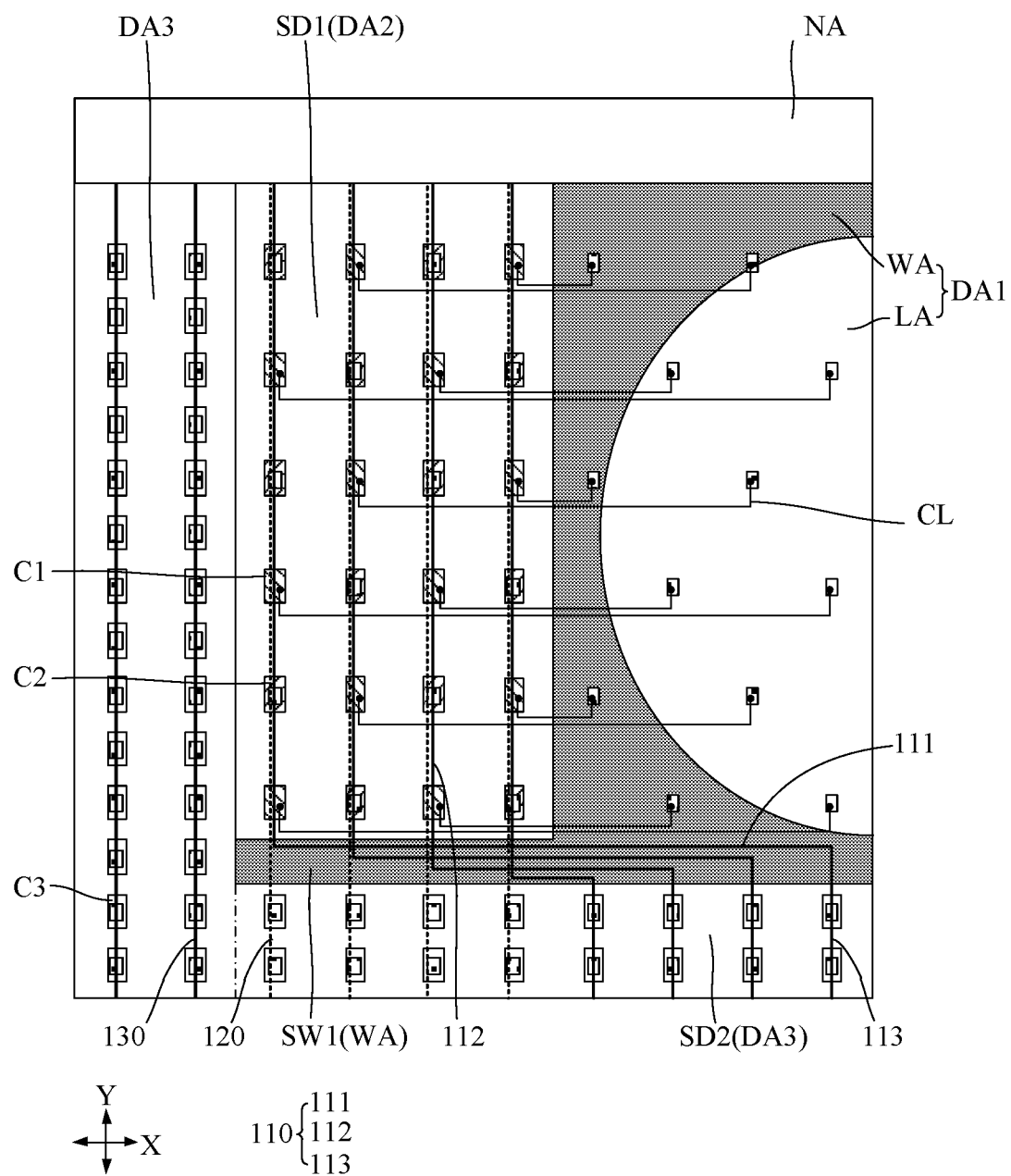
FIG. 2 illustrates a partial schematic top view of an exemplary display panel according to various embodiments of the present disclosure.

The present disclosure provides a display panel. FIG. 1 illustrates a schematic top view of an exemplary display panel according to various embodiments of the present disclosure, and FIG. 2 illustrates a partial schematic top view of an exemplary display panel according to various embodiments of the present disclosure. Specifically, FIG. 2 shows a schematic enlarged view of a Q1 region in FIG. 1.

Referring to FIGS. 1-2, a display panel 100 may include a first display region DA1, a second display region DA2, and a third display region DA3. The second display region DA2 may at least partially surround the first display region DA1, and the third display region DA3 may at least partially surround the first display region DA1. The light transmittance of the first display region DA1 may be greater than the light transmittance of the third display region DA3. The first display region DA1 may include an effective light-transmission region LA and a wiring region WA located on at least one side of the effective light-transmission region LA. The effective light-transmission region LA may be a region on the display panel 100 that can both display and effectively emit light.

The display panel 100 may further include a plurality of first pixel circuits C1, a plurality of second pixel circuits C2, and a plurality of third pixel circuits C3. The plurality of first pixel circuits C1 and the plurality of second pixel circuits C2 may be located in the second display region DA2, and the plurality of third pixel circuits C3 may be located in the third display region DA3.

In one embodiment, the term "pixel circuit" refers to the smallest repeating unit of the circuit structure that drives a corresponding light-emitting element to emit light. The pixel circuit may be a 2T1C circuit, a 7T1C circuit, a 7T2C circuit, etc. In the present disclosure, the term "2T1C circuit" refers to a pixel circuit that includes 2 thin film transistors (T) and 1 capacitor (C). Other circuits, such as "7T1C circuit", "7T2C circuit", etc. can be understood analogous to the above example.

The display panel 100 may further include a plurality of first data lines 110 and a plurality of second data lines 120. The plurality of first data lines 110 may be connected to the first pixel circuits C1 and the third pixel circuits C3, and the plurality of second data lines 120 may be connected to the second pixel circuits and the third pixel circuits C3. The plurality of first data lines 110 may include a plurality of first sub-data lines 111, a plurality of second sub-data lines 112, and a plurality of third sub-data lines 113 that are electrically connected together. The wiring region WA may be provided with a plurality of first sub-data lines 111, the second display region DA2 may be provided with a plurality of second sub-data lines 112, and the third display region DA3 may be provided with a plurality of third sub-data lines 113.

In the plurality of first data lines 110, the second sub-data lines 112 may at least partially extend in the second display region DA2, and each second sub-data line 112 may extend substantially along the second direction Y, and the plurality of second sub-data lines 112 may be arranged along the first direction X. The third sub-data lines 113 may at least partially extend in the third display region DA3, and each third sub-data line 113 may extend substantially along the second direction Y, and the plurality of third sub-data lines 113 may be arranged along the first direction X. The first sub-data line 111, the second sub-data line 112, and the third sub-data line 113 included in the same first data line 110 may be electrically connected together to form the first data line 110.

In one embodiment, the second pixel circuit C2 and the third pixel circuit C3 connected to each second data line 120 may also be substantially located in the same column, so that each second data line 120 may extend substantially along the second direction Y, and the plurality of second data lines 120 may be arranged along the first direction X. However, the extending direction of each second data line 120 is not limited to the example described above. According to the respective arrangement manners of the second pixel circuit C2 and the third pixel circuit C3, the extending manner of the second data line 120 may be adaptively adjusted in order to electrically connect the corresponding second pixel circuit C2 with the corresponding third pixel circuit C3.

In one embodiment, each second data line 120 may be simultaneously connected to a corresponding second pixel circuit C2 in the second display region DA2 and a third pixel circuit C3 in the third display region DA3. Each second data line 120 may substantially extend along the second direction Y, and the plurality of second data lines 120 may be arranged along the first direction X, so that in each second data line 120, the portion located in the second display region DA2 may be connected to the portion located in the third display region DA3.

According to the display panel consistent with various embodiments of the present disclosure, the transmittance of the first display region is larger than the transmittance of the third display region, and the first display region includes an effective light-transmission region and a wiring region located on at least one side of the effective light-transmission region. The effective light-transmission region LA may be a region on the display panel 100 that can both display and effectively emit light. The display panel includes first data lines, and the first data lines are connected to the first pixel circuits and the third pixel circuits. Each first data lines include a first sub-data line, a second sub-data line, and a third sub-data line that are electrically connected together. The wiring region is provided with a plurality of first sub-data lines, the second display region is provided with a plurality of second sub-data lines, and the third display region is provided with a plurality of third sub-data lines. The first pixel circuit and the first data line are both arranged outside the effective light-transmission region, thereby reducing the wiring structure in the effective light-transmission region. As such, the light transmittance of the effective light-transmission region is improved. When photosensitive elements are integrated on the back of the effective light-transmission region to realize the under-screen integration of the photosensitive elements, the effective light-transmission region may be able to meet the higher requirements of the photosensitive elements on the light transmittance of the display panel. In each first data line, the first sub-data line connecting to the second sub-data line located in the second display region and the third sub-data line in the third display region is disposed in the wiring region, such that the space on at least one side of the effective light-transmission region is effectively used.

Figure 3:
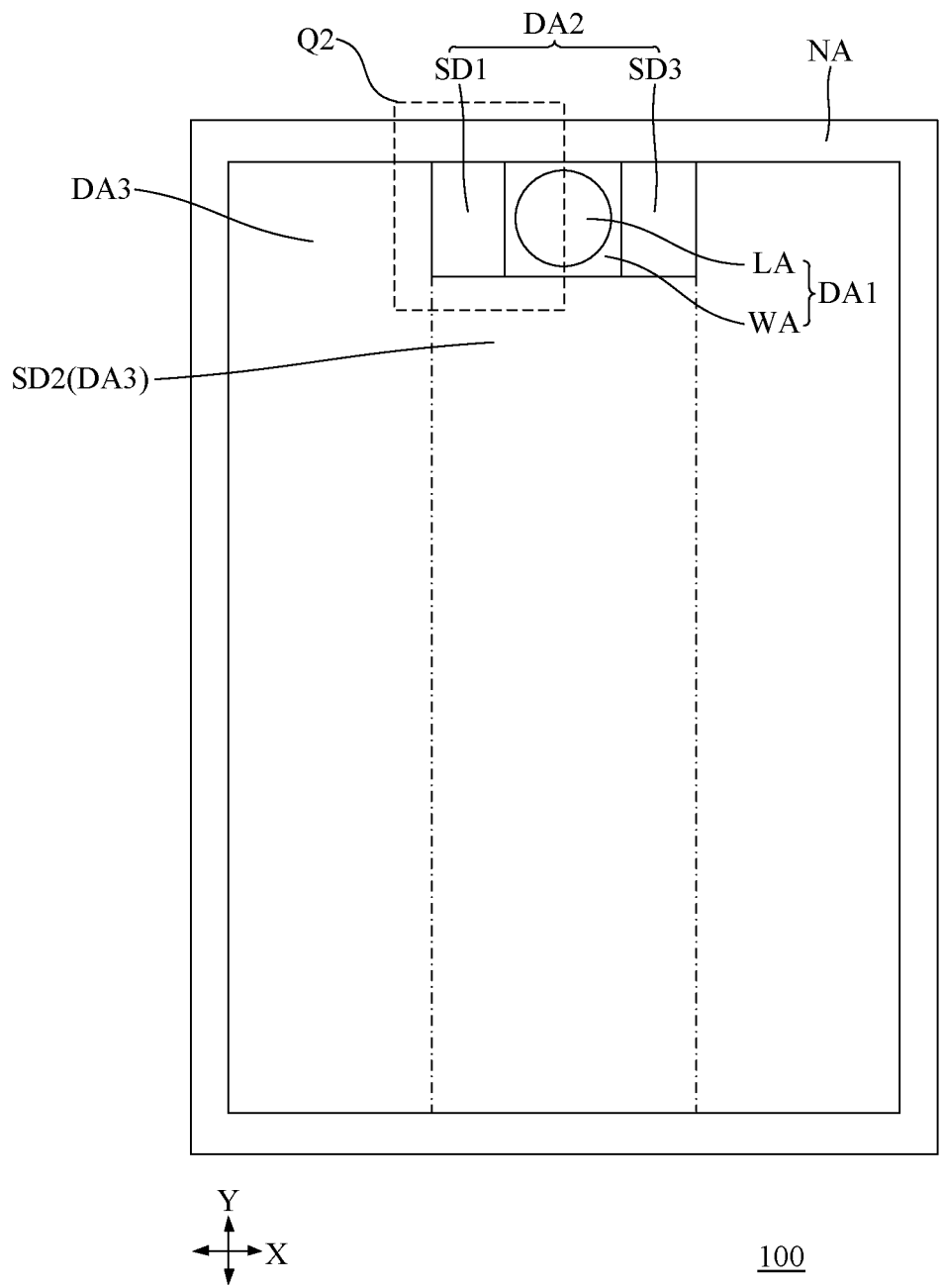
FIG. 3 illustrates a schematic top view of another exemplary display panel according to various embodiments of the present disclosure.
Figure 4:
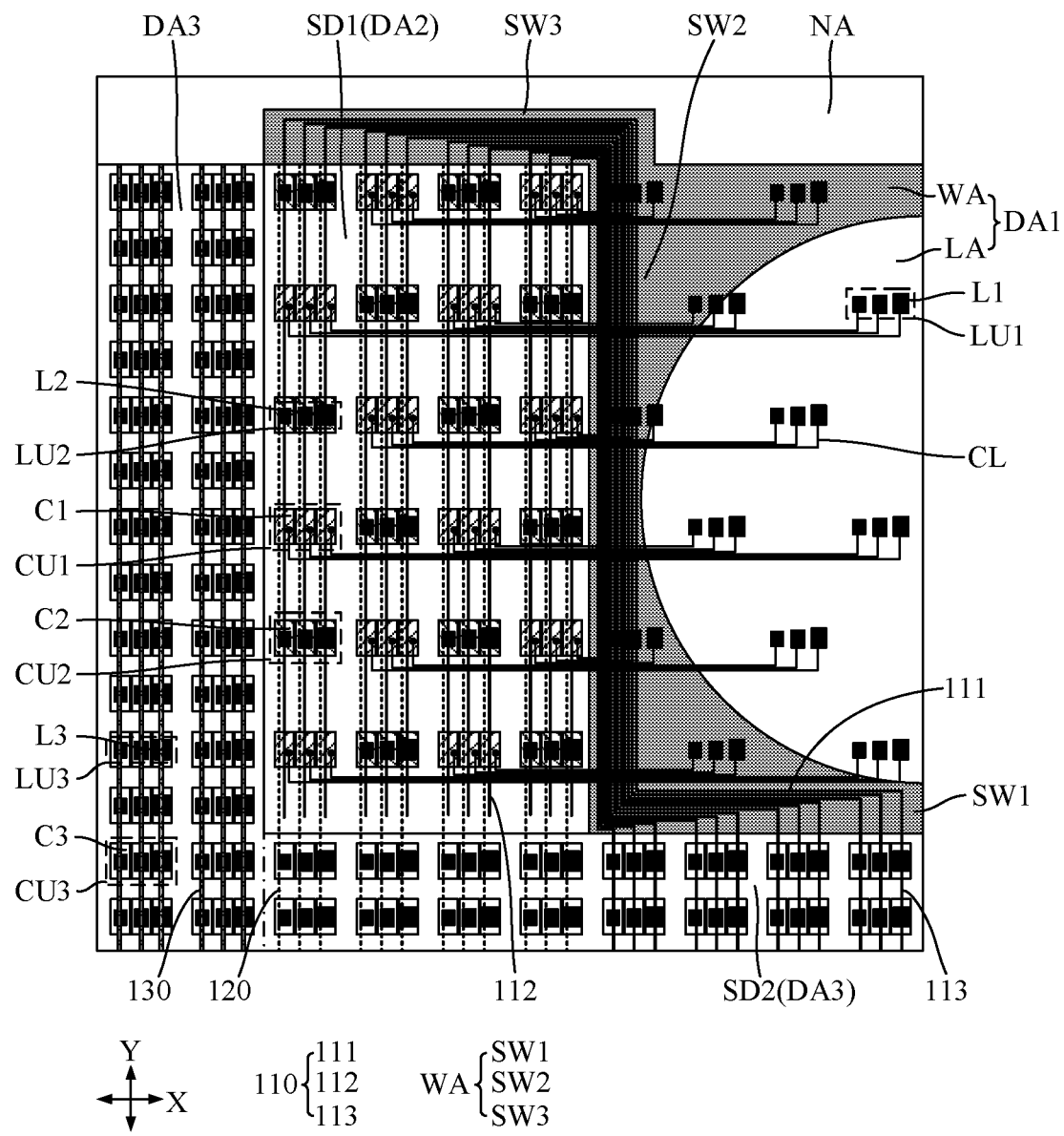
FIG. 4 illustrates a partial schematic top view of another exemplary display panel according to various embodiments of the present disclosure.

FIG. 3 illustrates a schematic top view of another exemplary display panel according to various embodiments of the present disclosure, and FIG. 4 illustrates a partial schematic top view of the exemplary display panel. Specifically, FIG. 4 shows, for example, a partial enlarged view of a Q2 region shown in FIG. 3.

Referring to FIGS. 3-4, in other embodiments, the display panel 100 may further include a plurality of first light-emitting units LU1, a plurality of second light-emitting units LU2, and a plurality of third light-emitting units LU3. The plurality of first light-emitting units LU1 may be arranged in an array in the first display region DA1, the plurality of second light-emitting units LU2 may be arranged in an array in the second display region DA2, and the plurality of third light-emitting units LU3 may be arranged in an array in the third display region DA3.

Each first light-emitting unit LU1 may include at least one first light-emitting element L1, each second light-emitting unit LU2 may include at least one second light-emitting element L2, and each third light-emitting unit LU3 may include at least one third light-emitting element L3. The first pixel circuit C1 may be electrically connected to at least one corresponding first light-emitting element L1, the second pixel circuit C2 may be electrically connected to at least one corresponding second light-emitting element L2, and the third pixel circuit C3 may be electrically connected to at least one corresponding third light-emitting element L3. A first data line 110 may connect to the first pixel circuit C1 corresponding to the at least one first light-emitting element L1 and the third pixel circuit C3 corresponding to the at least one third light-emitting element L3; and a second data line 120 may connect to the second pixel circuit C2 corresponding to the at least one second light-emitting element L2 and the third pixel circuit C3 corresponding to the at least one third light-emitting element L3.

In one embodiment, the first light-emitting element L1, the second light-emitting element L2, and the third light-emitting element L3 may be light-emitting elements of an organic light-emitting diode (OLED) type. That is, the display panel may be an OLED display panel. It should be understood that the display panel according to various embodiments of the present disclosure may be any other self-luminous display panel that can be driven in an active matrix (AM) manner similar to the OLED display panel.

In one embodiment, each first light-emitting unit LU1 may include three light-emitting elements L1, and the three light-emitting elements L1 may emit light in different colors. In one embodiment, the three first light-emitting elements L1 of each first light-emitting unit LU1 may be arranged along a preset direction (e.g., the three first light-emitting elements L1 of each first light-emitting unit LU1 may be arranged approximately in a line). In one embodiment, each first light-emitting element L1 may have a rectangular shape, and the three first light-emitting elements L1 of each first light-emitting unit LU1 may have different sizes. The arrangement of the light-emitting elements in each second light-emitting unit LU2 and each third light-emitting unit LU3 may be similar to the arrangement of the light-emitting elements in the first light-emitting unit LU1.

It should be noted that based on actual design requirements of the display panel, the numbers of light-emitting elements, the light-emitting color ratio, the shape of the light-emitting elements, the arrangement of the light-emitting elements, etc. may be configured and adjusted accordingly for each first light-emitting unit LU1, each second light-emitting unit LU2, and each third light-emitting unit LU3. In some examples, the number of the first light-emitting elements L1 included in each first light-emitting unit LU1 may be two; and in some other examples, the number of the first light-emitting elements L1 included in each first light-emitting unit LU1 may be four. In some examples, each first light-emitting unit LU1 may include a first light-emitting element L1 emitting red light, a first light-emitting element L1 emitting green light, and a first light-emitting element L1 emitting blue light; and in some other examples, each first light-emitting unit LU1 may include a first light-emitting element L1 emitting red light, a first light-emitting element L1 emitting green light, a first light-emitting element L1 emitting blue light, and a first light-emitting element L1 emitting white light. In some examples, the shape of the first light-emitting element L1 in the first light-emitting unit LU1 may be a circle, an oval, etc.; and in some other embodiments, the shape of the first light-emitting element L1 in the first light-emitting unit LU1 may be a square, a hexagon, or another type of polygon. In some examples, the plurality of first light-emitting elements L1 of each first light-emitting unit LU1 may be arranged on the vertices of a virtual triangle, that is, the plurality of first light-emitting elements L1 in the first light-emitting unit LU1 may be arranged in a delta ($\Delta$) structure; and in some other examples, the plurality of first light-emitting elements L1 of the first light-emitting unit LU1 may be arranged in a PenTiel matrix structure or any other appropriate structure.

In the present disclosure, a case in which each first pixel circuit C1 is correspondingly connected to a first light-emitting element L1, each second pixel circuit C2 is correspondingly connected to a second light-emitting element L2, and each third pixel circuit C3 is correspondingly connected to a third light-emitting element L3 is described as an example to further illustrate the principle of the disclosed display panel. However, the correspondence between the first pixel circuit C1 and the first light-emitting element L1, the correspondence between the second pixel circuit C2 and the second light-emitting element L2, and the correspondence between the third pixel circuit C3 and the third light-emitting element L3 may not be limited to the example illustrated in the present disclosure. For example, the number of the corresponding first light-emitting elements L1 that each first pixel circuit C1 is electrically connected to may be two, three, four, or any other appropriate integer, such that the first pixel circuit can simultaneously drive a corresponding number of first light-emitting elements L1 of the same color to emit light.

In one embodiment, the first light-emitting element L1 may be arranged in the first display region DA1, and there is no pixel circuit disposed in the first display region DA1, so that the circuit structure of the first display region DA1 may be simple (e.g., the circuit structure may cover a limited area in the first display region DA1), and thus the light transmittance may be improved. The first display region DA1 may display or transmit light. Thus, the first display region DA1 may be used as a photosensitive-element integration region. Further, the photosensitive elements may be arranged on the non-display surface of the first display region DA1. The orthogonal projection of the effective photosensitive surface of the photosensitive element on the display panel 100 may be covered by the effective light-transmission region LA. In some embodiments, the shape of the effective light-transmission region LA may match the shape of the effective photosensitive surface of the photosensitive element. The effective light-transmission region LA may be a region on the display panel 100 that can both display and effectively emit light. The wiring region WA may also be a region that can both display and effectively emit light. In some other embodiments, the light transmittance of the wiring region WA may be lower than the light transmittance of the effective light-transmission region LA.

It should be noted that in the first display region DA1, the wiring region WA may be located on at least one side of the effective light-transmission region LA, the second display region DA2 may at least partially surround the first display region DA1, and the third display region DA3 may also at least partially surround the first display region DA1. The first display region DA1 and the wiring region WA may have regular shapes or irregular shapes. The irregular shape may include, for example, a combined shape obtained by combining two or more regular shapes. In some embodiments, the second display region DA2 may be arranged to partially surround the first display region DA1, so that a part of the first display region DA1 may be surrounded by the second display region DA2. However, the first display region DA1 may also include a portion not surrounded by the second display region DA2.

The second display region DA2 may be provided with a second pixel circuit C2 for driving the second light-emitting element L2 to emit light, and a first pixel circuit C1 for driving the first light-emitting element L1 to emit light. The second display region DA2 may be transparent or opaque, and the light transmittance of the second display region DA2 may be set according to actual needs. In some embodiments, the second display region DA2 may transmit light, and the light transmittance of the second display region DA2 may be lower than the light transmittance of the first display region DA1.

The first pixel circuit C1 located in the second display region DA2 may be electrically connected to the first light-emitting element L1 located in the first display region DA1 through a connection line CL. In one embodiment, the connection line CL may be made of indium tin oxide (ITO), indium zinc oxide (IZO), or any other appropriate transparent conductive material, such that the light transmittance of the first display region DA1 may be improved. In one embodiment, a plurality of connection lines CL may be arranged in a same wiring layer of the display panel 100, and the plurality of connection lines CL corresponding to first light-emitting units LU1 in a same row may not overlap each other. In some other embodiments, the material of the connection line CL may not be limited to transparent conductive materials such as ITO, IZO, etc., and the connection line CL may be made of a metal that is opaque or the connection line CL may be partially made of a transparent conductive material and partially made of a metal that is opaque. For example, each connection line CL may include a first portion located in the first display region DA1 and a second portion in the second display region DA2. Further, the first portion may be made of a transparent conductive material and the second portion may be made of a metal, such that the resistance of the connection line CL may be reduced while a high light transmittance may be ensured for the first display region.

In addition, the plurality of connection lines CL may not be limited to being arranged in the same wiring layer of the display panel 100. In some embodiments, a first quantity of connection lines CL and a second quantity of connection lines may be respectively located in different wiring layers of the display panel 100. In some embodiments, the orthogonal projections of at least part of the connection lines CL on the display surface of the display panel 100 may overlap each other, so as to reduce the area occupied by the connection lines CL on the display surface and increase, to a certain extent, the light transmittance of the first display region DA1. In the display panel 100, each connection line CL can be arranged on one wiring layer, or different parts of the each connection line CL can be arranged in different wiring layers.

In one embodiment, the display panel 100 may further include a plurality of third data lines 130. A first data line 110 may connect to the first pixel circuit C1 corresponding to the first light-emitting element L1 and the third pixel circuit C3 corresponding to the third light-emitting element L3. The first data line 110 may include a first sub-data line 111, a second sub-data line 112, and a third sub-data line 113 that are electrically connected together. The wiring region WA may be provided with a plurality of first sub-data lines 111, the second display region DA2 may be provided with a plurality of second sub-data lines 112, and the third display region DA3 may be provided with a plurality of third sub-data lines 113.

The first light-emitting unit LU1, the second light-emitting unit LU2, and the third light-emitting unit LU3 may be respectively arranged in an array in the corresponding display region. For example, the first light-emitting unit LU1, the second light-emitting unit LU2, and the third light-emitting unit LU3 may be respectively arranged in multiple rows and multiple columns in the corresponding display region. The first light-emitting unit LU1, the second light-emitting unit LU2, and the third light-emitting unit LU3 may be arranged in rows extending in a direction parallel to a first direction X, and the first light-emitting unit LU1, the second light-emitting unit LU2, and the third light-emitting unit LU3 may be arranged in columns extending in a direction parallel to a second direction Y. The first direction X may intersect with the second direction Y. For example, the first direction X may be perpendicular to the second direction Y.

Each first data line 110 may be connected with a first pixel circuit C1 and a third pixel circuit C3. That is, each first data line 110 may be indirectly connected to a first pixel circuit C1 and a third pixel circuit C3. The first light-emitting element L1 and the third light-emitting element L3 corresponding to each first data line 110 may be selectively arranged substantially in the same column, that is, the first light-emitting element L1 corresponding to each first data line 110 may be substantially located on a same straight line extending in the second direction Y (e.g., passed by a same straight line extending in the second direction Y).

A second data line 120 may connect to the second pixel circuit C2 corresponding to the second light-emitting element L2 and the third pixel circuit C3 corresponding to the third light-emitting element L3. The second data line 120 may include a portion extending in the second display region DA2, and a portion extending in the third display region DA3.

Each second data line 120 may be connected to a second pixel circuit C2 and a third pixel circuit C3, that is, each second data line 120 may be indirectly connected to the second light-emitting element L2 and the third light-emitting element L3. For each second data line 120, the corresponding second light-emitting element L2 and the corresponding third light-emitting element L3 may be substantially located in a same column. That is, the second light-emitting element L2 and the third light-emitting element L3 corresponding to a same second data line 120 may be substantially located on a same line along the second direction Y (e.g. passed by the same line extending in the second direction Y).

In the above embodiment, each second data line 120 is simultaneously connected to a second pixel circuit C2 of the second display region DA2 and a third pixel circuit C3 of the third display region DA3. Each second data line 120 may extend substantially along the second direction Y, and the plurality of second data lines 120 may be arranged along the first direction X, so that in each second data line 120, the portion located in the second display region DA2 may be connected to the portion located in the third display region DA3 in a short-distance manner. In the present disclosure, two parts of a data line connected in a short-distance manner refers to a small distance between the two parts of the data line in the first direction, or even the two parts of the data line located on a same straight line extending in the second direction Y. For example, by adjusting the positions of the second pixel circuits C2, the second light-emitting elements L2, and the first pixel circuits C1 in the second display region DA2, the plurality of second pixel circuits C2 (together with the corresponding second light-emitting element L2) that originally corresponds to a same second data line 120 may be substantially arranged in the second direction Y, so that portions of the same second data line 120 in different regions can be connected in the short-distance manner. By making connections in the short-distance manner, the complexity of wiring the second data line on the display panel 100 may be reduced, and the number of intersections of lines in a same signal type may be reduced. As such, fabricating the wire lay in the display panel may be convenient, and in the meantime, the risk of data line signal crosstalk may be reduced.

In some embodiments, the second sub-data line 112 and the third sub-data line 113 in each first data line 110 may also be connected in the short-distance manner. As such, the required length of the first sub-data line 111 may be reduced, and the wiring complexity of the first data line 110 in the display panel 100 may be reduced, forming the wire layer in the display panel 100 may be more convenient, and the reliability of signal transmission may be improved.

The third data line 130 may be connected to the third pixel circuit C3 corresponding to the third light-emitting element L3, and the plurality of third data lines 130 may extend in the third display region DA3. In one embodiment, each third data line 130 may be electrically connected to a row of third pixel circuits C3 in the third display region DA3, and may thus be electrically connected to a row of third light-emitting elements L3 in the third display region DA3 in an indirect manner. Each third data line 130 may extend substantially along the second direction Y, and the plurality of third data lines 130 may be arranged along the first direction X.

The first data line 110, the second data line 120, and the third data line 130 may transmit signals of the same type, and may all be used to transmit data signals.

According to the display panel 100 provided by the embodiments of the present disclosure, the first pixel circuit C1 and the first data line 110 are both arranged outside the effective light-transmission region LA, thereby reducing the wiring structure in the effective light-transmission region LA. As such, the light transmittance of the effective light-transmission region LA may be improved. When photosensitive elements are integrated on the back of the effective light-transmission region LA to realize the under-screen integration of the photosensitive elements, the effective light-transmission region LA may be able to meet the higher requirements of the photosensitive elements on the light transmittance of the display panel 100. In each first data line 110, the first sub-data line 111 connecting to the second sub-data line 112 located in the second display region DA2 and the third sub-data line 113 located in the third display region DA3 may be disposed in the wiring region WA, such that the space on at least one side of the effective light-transmission region LA may be effectively used. In the display panel 100 described in the above embodiments, the wiring region WA may be able to accommodate a large number of first sub-data lines 111, and thus may provide wiring feasibility for the data lines in the display panel 100 that has a high pixel density and an effective light-transmission region LA.

Referring to FIGS. 3-4, in one embodiment, the second display region DA2 may include a first sub-display region SD1, and along the first direction X, the first sub-display region SD1 may be located on the side of the first display region DA1. The third display region DA3 may include a second sub-display region SD2, and in the second direction Y, the second sub-display region SD2 may be located on the side of the first display region DA1.

In the first sub-display region SD1, the plurality of first pixel circuits C1 may be arranged in an array with n columns in the first direction X and m rows in the second direction Y, where m and n are both integers greater than 1.

The second display region DA2 may only include the first sub-display region SD1. However, the second display region DA2 only including the first sub-display region SD1 may be unnecessary in actual applications. In one example, referring to FIG. 3, the second display region DA2 may further include a third sub-display region SD3, and the first sub-display region SD1 and the third sub-display region SD3 may be respectively located on the two sides of the first display region DA1. The plurality of first pixel circuits C1 that is used to drive the plurality of first light-emitting elements L1 in the first display region DA1 to emit light may include a portion arranged in the first sub-display region SD1 and a portion arranged in the third sub-display region SD3.

In some embodiments, the arrangement as well as the interconnections and other structures of light-emitting elements, pixel circuits, and lead wires in the third sub-display region SD3 may be similar to those in the first sub-display region SD1. Therefore, in the following, detailed description will be provided for light-emitting elements, pixel circuits, and lead wires in the first sub-display region SD1, and the third sub-display region SD3 will not be described in detail.

Referring to FIG. 4, in some embodiments, the wiring region WA may include a first sub-wiring region SW1, a second sub-wiring region SW2, and a third sub-wiring region SW3. Along the second direction Y, the first sub-wiring region SW1 may be located between the second sub-display region SD2 and the effective light-transmission region LA. Along the first direction X, the second sub-wiring region SW2 may be located between the second sub-display region SD2 and the effective light-transmission region LA. Along the second direction Y, the third sub-wiring region SW3 may be located on the side of the first sub-display region SD1 away from the second display region SD2. The first sub-data line 111 may extend from the first sub-wiring region SW1 to the third sub-wiring region SW3 through the second sub-wiring region SW2. In addition, the first sub-data line 111 may be electrically connected to the second sub-data line 112 at the boundary between the third sub-wiring region SW3 and the second sub-display region SD2.

In one embodiment, the third sub-wiring region SW3 may be located in the first sub-display region SD1 away from the second sub-display region SD2, so that the wiring region WA may make use of the region on the side of the first sub-display region SD1 away from the second sub-display region SD2. As such, the region suitable for arranging the first sub-data lines 111 may be increased, thereby conducive to accommodating more first sub-data lines. When the side of the first display region DA1 that is away from the second display region DA2 is a non-display region NA, the third sub-wiring region SW3 may be arranged adjacent to the non-display region NA, so that the outer frame area (mainly the non-display region NA) of the display panel 100 may be utilized to further increase the region suitable for arranging the first sub-data lines 111.

Figure 5:
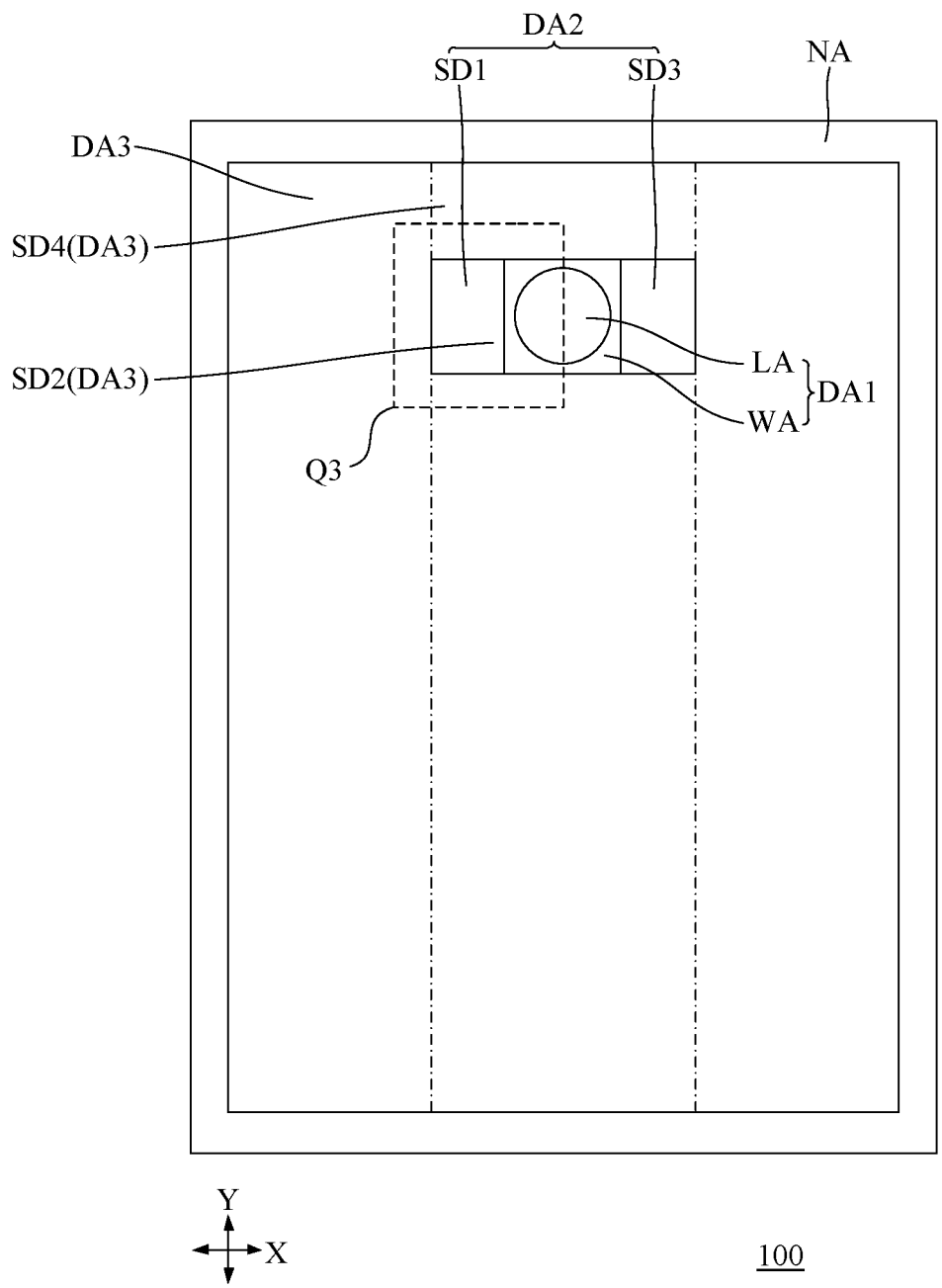
FIG. 5 illustrates a schematic top view of another exemplary display panel according to various embodiments of the present disclosure.
Figure 6:
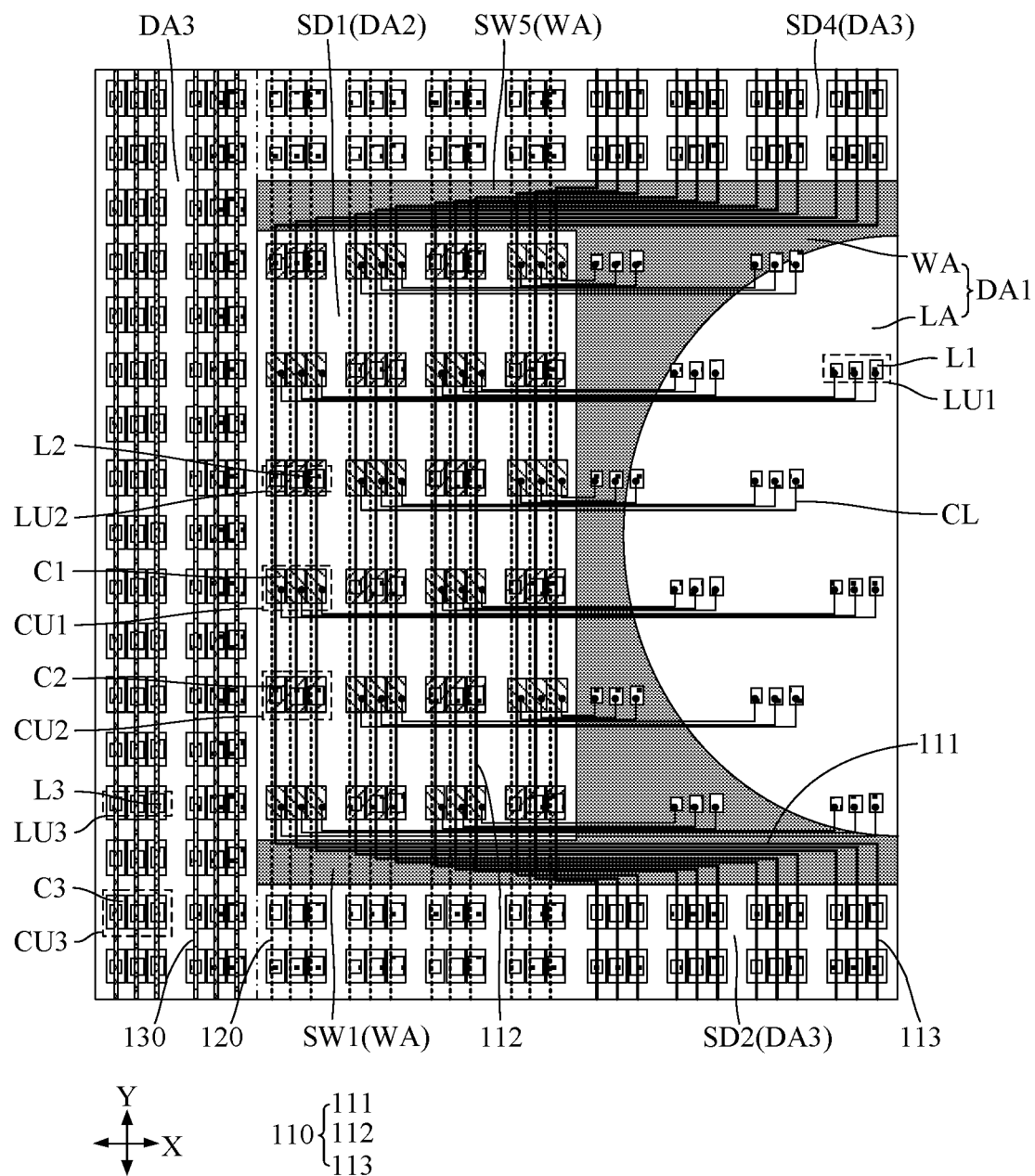
FIG. 6 illustrates a partial schematic top view of another exemplary display panel according to various embodiments of the present disclosure.
Figure 7:
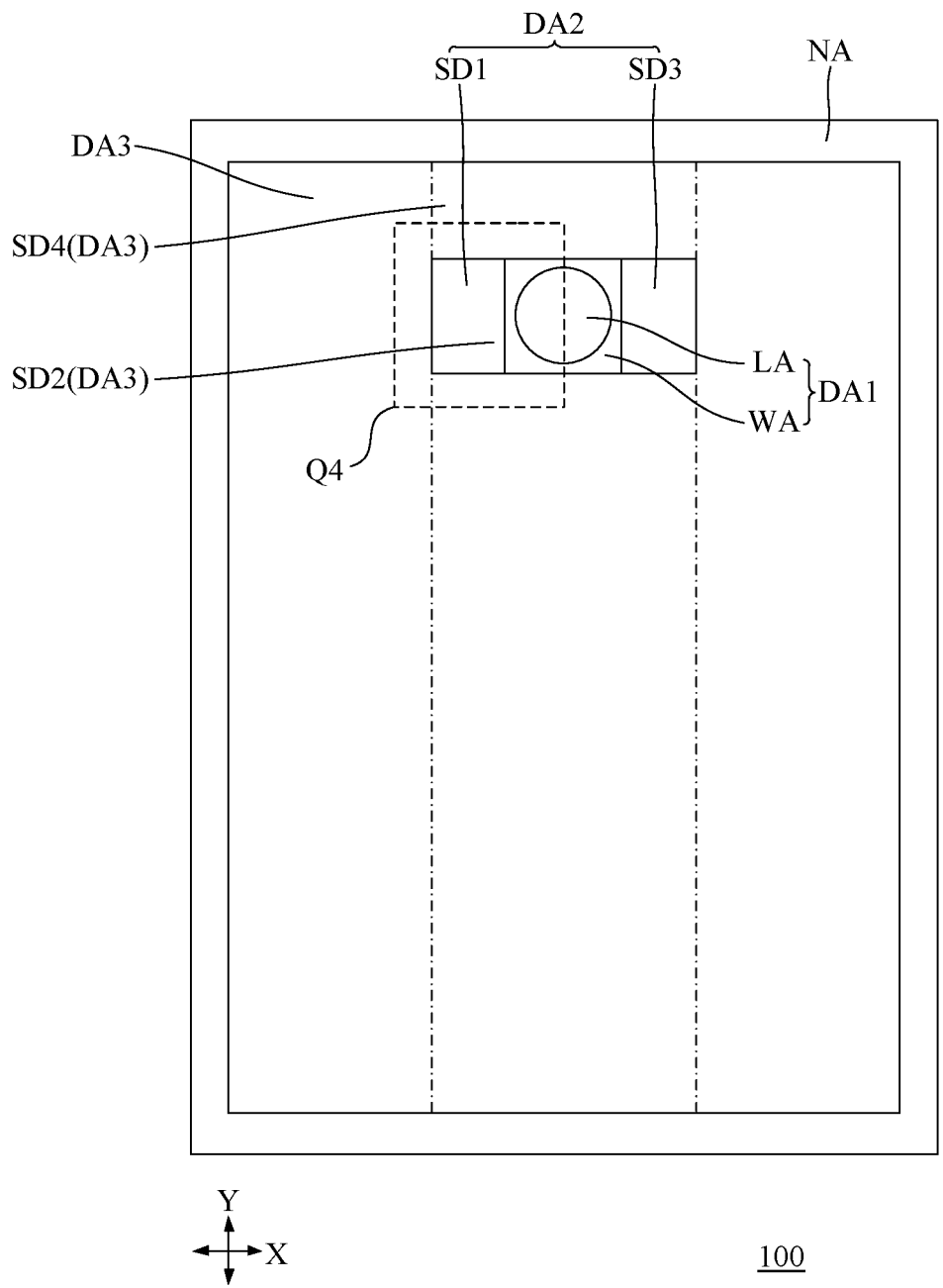
FIG. 7 illustrates a schematic top view of another exemplary display panel according to various embodiments of the present disclosure.
Figure 8:
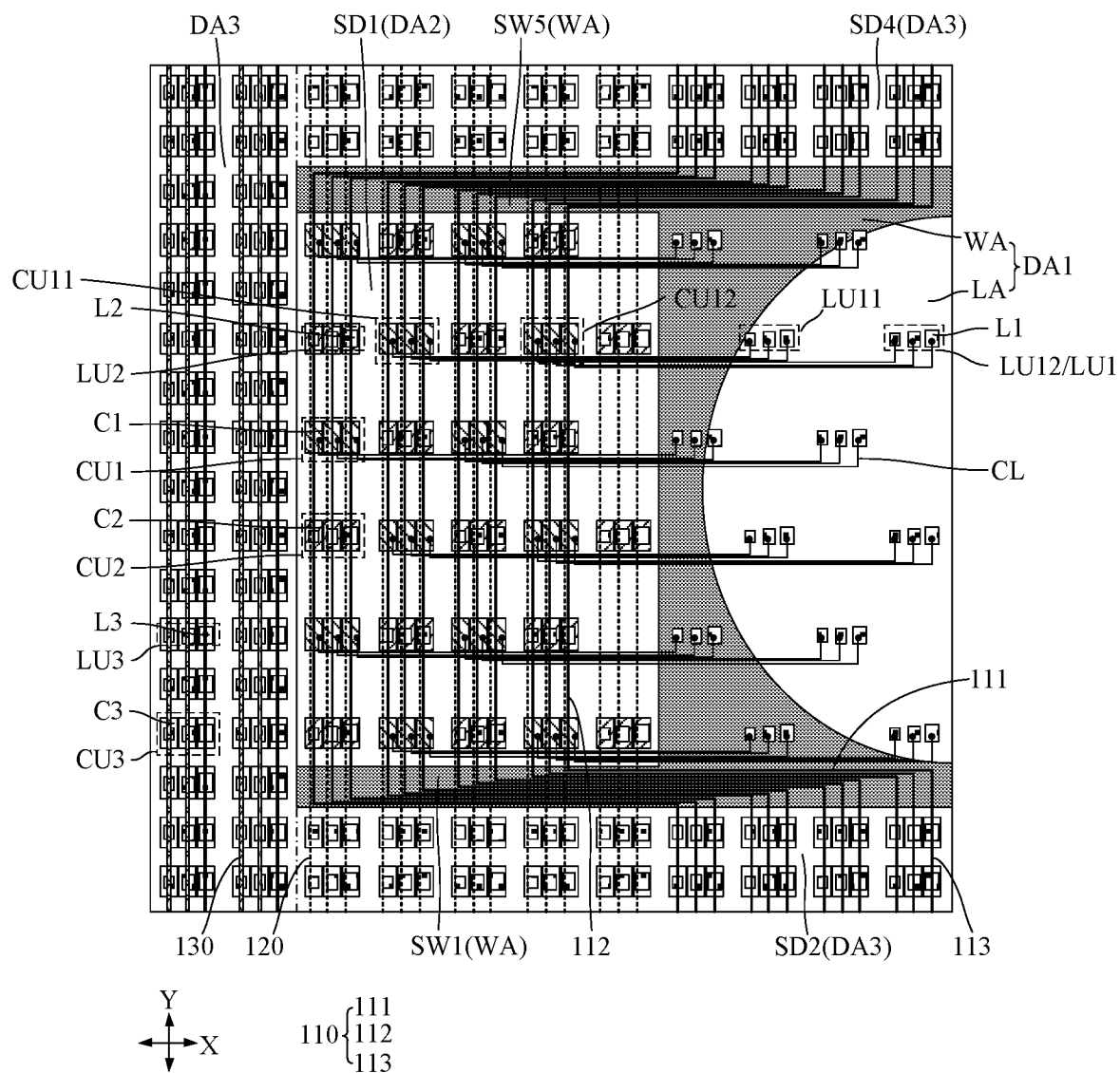
FIG. 8 illustrates a partial schematic top view of another exemplary display panel according to various embodiments of the present disclosure.

FIG. 5 illustrates a schematic top view of another exemplary display panel according to various embodiments of the present disclosure, and FIG. 6 illustrates a partial schematic top view of the exemplary display panel. Specifically, FIG. 6 shows, for example, a partial enlarged view of a Q3 region shown in FIG. 5. FIG. 7 illustrates a schematic top view of another exemplary display panel according to various embodiments of the present disclosure, and FIG. 8 illustrates a partial schematic top view of the exemplary display panel. Specifically, FIG. 8 shows, for example, a partial enlarged view of a Q4 region shown in FIG. 7.

Referring to FIGS. 5-8, in one embodiment, the second display region DA2 may not be limited to only including the first sub-display region SD1, but may also include a third sub-display region SD3. The first display region DA1 and the third sub-display region SD3 may be respectively located on the two sides of the first display region DA1 along the first direction X. The third display region DA3 may not be limited to only including the second sub-display region SD2, but may also include a fourth sub-display region SD4. The second sub-display region SD2 and the fourth sub-display region SD4 may be respectively located on the two sides of the first display region DA1 along the second direction Y. The arrangement as well as the interconnections and other structures of light-emitting elements, pixel circuits, and lead wires in the third sub-display region SD3 may be similar to those in the first sub-display region SD1. Therefore, in the following, detailed description will be provided for light-emitting elements, pixel circuits, and lead wires in the first sub-display region SD1, and the third sub-display region SD3 will not be described in detail.

According to the display panel consistent with various embodiments of the present disclosure, the wiring region WA may include a first sub-wiring region SW1, and along the second direction Y, the first sub-wiring region SW1 may be located between the first sub-display region SD1 and the second sub-display region SD2. The plurality of first sub-data lines 111 may be located in the first sub-wiring region SW1. It should be noted that in one embodiment, along the second direction Y, the first sub-wiring region SW1 may be located not only between the first sub-display region SD1 and the second sub-display region SD2, but also between the effective light-transmission region LA and the second sub-display region SD2.

In a same first data line 110, the first sub-data line 111 in the first sub-wiring region may electrically connect to the second sub-data line 112 in the first sub-display region SD1 with the third sub-data line 113 in the second sub-display region SD2. According to the display panel consistent with the embodiment of the present disclosure described above, the first sub-wiring region SW1 may be located between the first sub-display region SD1 and the second sub-display region SD2. That is, the first sub-wiring region SW1 may be disposed adjacent to both the first sub-display region SD1 and the second sub-display region SD2, such that the first sub-display region SD1, the first sub-wiring region SW1, and the second sub-display region SD2 are arranged closely, thereby substantially reducing the length of the first sub-data lines 111, and thus conducive to realizing the short-distance connection between the second sub-data lines 112 in the first sub-display region SD1 and the third sub-data lines 113 in the second sub-display region SD2. As such, while reducing the complexity of wiring the first data lines 110 on the display panel 100, the disclosed display panel may also reduce the effect of the voltage drop caused by the resistance load of the first data lines 113.

Referring to FIGS. 6-8, in one embodiment, the wiring region WA may further include a fifth sub-wiring region SW5, and along the second direction Y, the fifth sub-wiring region SW5 may be located between the first sub-display region SD1 and the fourth sub-display region SD4. The first sub-data lines 111 may also be located in the fifth sub-wiring region SW5. In one embodiment, along the second direction Y, the fifth sub-wiring region SW5 may be located not only between the first sub-display region SD1 and the fourth sub-display region SD4, but also between the effective light-transmission region LA and the fourth sub-display region SD4. In a same first data line 110, the first sub-data line 111 in the fifth sub-wiring region SW5 may electrically connect to the second sub-data line 112 in the first sub-display region SD1 with the third sub-data line 113 of the fourth sub-display region SD4.

In other embodiments, referring to FIGS. 5-8, a plurality of third pixel circuits C3 and/or third light-emitting elements L3 located in the second sub-display region SD2 and close to the first sub-display region SD1 may gradually decrease in size along the direction approaching the first sub-display region SD1. By reducing the size of a part of the pixel circuits C3 and/or the third light-emitting elements L3 of the second sub-display region SD2 adjacent to the first sub-display region SD1, more wiring space can be provided to facilitate the wiring design of the display panel.

Figure 9:
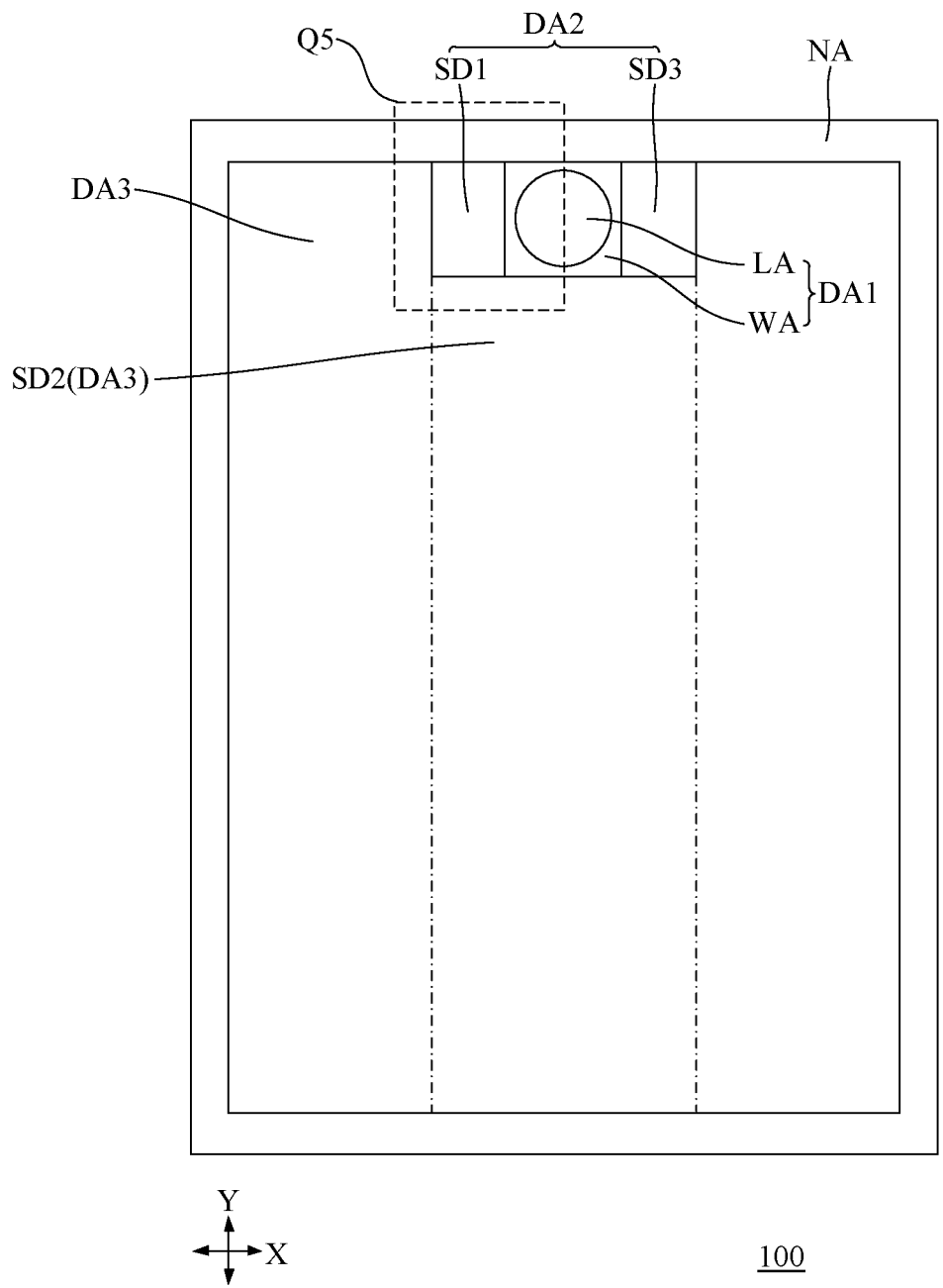
FIG. 9 illustrates a schematic top view of another exemplary display panel according to various embodiments of the present disclosure.
Figure 10:
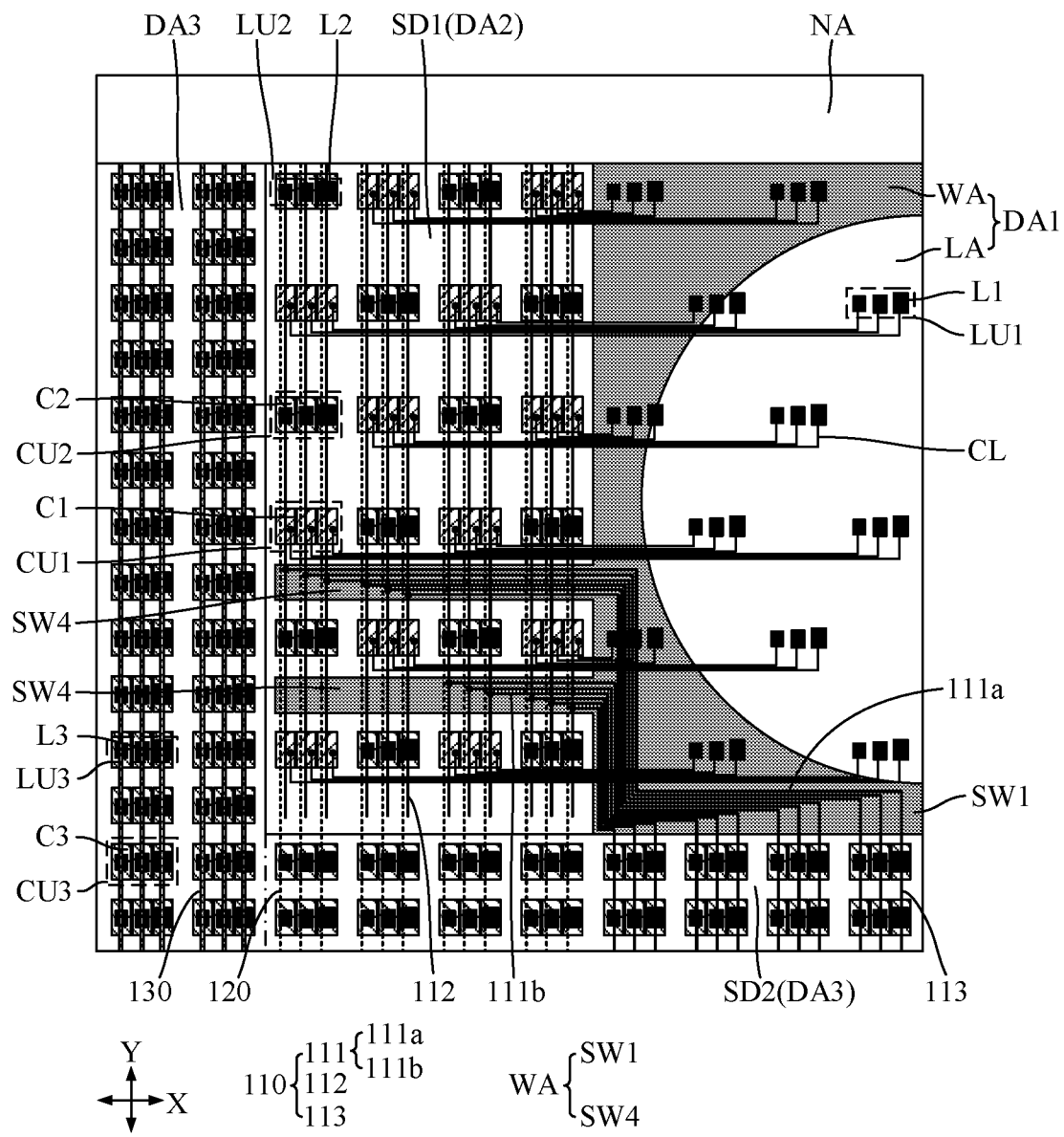
FIG. 10 illustrates a partial schematic top view of another exemplary display panel according to various embodiments of the present disclosure.

FIG. 9 illustrates a schematic top view of another exemplary display panel according to various embodiments of the present disclosure, and FIG. 10 illustrates a partial schematic top view of the exemplary display panel. Specifically, FIG. 10 shows, for example, a partial enlarged view of a Q5 region shown in FIG. 9.

Referring to FIGS. 9-10, in one embodiment, the second display region DA2 may include a first sub-display region SD1, and the first sub-display region SD1 may be located on one side of the first display region DA1 along the first direction X. The third display region DA3 may include a second sub-display region SD2, and the second sub-display region SD2 may be located on one side of the first display region DA1 along the second direction Y.

In the first sub-display region SD1, the first pixel circuits C1 may be arranged in an array with n columns along the first direction X and m rows along the second direction Y, where m and n are both integers greater than 1.

Referring to FIG. 10, the wiring region WA may include a first sub-wiring region SW1 and at least one fourth sub-wiring region SW4. Along the second direction Y, the first sub-wiring region SW1 may be located between the second sub-display region SD2 and the effective light-transmission region LA. The fourth sub-wiring region SW4 may be located in the first sub-display region SD1 and between the ith row and the $(i+1)^{th}$ row of the first pixel circuits C1, where i is an integer and $1<i<m$. The first sub-data line 111 may include a first sub-segment 111a and a second sub-segment 111b. The first sub-segment 111a may be located in the first sub-wiring region SW1, and the second sub-segment 111b may be located in the fourth sub-wiring region SW4.

The number of the fourth sub-wiring regions SW4 may be one, two, three, etc., and the number can be adjusted according to the number of the first data lines 110.

In the display panel according to various embodiments of the present disclosure, the first sub-data line 111 may be electrically connected to a corresponding second sub-data line 112 through the fourth sub-wiring region SW4. The fourth sub-wiring region SW4 may be located in the first sub-display region SD1 and between the ith row and the $(i+1)^{th}$ row of the first pixel circuits C1, such that the region between adjacent rows of pixel circuits in the first sub-display region SD1 may be used. The number of the fourth sub-wiring region SW4 may be at least one. When the region between the first sub-display region SD1 and the second sub-display region SD2 is relatively small, by effectively using the region between adjacent rows of the pixel circuits in the first sub-display region SD1, the first data lines may be ensured to have enough layout region, thereby improving the wiring feasibility for electrically connecting the second sub-data line 112 and the third sub-data line 113.

According to the embodiments described above, the first light-emitting unit LU1 may include first light-emitting elements L1 of multiple colors, the second light-emitting unit LU2 may include second light-emitting elements L2 of multiple colors, and the third light-emitting unit LU3 may include third light-emitting elements L3 of multiple colors. The display panel 100 may further include a plurality of first pixel circuit units CU1 and a plurality of second pixel circuit units CU2. Each first pixel circuit unit CU1 may include a plurality of first pixel circuits C1, and each second pixel circuit unit CU2 may include a plurality of second pixel circuits C2. The first pixel circuit unit CU1 may correspond to at least one first light-emitting unit LU1, and the second pixel circuit unit CU2 may correspond to at least one second light-emitting unit LU2. The display panel 100 may further include a plurality of third pixel circuit units CU3, and each third pixel circuit unit CU3 may correspond to at least one third light-emitting element L3.

In the present disclosure, a case where the first pixel circuit units CU1 and the first light-emitting units LU1 have a one-to-one correspondence and the second pixel circuit units CU2 and the second light-emitting units LU2 have a one-to-one correspondence is taken as an example for illustration. In other embodiments, each first pixel circuit unit CU1 may correspond to a plurality of first light-emitting units LU1, and a first pixel circuit C1 in each first pixel circuit unit CU1 may be electrically connected to a plurality of corresponding first light-emitting elements L1 of the same color. Each second pixel circuit unit CU2 may also correspond to a plurality of second light-emitting units LU2, and a second pixel circuit C2 in each second pixel circuit unit CU2 may be electrically connected to a plurality of corresponding second light-emitting elements L2 of the same color.

The first light-emitting units LU1 may include, for example, a red first light-emitting element, a green first light-emitting element, and a blue first light-emitting element. The second light emitting units LU2 may include, for example, a red second light-emitting element, a green second light-emitting element, and a blue second light-emitting element.

Referring to FIG. 10, taking the embodiment as an example, along the second direction Y, the first pixel circuits C1 corresponding to the first light-emitting elements L1 of the same color in the same column may share the same second sub-data line 112. Therefore, on the display panel 100, when the first light-emitting elements L1 physically located in the same position and of the same color are driven to emit light, data signals may be actually received from the same data line, making the display panel easier to be compatible with the existing driver chip, and there is no need to make major changes to the driver chip. Along the second direction Y, the second pixel circuits C2 corresponding to the second light-emitting elements of the same color in the same column may share a same second data line 120. Therefore, when the second light-emitting elements physically located in the same column and of the same color are driven to emit light, data signals may be actually received from the same data line, making the display panel easier to be compatible with the existing driver chip.

The arrangement of the first light-emitting units LU1 and the second light-emitting units LU2, and the arrangement of the first pixel circuit units CU1 and the second pixel circuit units CU2 may have different forms, and some exemplary arrangement forms will be illustrated below. In one embodiment, a case where the plurality of first light-emitting elements in the first light-emitting unit LU1 is arranged in a sequence along a predetermined direction is taken as an example for illustration. In other embodiments, the plurality of first light-emitting elements L1 in the first light-emitting unit LU1 may be arranged on the vertices of virtual triangles. That is, the plurality of first light-emitting elements L1 in the first light-emitting unit LU1 may be arranged in a delta (Δ) structure. Alternatively, the plurality of first light-emitting elements L1 in the first light-emitting unit LU1 may be arranged in other forms such as a PenTiel matrix structure. Similarly, the arrangement of the second light-emitting units LU2 and the third light-emitting units LU3 may also have different forms.

Figure 11:
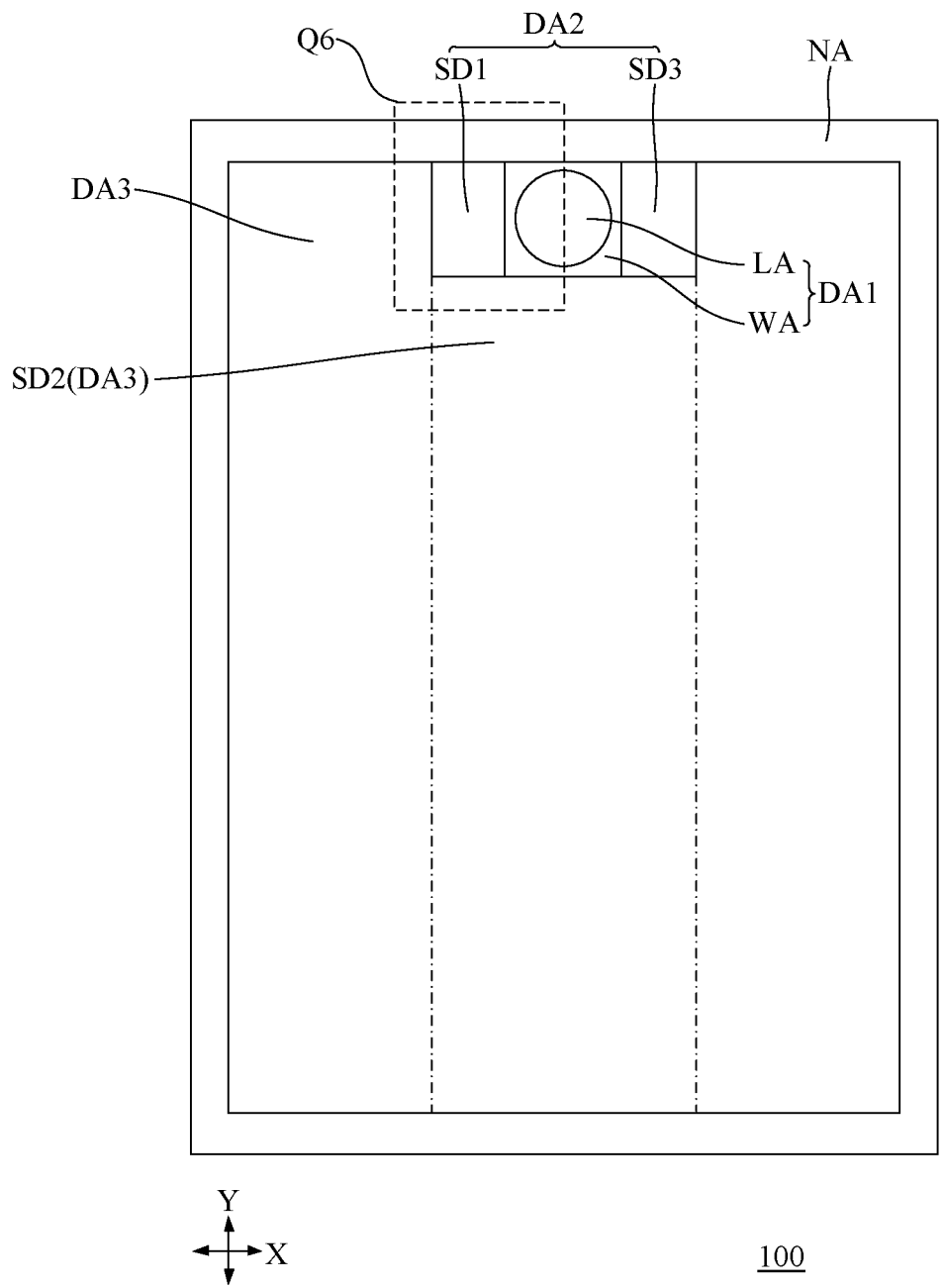
FIG. 11 illustrates a schematic top view of another exemplary display panel according to various embodiments of the present disclosure.
Figure 12:
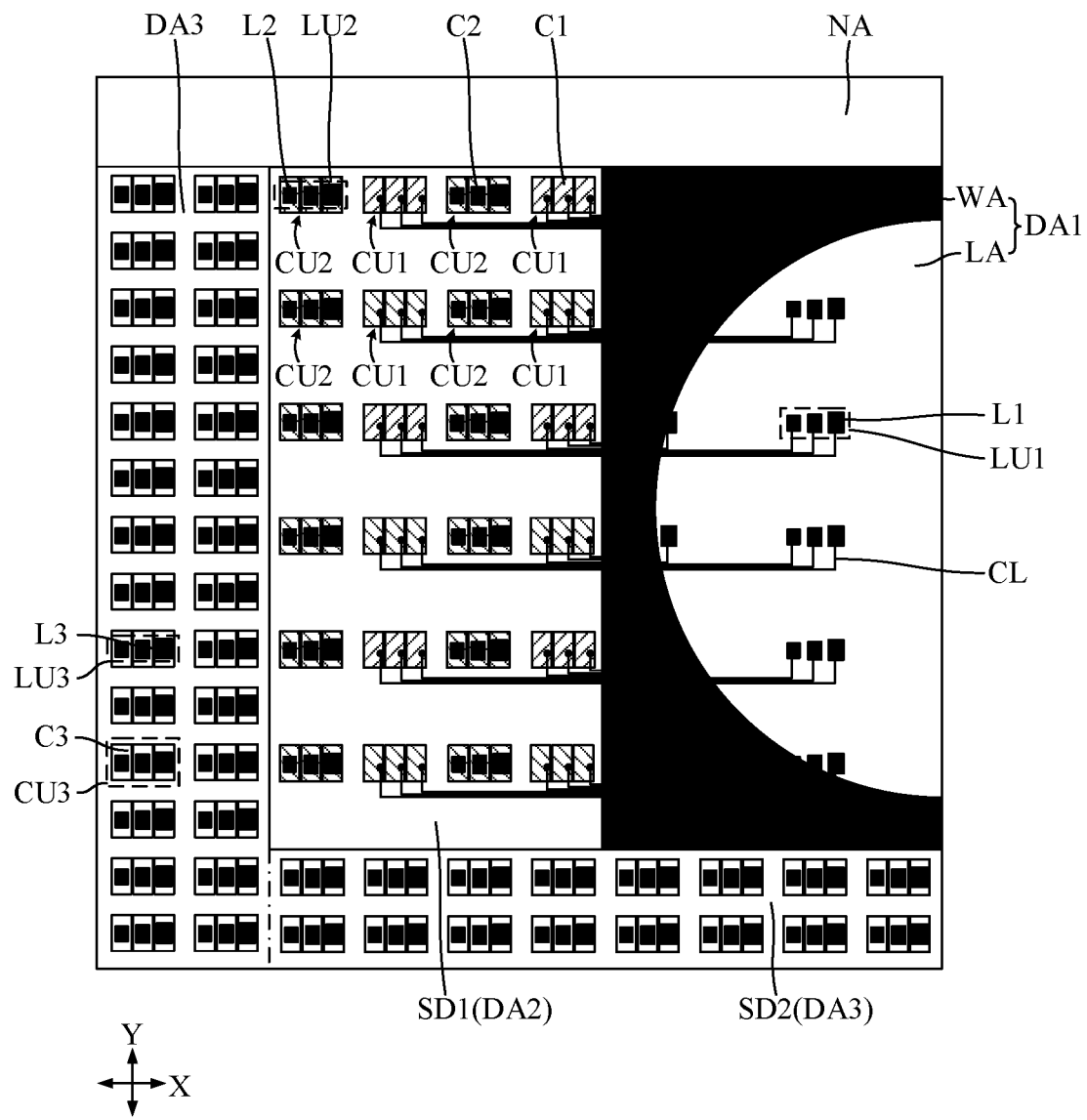
FIG. 12 illustrates a partial schematic top view of another exemplary display panel according to various embodiments of the present disclosure.

FIG. 11 illustrates a schematic top view of another exemplary display panel according to various embodiments of the present disclosure, and FIG. 12 illustrates a partial schematic top view of the exemplary display panel. Specifically, FIG. 12 shows, for example, a partial enlarged view of a Q6 region shown in FIG. 11.

Referring to FIGS. 11-12, in one embodiment, in the first display region DA1, the first light-emitting units LU1 may be aligned and arranged along the first direction X and the second direction Y, and in the second display region DA2, the second light-emitting units LU2 may be aligned and arranged along the first direction X and the second direction Y. For example, in the first display region DA1, the first light-emitting units LU1 may be arranged in a plurality of rows and a plurality of columns. The plurality of first light-emitting elements L1 in each column of the first light-emitting unit LU1 may be arranged in the second direction Y, and the plurality of rows may be arranged in the first direction X. Translating a row of the first light-emitting units LU1 in the first direction X may be able to overlap the row of the first light-emitting units LU1 with another row of the first light-emitting units LU1. In the second display region DA2, the second light-emitting units LU2 may be arranged in a plurality of rows and a plurality of columns, and translating a row of the second light-emitting units LU2 in the first direction X may be able to overlap the row of the second light-emitting units LU2 with another row of the second light-emitting units LU2.

In one embodiment, the first pixel circuit units CU1 and the second pixel circuit units CU2 may be both arranged along the second direction Y, and the first pixel circuit units CU1 and the second pixel circuit units CU2 may be arranged alternately in the first direction X. For example, in the second display region DA2, a plurality of pixel units may be arranged in multiple rows and multiple columns, and in each row of pixel units, the first pixel circuit units CU1 and the second pixel circuit units CU2 may be arranged alternately in the first direction X. In each column of pixel units, the plurality of first pixel circuit units CU1 may be sequentially arranged in the second direction Y, or the plurality of second pixel circuit units CU2 may be sequentially arranged in the second direction Y.

As described above, in the second display region DA2, along the second direction Y, the first pixel circuits C1 corresponding to the first light-emitting elements L1 of the same color in the same column may share the same second sub-data line 112, and the second pixel circuits C2 corresponding to the second light-emitting elements L2 of the same color in the same column may share the same second data line 120. According to the disclosed display panel, the second light-emitting units LU2 may be aligned and arranged along the first direction X and the second direction Y. Moreover, each second pixel circuit unit CU2 and the corresponding second light-emitting unit LU2 may be substantially at the same physical position, and a second data line 120 may substantially pass through the positions of the plurality of second light-emitting units LU2 that corresponds to the second data line 120. Therefore, when the second light-emitting units LU2 are aligned and arranged along the first direction X and the second direction Y, the arrangement of the first pixel circuit units CU1 and the second pixel circuit units CU2 may be more convenient for connecting the second data lines 120 in the second display region DA2 to the second data lines 120 in the third display region DA3 in a short-distance manner.

Figure 13:
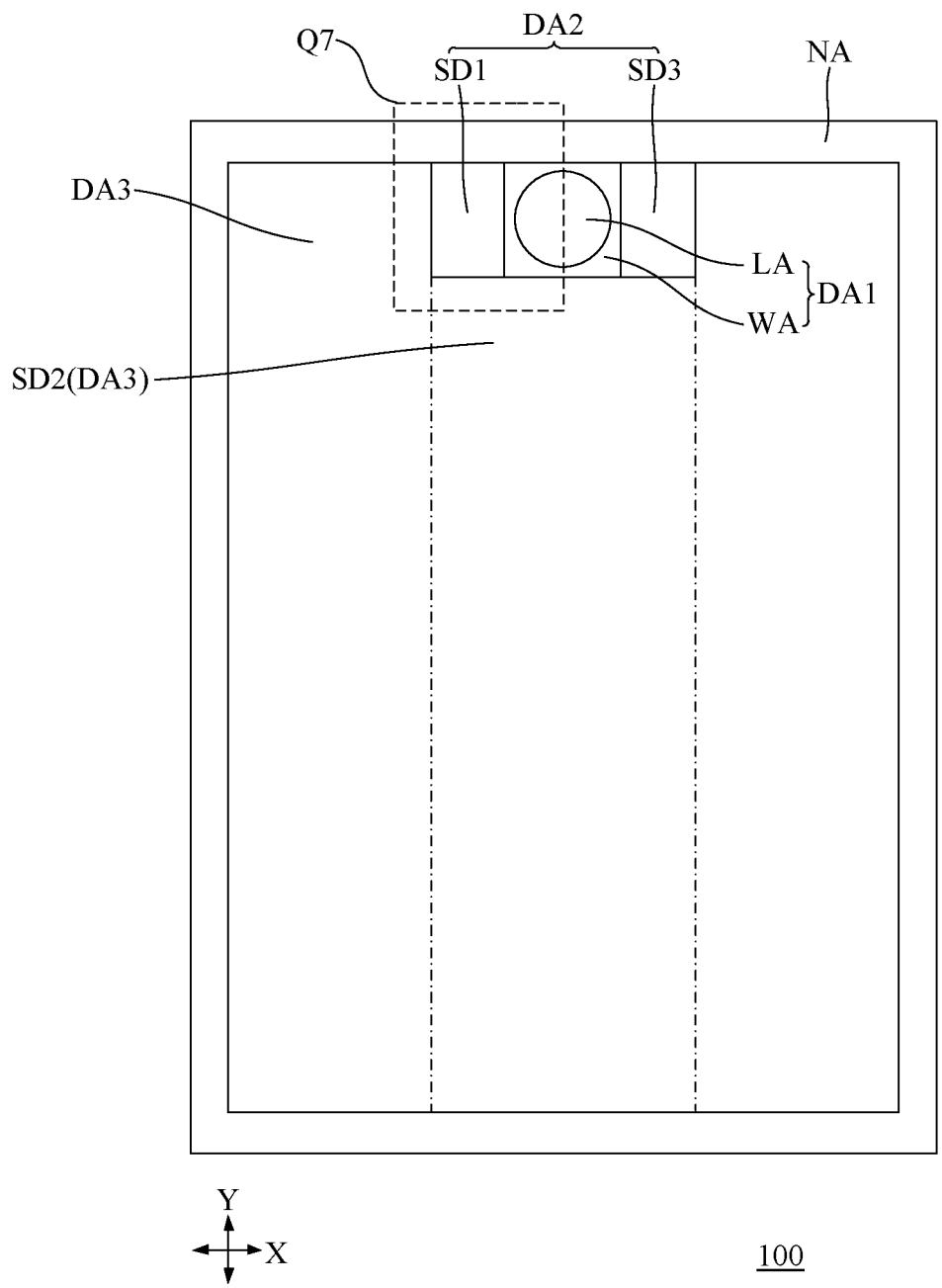
FIG. 13 illustrates a schematic top view of another exemplary display panel according to various embodiments of the present disclosure.
Figure 14:
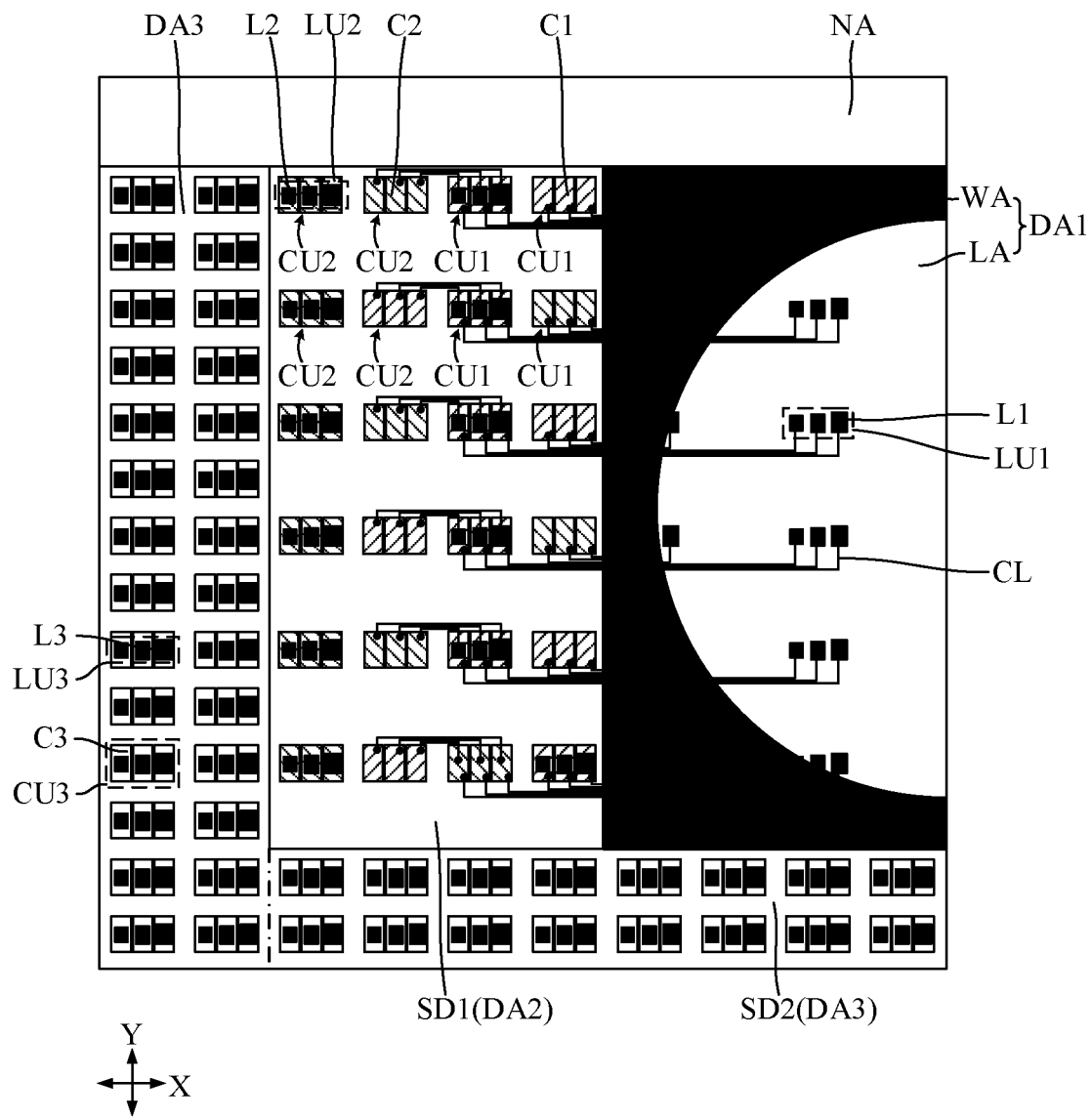
FIG. 14 illustrates a partial schematic top view of another exemplary display panel according to various embodiments of the present disclosure.

FIG. 13 illustrates a schematic top view of another exemplary display panel according to various embodiments of the present disclosure, and FIG. 14 illustrates a partial schematic top view of the exemplary display panel. Specifically, FIG. 14 shows, for example, a partial enlarged view of a Q7 region shown in FIG. 13.

Referring to FIGS. 13-14, in one embodiment, in the first display region DA1, the first light-emitting units LU1 may be aligned and arranged along the first direction X and the second direction. In the second display region DA2, the second light-emitting units LU2 may be aligned and arranged along the first direction X and the second direction Y.

In one embodiment, the first pixel circuit units CU1 and the second pixel circuit units CU2 may both be arranged along the second direction Y, and along the first direction, all the first pixel circuit units CU1 may be located on the side of all the second pixel circuit units CU2 close to the first display region DA1.

As described above, in the second display region DA2, along the second direction Y, the first pixel circuits C1 corresponding to the first light-emitting elements L1 of the same color in the same column may share the same second sub-data line 112, and the second pixel circuits C2 corresponding to the second light-emitting elements L2 of the same color in the same column may share the same second data line 120. In the second display region DA2 of the disclosed display panel, all first pixel circuit units CU1 may be located on the side of all the second pixel circuit units CU2 close to the first display region DA1. As such, the plurality of second sub-data lines 112 may all be arranged on the side of the plurality of second data lines 120 close to the first display region DA1. The plurality of second sub-data lines 112 may be closer to the second sub-display region SD2, which may be more convenient for connecting the second sub-data lines 112 to the corresponding third sub-data lines 113, located in the second sub-display region SD2 (the third display region DA3), in a short-distance manner.

Figure 15:
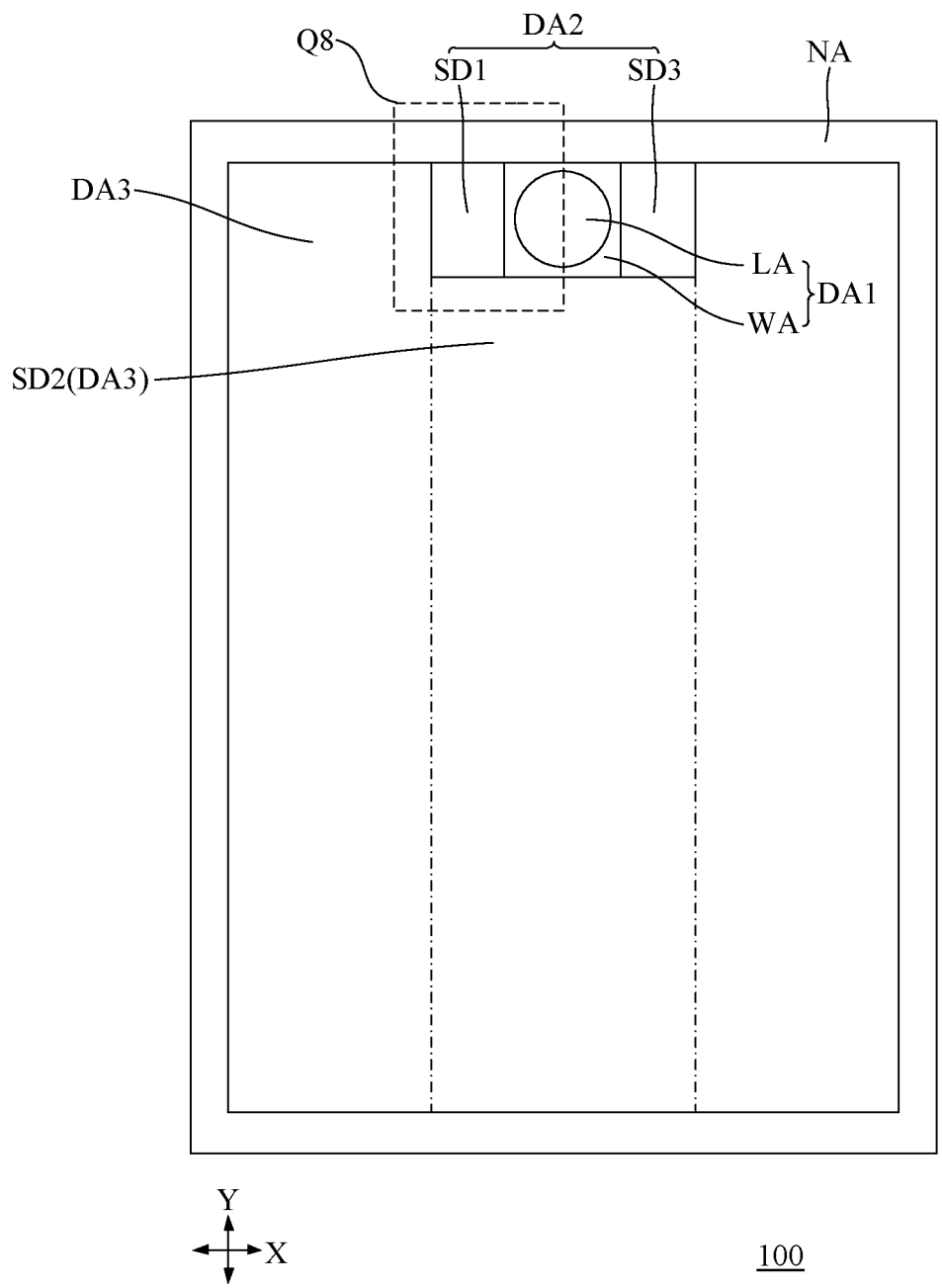
FIG. 15 illustrates a schematic top view of another exemplary display panel according to various embodiments of the present disclosure.
Figure 16:
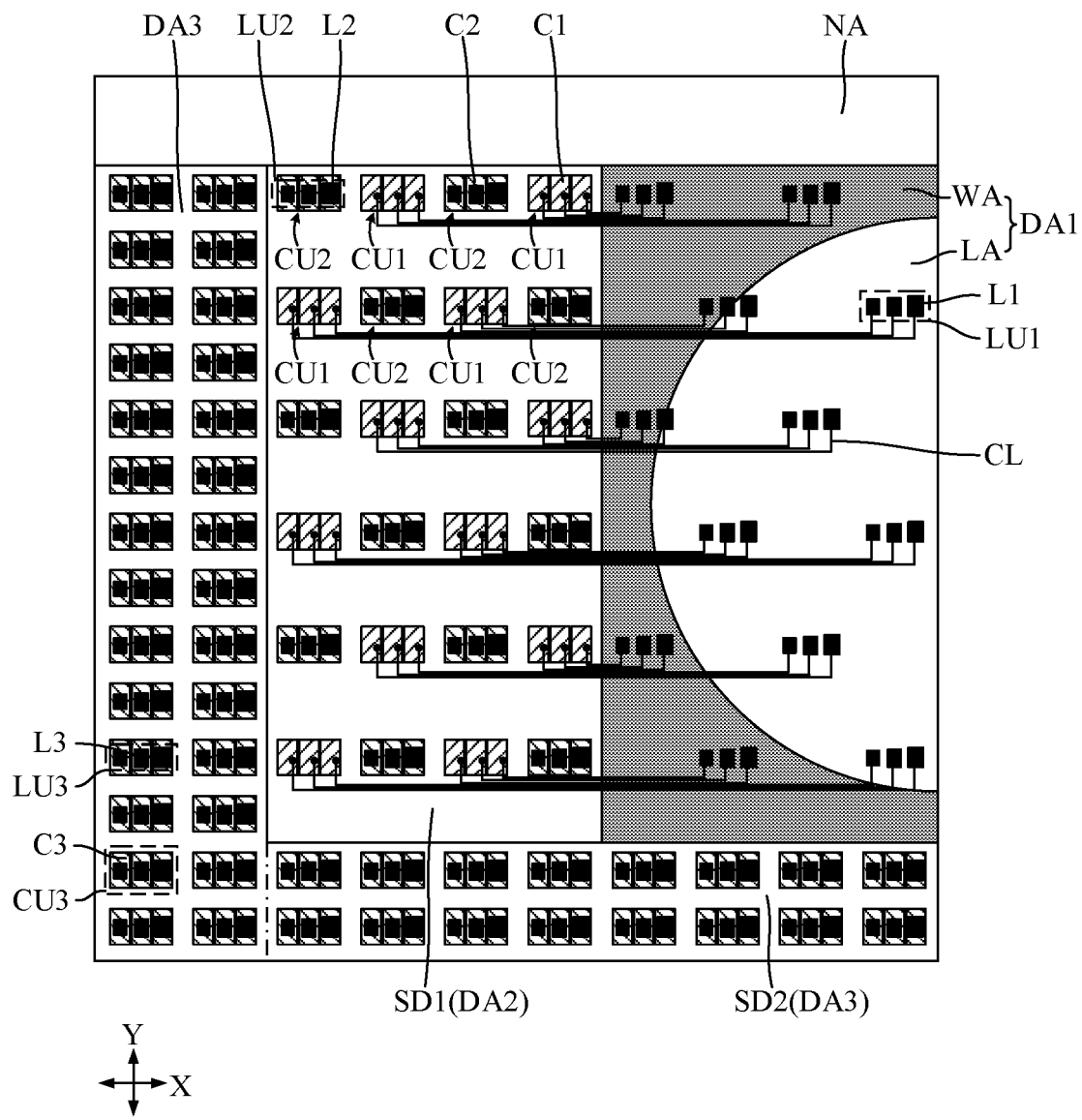
FIG. 16 illustrates a partial schematic top view of another exemplary display panel according to various embodiments of the present disclosure.

FIG. 15 illustrates a schematic top view of another exemplary display panel according to various embodiments of the present disclosure, and FIG. 16 illustrates a partial schematic top view of the exemplary display panel. Specifically, FIG. 16 shows, for example, a partial enlarged view of a Q8 region shown in FIG. 15.

Referring to FIGS. 15-16, in one embodiment, in the first display region DA1, the first light-emitting units LU1 may be arranged alternately along the first direction X and the second direction Y. In the second display region DA2, the second light-emitting units LU2 may be arranged alternately along the first direction X and the second direction Y. Because the first light-emitting units LU1 and the second light-emitting units LU2 are arranged alternately in the first direction X and the second direction Y, the first light-emitting units LU1 and the second light-emitting units LU2 may be more evenly arranged (uniformly distributed) in the first direction X and the second direction Y, thereby avoiding the defects of bright or dark lines generated by the display panel 100 due to a low pixel density when the light-emitting units are aligned and arranged in the first direction X and the second direction Y. Therefore, the display performance of the display panel 100 can be improved when the pixel density is low.

According to the disclosed display panel, the first pixel circuit units CU1 and the second pixel circuit units CU2 may be both arranged alternately in the first direction X and the second direction Y.

In the second display region DA2 of the disclosed display panel, according to the structural arrangement of the pixel circuit units, each column of pixel circuit units may include both first pixel circuit units CU1 and second pixel circuit units CU2, so that the region occupied by each column of pixel circuit units may include a second data line 120 and a second sub-data line 112 that extend in the region. As such, alternately arranging the first light-emitting units LU1 and the second light-emitting units LU2 in the first direction X and the second direction Y may be more convenient for connecting the second data lines 120 in the second display region DA2 to the corresponding second data lines 120 in the third display region DA3 in a short-distance manner.

In one embodiment, referring to FIGS. 7-8, the plurality of first light-emitting units LU1 may include first sub-light-emitting units LU11 and second sub-light-emitting units LU12, and the plurality of first pixel circuit units CU1 may include first sub-pixel circuit units CU11 and second sub-pixel circuit units CU12. The first sub-pixel circuit units CU11 may correspond to the first sub-light-emitting units LU11, and the second sub-pixel circuit units CU12 may correspond to the second sub-light-emitting units LU12. Along the first direction X, a second sub-pixel circuit unit CU12 may be located between a first sub-pixel circuit unit CU11 and a first sub-light-emitting unit LU11, and a first sub-light-emitting unit LU11 may be located between a second sub-pixel circuit unit CU12 and a second sub-light-emitting unit LU12.

In one embodiment, a case where two first light-emitting units LU1 and two first pixel circuit units CU1 are located in a same row as shown in FIG. 8 is taken as an example for illustration. Along the first direction, the second sub-pixel circuit unit CU12 may be located on the side of the first sub-pixel circuit unit CU11 close to the effective light-transmission region LA, and the first sub-light-emitting unit LU11 may be located on the side of the second sub-light-emitting unit LU12 close to the first sub-display region SD1. That is, the plurality of first pixel circuit units CU1 arranged along the first direction X in the first sub-display region SD1 may be sequentially and correspondingly connected to the plurality of first light-emitting units LU1 arranged along the first direction X in the first display region DA1. Such an arrangement may be able to reduce the length difference of the connecting lines between different first light-emitting units LU1 and the respective corresponding first pixel circuit units CU1, equalize the impedance, and improve the display performance of the display panel.

Figure 17:
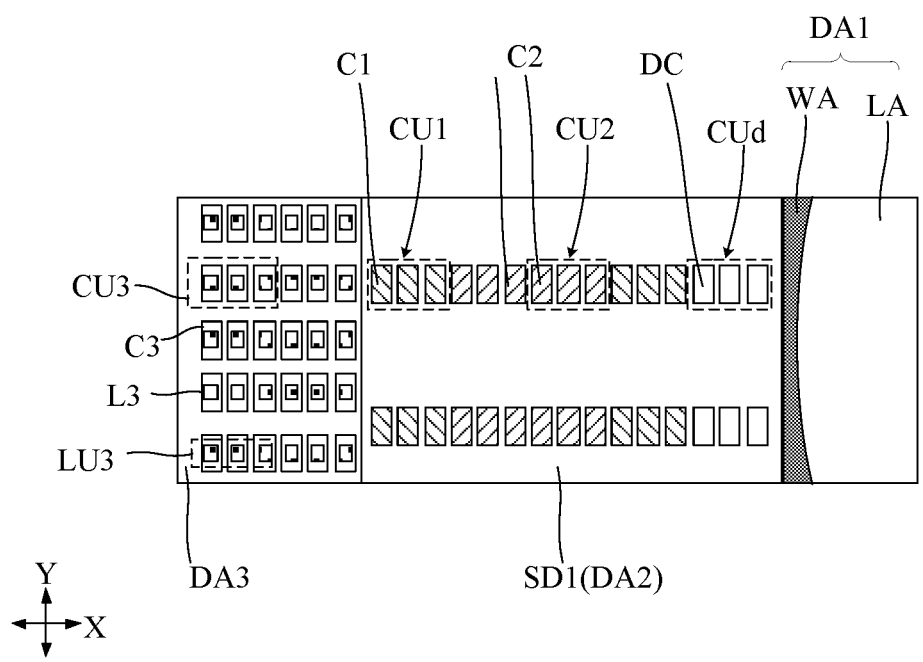
FIG. 17 illustrates a partial schematic view of another exemplary display panel according to various embodiments of the present disclosure.

FIG. 17 illustrates a partial schematic view of another exemplary display panel according to various embodiments of the present disclosure. Referring to FIG. 17, in one embodiment, the second display region DA2 may further include a plurality of dummy pixel circuits DC.

As shown in in FIG. 17, a case where a dummy pixel circuit unit Cud is provided on the side of the second display region DA2 close to the first display region DA1, and the dummy pixel circuit unit Cud includes a plurality of dummy pixel circuits DC is taken as an example for illustration. It should be noted that FIG. 17 only schematically shows a case where each pixel circuit unit includes three pixel circuits (e.g., the first pixel circuit unit CU1 includes three first pixel circuits C1, the second pixel circuit unit CU2 includes three second pixel circuits C2, the third pixel circuit unit CU3, and the dummy pixel circuit unit CUd includes three dummy pixel circuits DC). In this way, during the manufacturing process of the display panel, the problem of uneven exposure or etching caused by dramatic changes in the etching pattern (such as density changes) can be transferred to the dummy pixel circuit units CUd, thereby preventing uneven exposure or etching from affecting the brightness of the second light-emitting elements (not shown in FIG. 17) located in the second display region DA2 and on the side close to the first display region DA1 or affecting the brightness of the first light-emitting elements (not shown in FIG. 17) located in the first display region DA1 and on the side closed to the second display region DA2. Therefore, the display performance may be improved.

In one embodiment, a dummy pixel circuit unit CUd may be provided on the side of the second display region DA2 close to the third display region DA3. In this way, the problem of uneven exposure or etching caused by dramatic changes in the etching pattern (such as density changes) can be transferred to the dummy pixel circuit units CUd, thereby preventing uneven exposure or etching from affecting the brightness of the second light-emitting elements located in the second display region DA2 and on the side close to the third display region DA3 or affecting the brightness of the third light-emitting elements located in the third display region DA3 and on the side closed to the second display region DA2. Therefore, the display performance may be improved.

It should be understood that, in the second display region DA2, the dummy pixel circuit unit CUd may be arranged alternately with at least one of the first pixel circuit units CU1 and the second pixel circuit units CU2. That is, along the first direction X or the second direction Y, at least one dummy pixel circuit unit CUd may be located between two adjacent first pixel circuit units CU1, or at least one dummy pixel circuit unit CUd may be located between two adjacent second pixel circuit units CU2, or at least one dummy pixel circuit unit CUd may be located between a first pixel circuit unit CU1 and a second pixel circuit unit CU2 adjacent to the first pixel circuit unit CU1. As such, the problem of abnormal brightness of the light-emitting elements due to uneven exposure or etching caused by dramatic changes in the etching pattern can be suppressed, and the display performance may be improved.

In one embodiment, the dummy pixel circuits DC in the second display region DA2 may be arranged alternately with at least one of the first pixel circuits C1 and the second pixel circuits C2. That is, along the first direction X or the second direction Y, at least one dummy pixel circuit DC may be located between two adjacent first pixel circuits C1, or at least one dummy pixel circuit DC may be located between two adjacent second pixel circuits C2, or at least one dummy pixel circuit DC may be located between a first pixel circuit C1 and a second pixel circuit C2 adjacent to the first pixel circuit C1. As such, the problem of abnormal brightness of the light-emitting elements due to uneven exposure or etching caused by dramatic changes in the etching pattern can be suppressed, and the display performance may be improved.

In one embodiment, the dummy pixel circuit DC, the first pixel circuit C1, and the second pixel circuit C2 may have a same size. As such, the problem of abnormal brightness of the light-emitting elements due to uneven exposure or etching caused by dramatic changes in the etching pattern can be further suppressed, thereby further improving the display performance.

Figure 18:
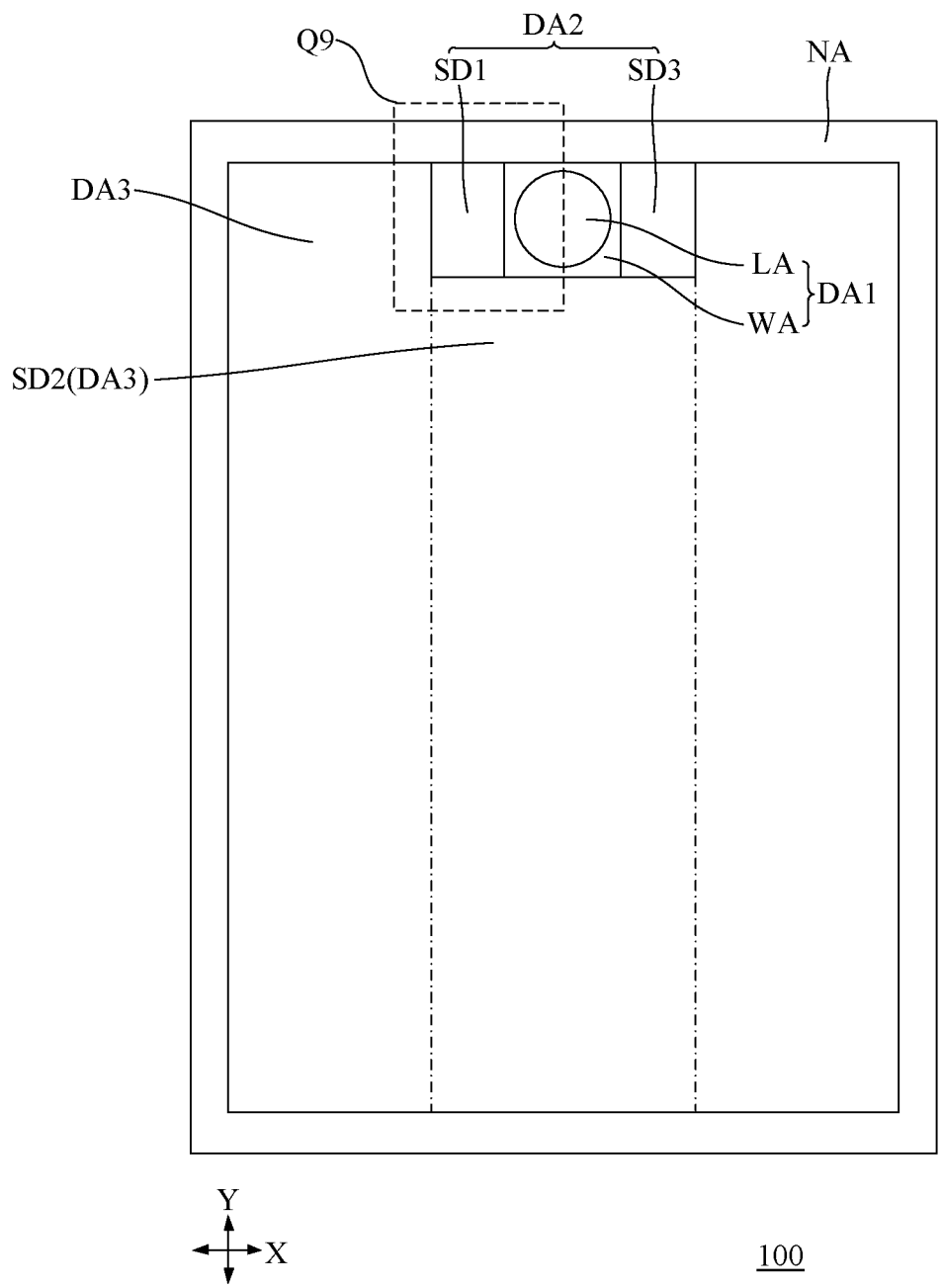
FIG. 18 illustrates a schematic top view of another exemplary display panel according to various embodiments of the present disclosure.
Figure 19:
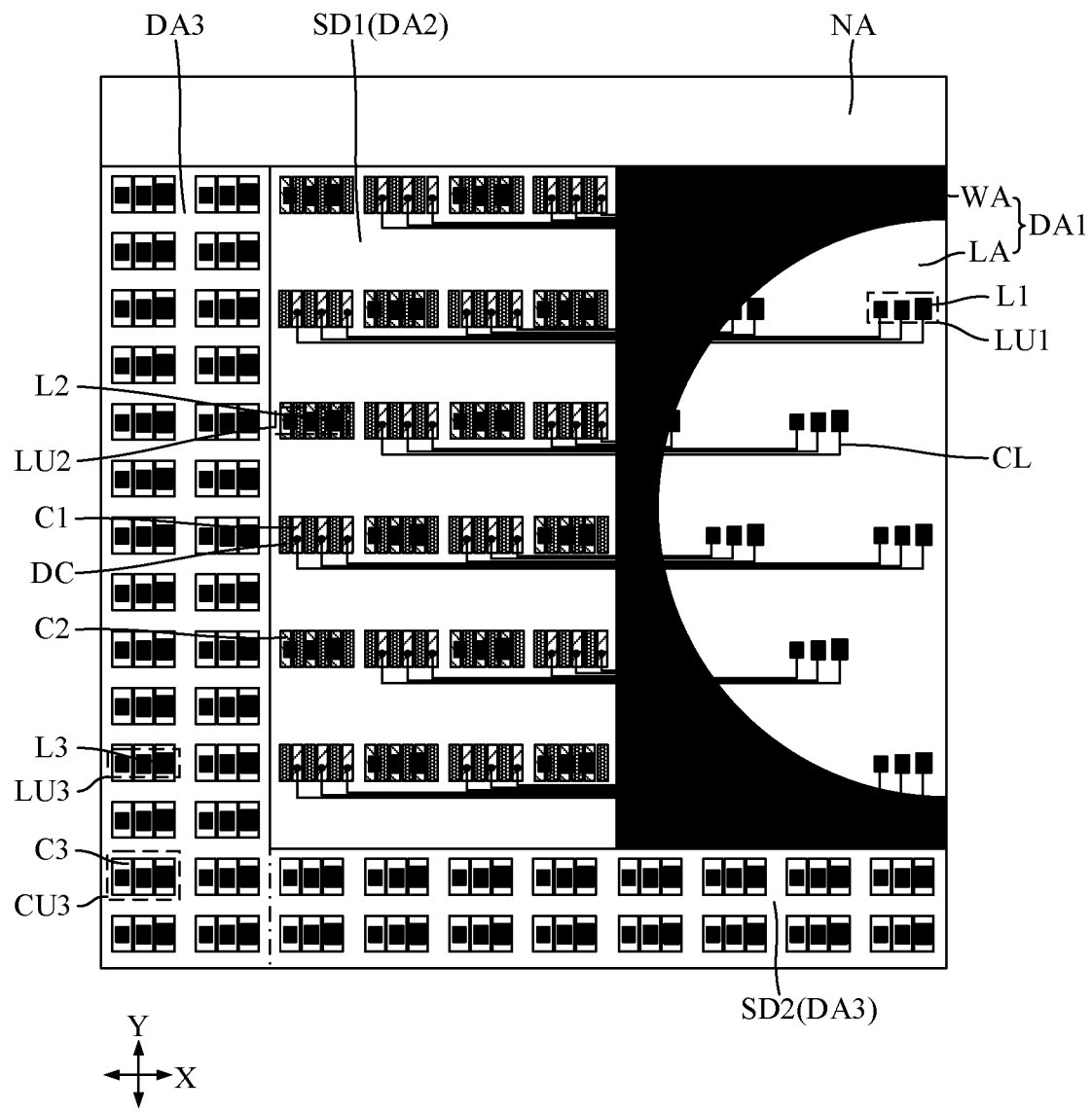
FIG. 19 illustrates a partial schematic top view of another exemplary display panel according to various embodiments of the present disclosure.

FIG. 18 illustrates a schematic top view of another exemplary display panel according to various embodiments of the present disclosure, and FIG. 19 illustrates a partial schematic top view of the exemplary display panel. Specifically, FIG. 19 shows, for example, a partial enlarged view of a Q9 region shown in FIG. 18.

Referring to FIGS. 18-19, in one embodiment, the sizes of the first pixel circuit C1, the second pixel circuit C2, and the dummy pixel circuit DC may all be smaller than the size of the third pixel circuit C3. The size of a pixel circuit may be the area size of the orthogonal projection of the circuit structure included in the pixel circuit on the display panel 100. In some embodiments, the lengths of the first pixel circuit C1, the second pixel circuit C2, and the dummy pixel circuit DC along the first direction X may all be less than the length of the third pixel circuit C3 along the first direction X, so that in the same length along the first direction X, the total number of the first pixel circuits C1, the second pixel circuits C2, and the dummy pixel circuits DC that can be arranged is greater than the number of the third pixel circuits C3 that can be arranged.

In one embodiment, the dummy pixel circuit DC may be a unit with a substantially complete circuit structure capable of driving the light-emitting element to emit light. For example, the structure of the dummy pixel circuit DC may be substantially the same as the first pixel circuit C1 and the second pixel circuit C2. However, the dummy pixel circuit DC may not be electrically connected to any light-emitting element. In one embodiment, a preset number of dummy pixel circuits DC may be set in the second display region DA2, and the dummy pixel circuits may be arranged together with the first pixel circuits C1 and the second pixel circuits C2. As such, the dummy pixel circuits DC may be used to fill the space between the first pixel circuits C1 and the second pixel circuits C2, so that the first pixel circuits C1 corresponding to a same data line may be aligned in the second direction Y, and the second pixel circuits C2 corresponding to a same data line may be aligned in the second direction. In addition, when the pixel density of the second display region DA2 and the first display region DA1 is different from the pixel density of the third display region DA, a preset number of dummy pixel circuits may be connected to the first data line 110 and the second data line 120, respectively, so that the load of the first data line 110, the load of the second data line 120, and the load of the third data line 130 may be more consistent with each other, thereby suppressing the color cast problem in different display regions of the display panel 100.

Figure 20:
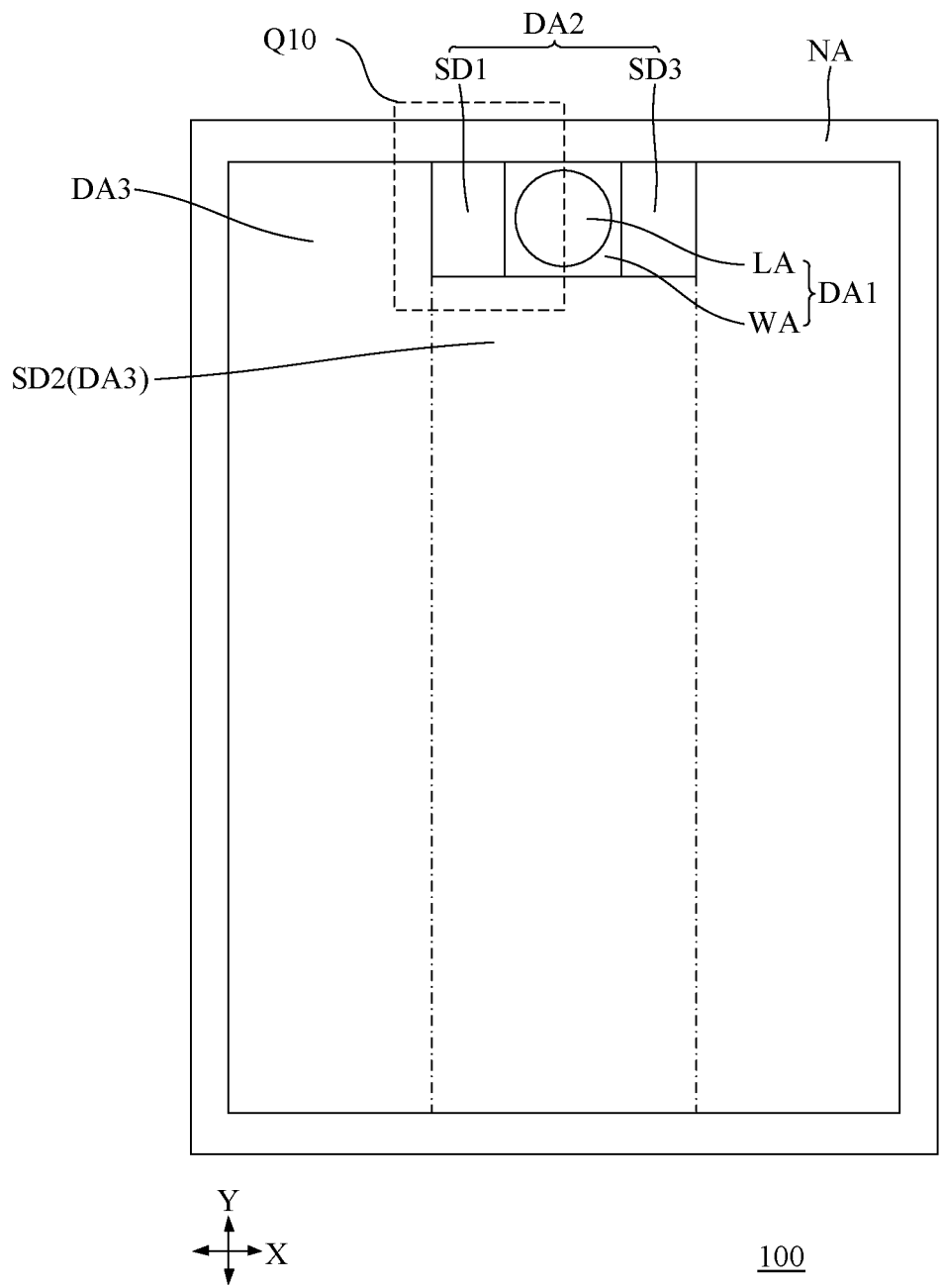
FIG. 20 illustrates a schematic top view of another exemplary display panel according to various embodiments of the present disclosure.
Figure 21:
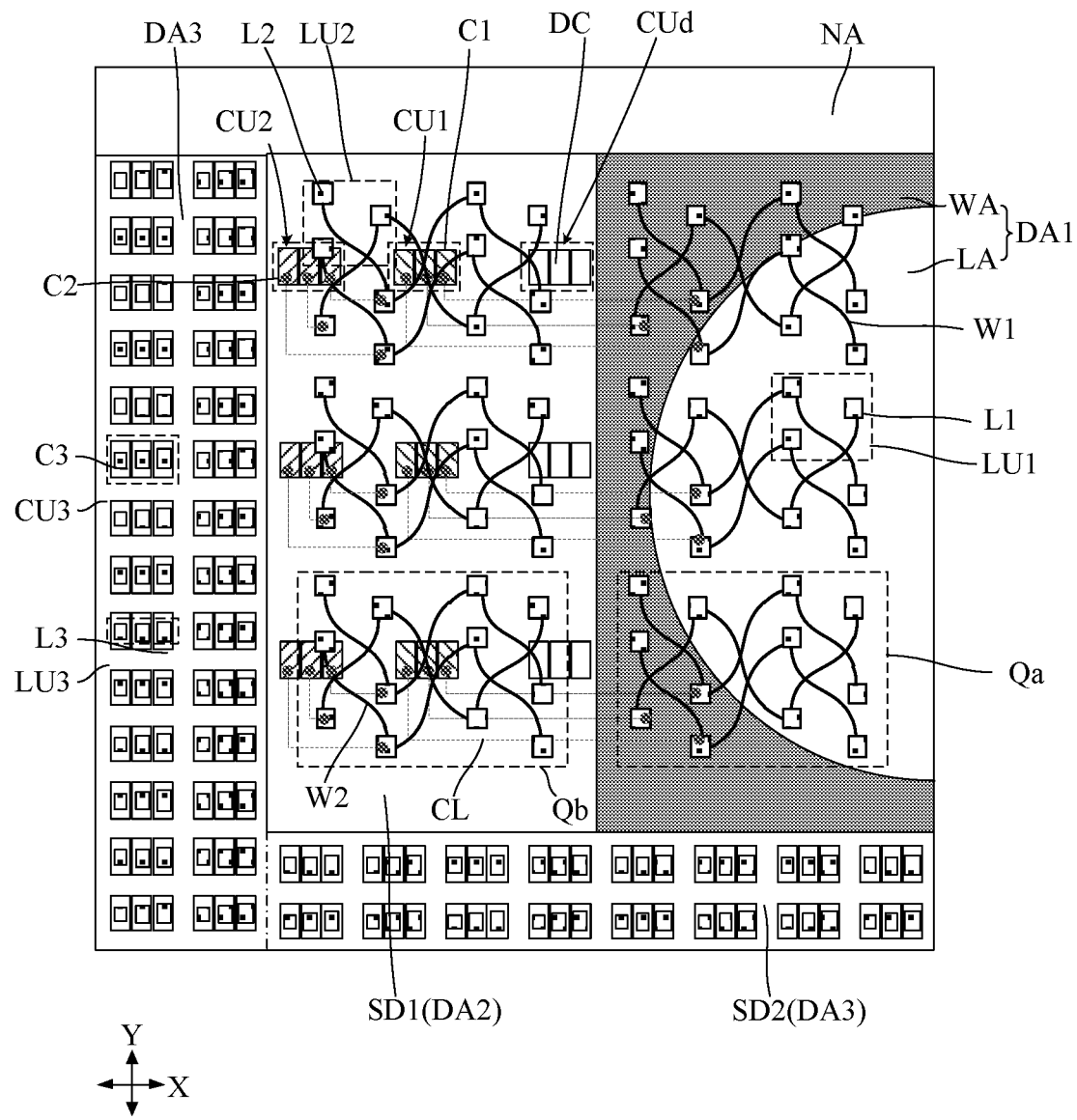
FIG. 21 illustrates a partial schematic top view of another exemplary display panel according to various embodiments of the present disclosure.
Figure 22:
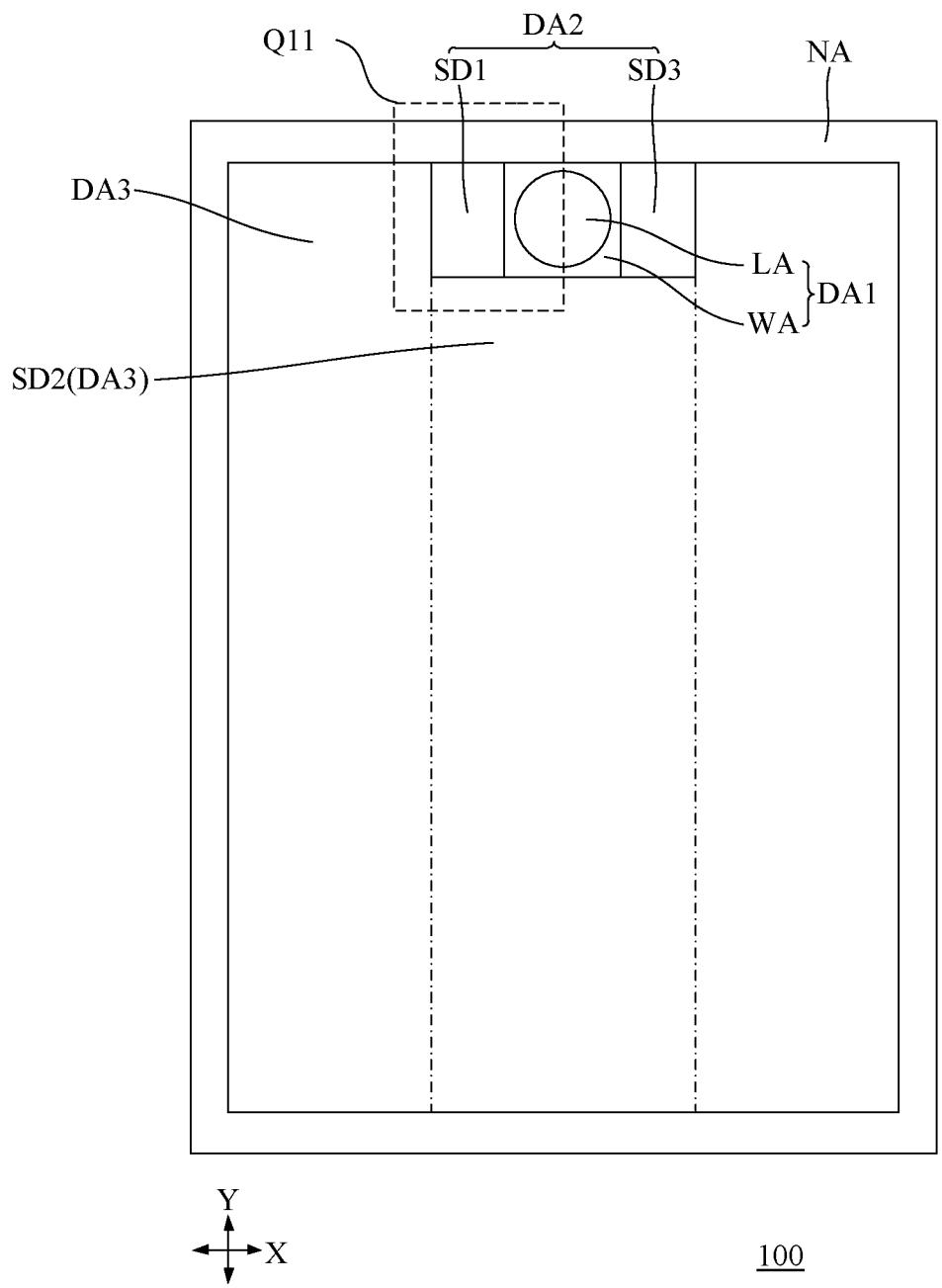
FIG. 22 illustrates a schematic top view of another exemplary display panel according to various embodiments of the present disclosure.
Figure 23:
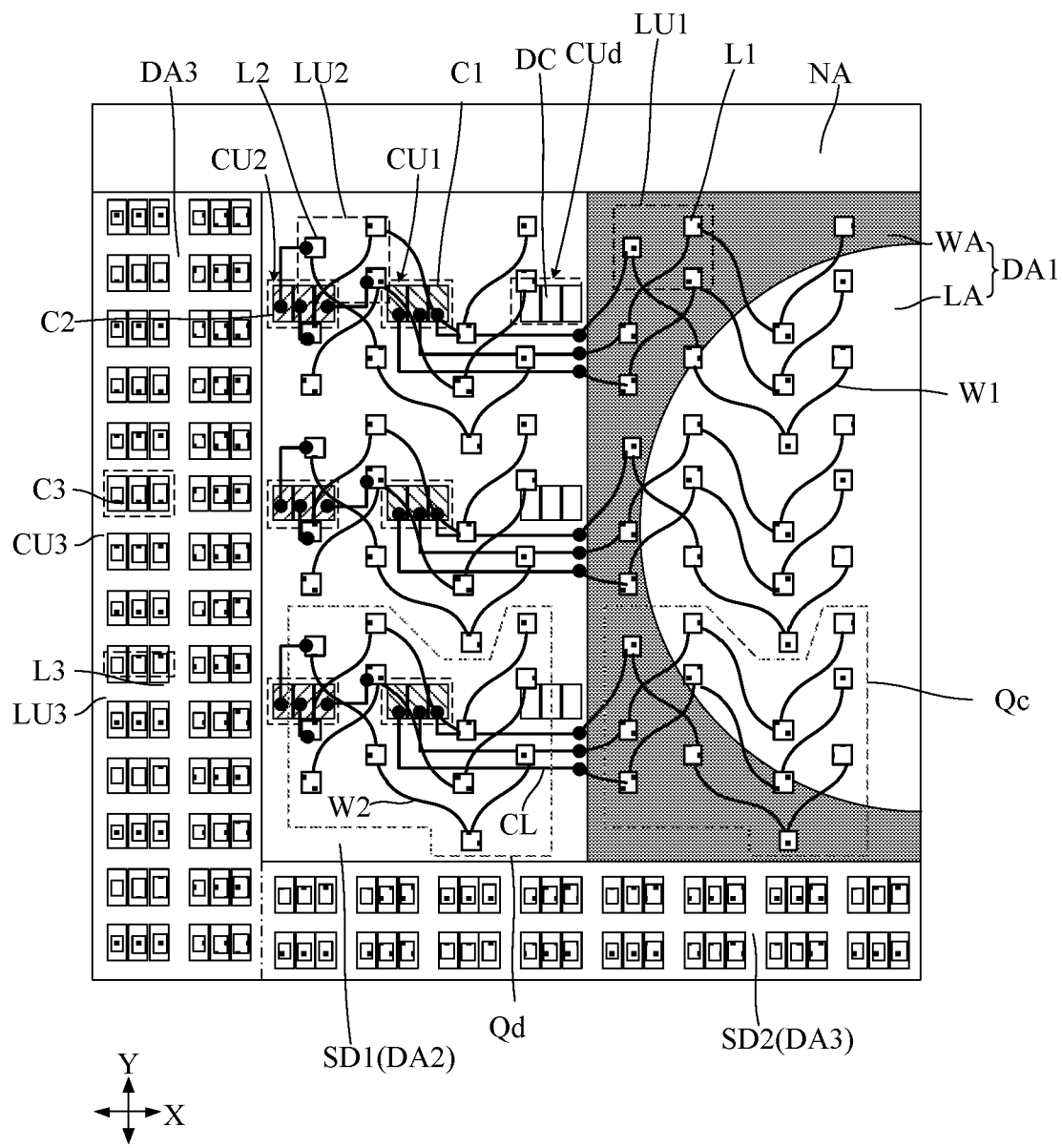
FIG. 23 illustrates a partial schematic top view of another exemplary display panel according to various embodiments of the present disclosure.

FIG. 20 illustrates a schematic top view of another exemplary display panel according to various embodiments of the present disclosure, and FIG. 21 illustrates a partial schematic top view of the exemplary display panel. Specifically, FIG. 21 shows, for example, a partial enlarged view of a Q10 region shown in FIG. 20. FIG. 22 illustrates a schematic top view of another exemplary display panel according to various embodiments of the present disclosure, and FIG. 23 illustrates a partial schematic top view of the exemplary display panel. Specifically, FIG. 23 shows, for example, a partial enlarged view of a Q11 region shown in FIG. 22.

Referring to FIGS. 20-23, the first light-emitting unit LU1 may include first light-emitting elements L1 of multiple colors, and the second light-emitting unit LU2 may include second light-emitting elements L2 of multiple colors. The display panel may further include first pixel circuit units CU1 and second pixel circuit units CU2. Each first pixel circuit unit CU1 may include a plurality of first pixel circuits C1, and each second pixel circuit unit CU2 may include a plurality of second pixel circuits C2. A first pixel circuit C1 may be correspondingly connected to p1 first light-emitting elements L1 of the same color, and a second pixel circuit C2 may be correspondingly connected to p2 second light-emitting elements L2 of the same color, where p1 and p2 are both integers, and p1≥2 and p2≥2.

It should be understood that in the present disclosure, the same reference numerals represent the same structure, which will not be redefined in the present.

In one embodiment, a case where p1=4 and p2=4, that is, a first pixel circuit C1 controls 4 first light-emitting elements L1 of the same color and a second pixel circuit C2 controls 4 second light-emitting elements L2 is taken as an example for illustration. A first pixel circuit C1 may be correspondingly connected to a plurality of first light-emitting elements L1 of the same color and a second pixel circuit C2 may be correspondingly connected to a plurality of second light-emitting elements L2 of the same color, so that the number of the first pixel circuits C1 and the second pixel circuits C2 in the second display region DA2 may be reduced, and the light transmittance of the second display region DA2 may be improved. At the same time, more first light-emitting elements L1 or second light-emitting elements L2 can be arranged in the first display region DA1 and the second display region DA2 to increase the resolution of the first display region DA1 and the second display region DA2. As such, the split screen problem between different display regions may be suppressed, thereby improving the display performance of the display panel.

Figure 24:
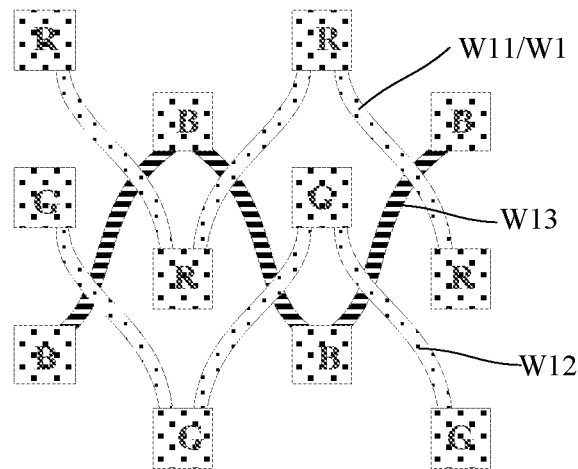
FIG. 24 illustrates a partial schematic view of a Qa region in FIG. 21.
Figure 25:
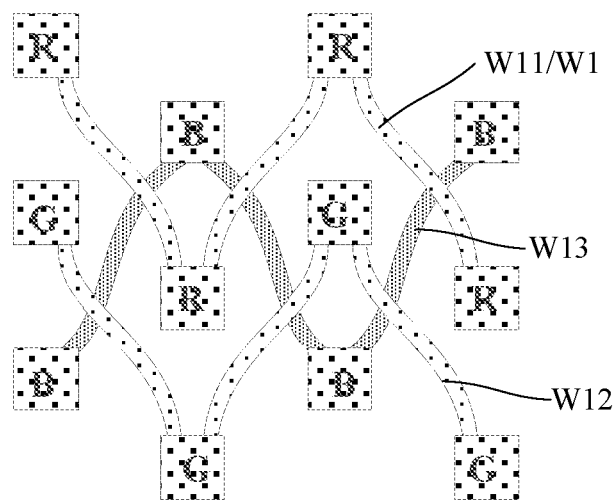
FIG. 25 illustrates another partial schematic view of the Qa region in FIG. 21.
Figure 26:
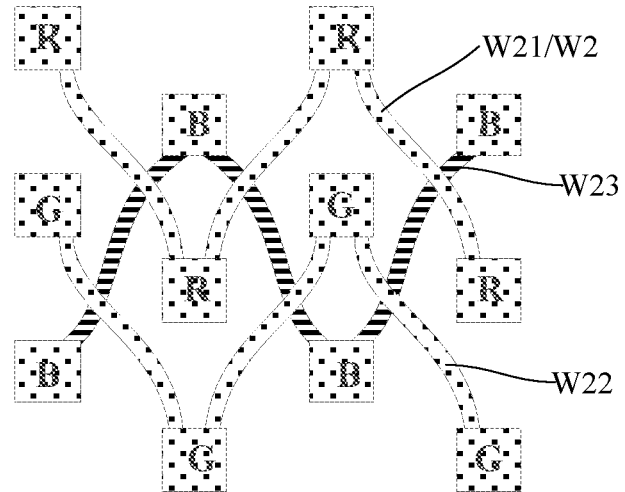
FIG. 26 illustrates a partial schematic view of a Qb region in FIG. 21.
Figure 27:
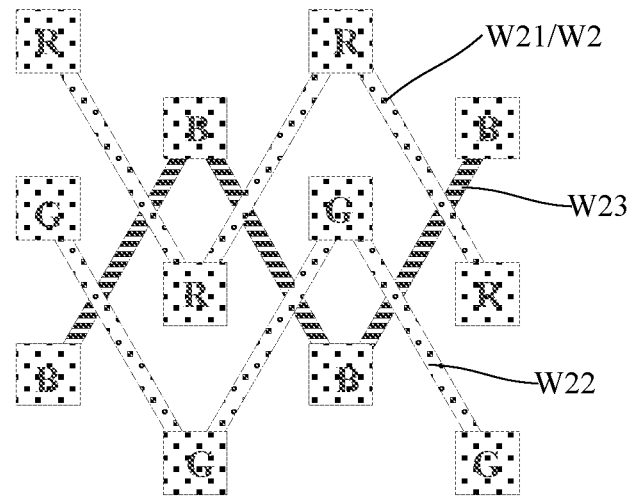
FIG. 27 illustrates a schematic diagram of an exemplary connection of a second light-emitting element according to various embodiments of the present disclosure.
Figure 28:
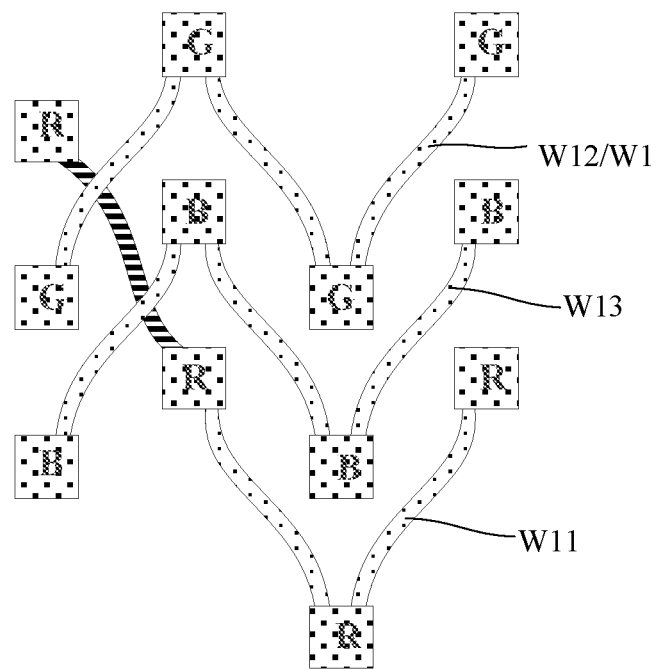
FIG. 28 illustrates a partial schematic view of a Qc region in FIG. 23.
Figure 29:
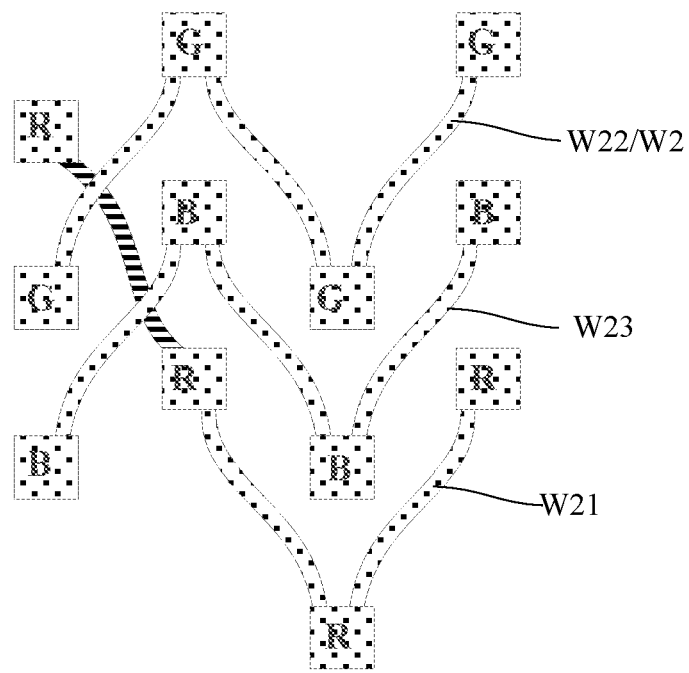
FIG. 29 illustrates a partial schematic view of a Qd region in FIG. 23.
Figure 30:
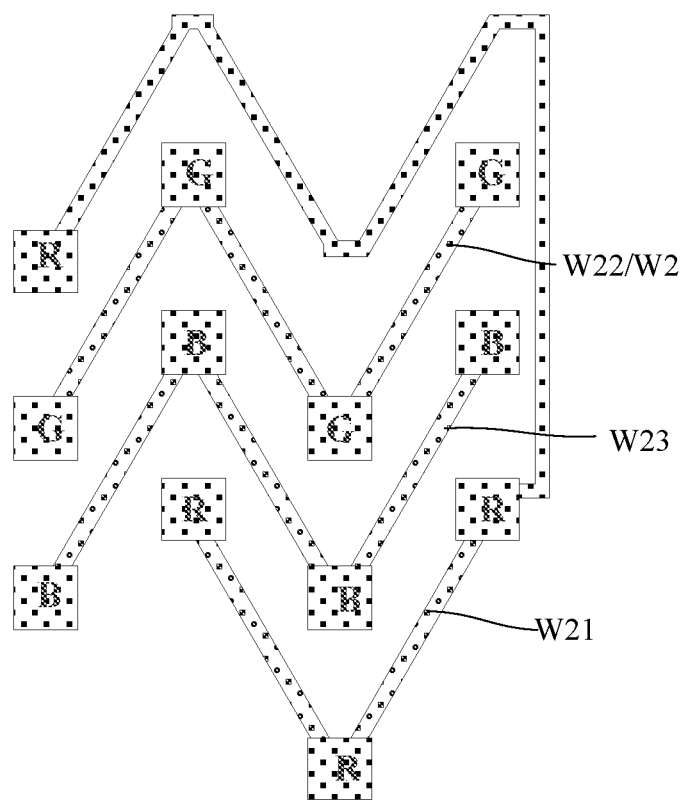
FIG. 30 illustrates a schematic diagram of another exemplary connection of a second light-emitting element according to various embodiments of the present disclosure.
Figure 31:
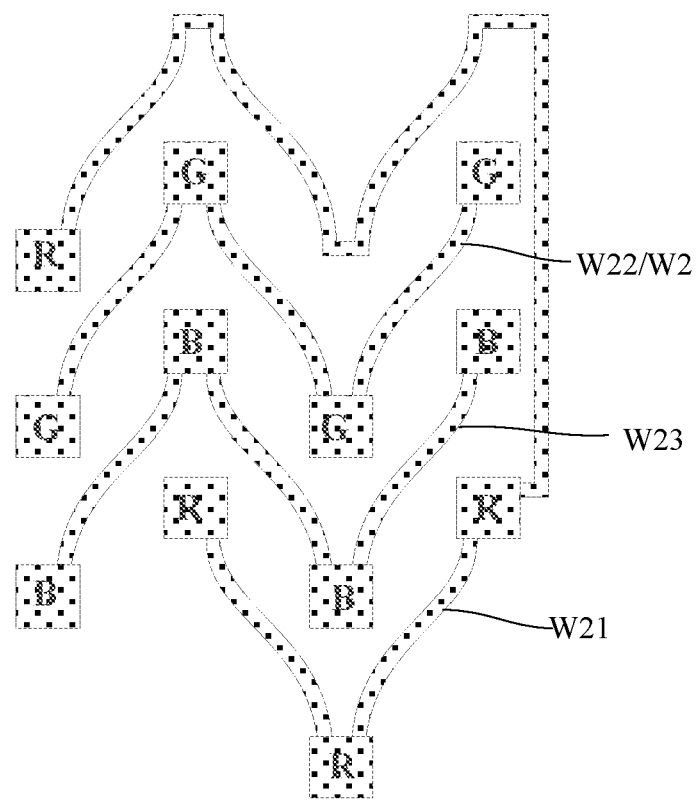
FIG. 31 illustrates a schematic diagram of another exemplary connection of a second light-emitting element according to various embodiments of the present disclosure.

FIG. 24 illustrates a partial enlarged view of a Qa region shown in FIG. 21, and FIG. 25 illustrates another partial enlarged view of a Qa region shown in FIG. 21. FIG. 26 illustrates a partial enlarged view of a Qb region shown in FIG. 21. FIG. 27 illustrates a schematic diagram of an exemplary connection of a second light-emitting element according to various embodiments of the present disclosure. FIG. 28 illustrates a partial enlarged view of a Qc region shown in FIG. 23, and FIG. 29 illustrates a partial schematic view of a Qd region in FIG. 23. FIG. 30 illustrates a schematic diagram of another exemplary connection of a second light-emitting element according to various embodiments of the present disclosure, and FIG. 31 illustrates a schematic diagram of another exemplary connection of a second light-emitting element according to various embodiments of the present disclosure.

In one embodiment, referring to FIGS. 20-25 and 28, the display panel may further include a substrate (now shown), and a device layer (not shown) located on the substrate. The first pixel circuits, the second pixel circuits, and the third pixel circuits may be disposed in the device layer. The device layer may include a gate metal layer, a capacitor metal layer, and a source/drain metal layer arranged in a direction away from the substrate. The display panel may also include a light-emitting element layer (not shown) located on the side of the device layer away from the substrate. The first light-emitting units LU1, the second light-emitting units LU2, and the third light-emitting units LU3 may be arranged on the light-emitting element layer. The light-emitting element layer may include a first electrode layer, a light-emitting structure layer, and a second electrode layer arranged in a direction away from the substrate. The first electrode layer may include first electrodes. A first light-emitting element L1 may include a first electrode. The first display region DA1 may include first connection lines W1, and the first connection line W1 may connect to the first electrodes of adjacent first light-emitting units LU1 of the same color. The p1 first electrodes of the p1 first light-emitting elements L1 that are correspondingly connected to the same first pixel circuit C1 may be electrically connected by multiple first connection lines W1, and at least one of the multiple first connection lines W1 may be a transparent line.

It should be understood that the at least one first connection line W1 being a transparent line refers to that at least one first connection line W1 is a wire with high light transmittance. For example, the light transmittance may be higher than the light transmittance of the metal wires in the third display region DA3 (e.g., scan lines, power supply voltage signal lines).

Because the first display region DA1 mainly corresponds to the photosensitive element (such as a front camera, an infrared sensor device, and a fingerprint recognition device), the light required by the photosensitive element during operation may need to pass through the first display region DA1. The p1 first electrodes of the p1 first light-emitting elements L1 that are correspondingly connected to the same first pixel circuit C1 may be electrically connected through a plurality of first connection lines W1. Setting at least one first connection line W1 as a transparent line may be able to further improve the light transmittance of the first display region DA1 and improve the user experience of the photosensitive element.

It should be understood that the first electrode included in the first electrode layer may be an anode, and the second electrode layer may be a cathode. The light-emitting structure layer may include a plurality of light-emitting structures, so that the corresponding light-emitting elements can emit light of any color of red, green, and blue. The colors described here are merely examples, and the present disclosure does not specifically define the colors of the emitted light. For example, the light-emitting elements (the first light-emitting element L1, the second light-emitting element L2) may emit light of any color of cyan, magenta, yellow, white, etc.

In addition, in the present disclosure, a case where the profiles of the first light-emitting elements L1 in the first display region DA1 and the second light-emitting elements L2 in the second display region DA2 are set to have square shapes (for example, the first electrodes of the first light-emitting element L1 and the second light-emitting element L2, e.g., the anodes, may be set to have square shapes) is taken as an example for illustration. Of course, the profiles of the first light-emitting elements L1 in the first display region DA1 and the second light-emitting elements L2 in the second display region DA2 may be set to have circular shapes (for example, the first electrodes of the first light-emitting element L1 and the second light-emitting element L2, e.g., the anodes, may be set to have circular shapes). The circular-shape design may suppress the diffraction phenomenon of the first display region DA1, thereby further improving the photographic quality of the camera under the screen. In actual products, the profiles of the first light-emitting elements L1 and the second light-emitting elements L2 may be set to have any other appropriate shapes, such as oval shapes, regular hexagonal shapes, rounded rectangular shapes, etc., which are not exhaustively listed in the present disclosure.

In the following, illustration is still based on the example where p1=4. Referring to FIGS. 21, 24-25, the first electrodes of the four first light-emitting elements L1 (including the light-emitting structures R that emit red light) correspondingly connected to a same first pixel circuit C1 may be connected through three first connection lines W11, the first electrodes of the four first light-emitting elements L1 (including the light-emitting structures G that emit green light) correspondingly connected to a same first pixel circuit C1 may be connected through three first connection lines W12, and the first electrodes of the four first light-emitting elements L1 (including the light-emitting structures B that emit blue light) correspondingly connected to a same first pixel circuit C1 may be connected through three first connection lines W13. In FIGS. 24-25, a case in which the three first connection lines W11 and the three first connection lines W12 are all transparent lines, and the three first connection lines W13 are all metal wires is taken as an example for illustration. The first connection lines W11 and the first connection lines W12 may be made of a transparent material, such as ITO or IZO, and the first connection lines W11 and the first connection lines W12 may be formed in a same layer and by a same process. As such, the number of film layers and the number of the corresponding masks may both be reduced, thereby reducing the difficulty of the manufacturing process of the display panel, improving the manufacturing efficiency of the display panel, and in the meantime, making the display panel lighter and thinner. In FIG. 24, the three first connection lines W13 may all be disposed in the capacitor metal layer (such as molybdenum), and in FIG. 25, the three first connection lines W13 may all be disposed in the gate metal layer (such as molybdenum). A metal has desired electrical conductivity, and thus by using a metal to form a part of the first connection lines (e.g. the first connection lines W13), the signal transmission efficiency may be improved and the display performance may also be improved. Of course, the first connection lines W13 may adopt any other forms of metal film layers, such as a source/drain metal layer (e.g., three layers of molybdenum-aluminum-molybdenum, titanium-aluminum-titanium, or a single layer or multiple layer of other metals), and the detailed selection of the structure is not specifically defined in the present disclosure.

Referring to FIGS. 23 and 28, the positions of the plurality of first light-emitting elements L1 corresponding to the same first pixel circuit C1 may be adjusted, so that more first connection lines may adopt transparent wiring, and the light transmittance of the first display region DA1 may be improved. For example, the first electrodes of the first light-emitting elements L1 (including the light-emitting structures R that emit red light) correspondingly connected to a same first pixel circuit C1 may be connected through three first connection lines W11. Among the three first connection lines W11, two first connection lines W11 may be disposed in the same layer and using the same transparent material as the remaining first connection lines W12 and first connection lines W13, while the other first connection line W11 may be formed in a different layer (such as a capacitor metal layer) and using a metal, or in a different layer using a transparent material (such as ITO), which will not be specifically defined in the present disclosure.

Figure 32:
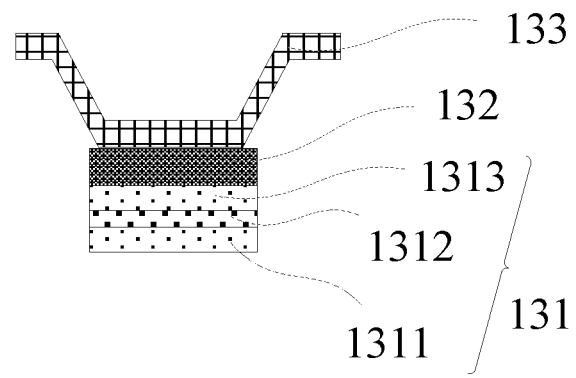
FIG. 32 illustrates a schematic cross-sectional view of an exemplary display panel according to various embodiments of the present disclosure.

FIG. 32 illustrates a schematic cross-sectional view of an exemplary display panel according to various embodiments of the present disclosure. It should be noted that some film layers and part of the structure are not shown in FIG. 32. Referring to FIG. 32, in one embodiment, the first electrode layer 131 may include a first conductive layer 1311, a second conductive layer 1312, and a third conductive layer 1313 arranged in a direction away from the substrate. The first conductive layer 1311 and the third conductive layer 1313 may be transparent conductive layers, the second conductive layer 1312 may be a metallic conductive layer. The transparent lines may be located in the first conductive layer 1311.

The first electrode 131 may be an anode, and may include a first conductive layer 1311, a second conductive layer 1312, and a third conductive layer 1313. The material of the first conductive layer 1311 and the third conductive layer 1313 may be ITO, and the material of the second conductive layer 1312 may be silver (Ag). The second electrode layer 133 may be a cathode, and the light-emitting structure layer may include a plurality of light-emitting structures 132. In one embodiment, by multiplexing the first conductive layer 1311 (ITO) of the first electrode 131 (anode) as the transparent first connection lines W11, the number of film layers and the number of the corresponding masks may be reduced, thereby reducing the difficulty of the manufacturing process of the display panel, improving the manufacturing efficiency of the display panel, and in the meantime, making the display panel lighter and thinner.

In one embodiment, referring to FIGS. 20-25 and 28, at least one first connection line W11 may be a curved line, such as an arc-shaped line or a wavy line. As such, straight-edge borders (or straight-edge gaps) in the first display region DA1 may be avoided, and the diffraction phenomenon in the first display region DA1 can be substantially suppressed. When the photosensitive element is a camera, the influence of the diffraction phenomenon on the picture taken by the camera can be reduced, thereby conducive to improving the clarity of the picture taken and improving the photographic quality.

In one embodiment, referring to FIGS. 20-23, 26-27, and 29-31, the second light-emitting element L2 may include a first electrode, and p2 first electrodes of the p2 second light-emitting elements L2 correspondingly connected to a same second pixel circuit C2 may be electrically connected by a plurality of second connection lines W2. At least one second connection line W2 may be a metal line.

The second display region DA2 may be provided with a transition region, and the light transmittance of the transition region may be smaller than that of the first display region DA1. Therefore, by setting at least one second connection line W2 in this region as a metal line, the transmission efficiency of the signal may be improved, and thus the display performance may be improved.

In the following, illustration is still based on the example where p2=4. Referring to FIGS. 21 and 26-27, the first electrodes of the four second light-emitting elements L2 (including the light-emitting structures R that emit red light)

correspondingly connected to a same second pixel circuit C2 may be connected through three second connection lines W21, the first electrodes of the four second light-emitting elements L2 (including the light-emitting structures G that emit green light) correspondingly connected to a same second pixel circuit C2 may be connected through three second connection lines W22, and the first electrodes of the four second light-emitting elements L2 (including the light-emitting structures B that emit blue light) correspondingly connected to a same second pixel circuit C2 may be connected through three second connection lines W23. In FIGS. 26-27, a case in which all the second connection lines W2 (including the second connection lines W21, the second connection lines W22, and the second connection lines W23) are metal wires is taken as an example for illustration. The second connection lines W21 and the second connection lines W22 may be disposed in a same layer as and using the same material as the first electrodes, while the second connection lines W23 may be made from any one of the gate metal layer, the capacitor metal layer, and the source/drain metal layer. It should be understood that in the disclosed display panel, the plurality of second connection lines W2 that overlap each other in the direction perpendicular to the plane of the substrate may need to be formed from different metal film layers to realize electrical isolation. In actual products, the wiring layout may be designed according to the film layers of the display panel, which will not be specifically defined in the present disclosure.

Referring to FIGS. 23 and 29-31, in one embodiment, the positions of the plurality of second light-emitting elements L2 corresponding to a same second pixel circuit C2 may be adjusted, so that more second connection lines W2 can be formed in the same layer. As such, the number of film layers and the number of the corresponding masks may be reduced, thereby reducing the difficulty of the manufacturing process of the display panel, improving the manufacturing efficiency of the display panel, and in the meantime, making the display panel lighter and thinner. For example, referring to FIG. 29, the first electrodes of the four second light-emitting elements L2 (including the light-emitting structures R that emit red light) correspondingly connected to a same second pixel circuit C2 may be connected through three second connection lines W21. Among the three second connection lines W21, two second connection lines W21 may be disposed in the same layer and using the same transparent material as the remaining second connection lines W22 and second connection lines W23, while the other second connection line W21 may be formed in a different layer (such as a capacitor metal layer) and using a metal. Referring to FIGS. 30-31, all the second connection lines W2 may be located in the same film layer (for example, the same layer with the first electrodes), such that the difficulty of the manufacturing process of the display panel may be reduced, and details will not be described in the present disclosure.

Referring to FIGS. 27 and 30-31, at least one second connection line W2 may be a straight line. By setting at least one second connection line as a straight line, the difficulty of wiring in the second display region DA2 may be reduced, and the space of the second display region DA2 may be used efficiently. As such, more second light-emitting elements L2, first pixel circuits C1, or second pixel circuits C2 may be arranged in the second display region DA2. Therefore, the light-emitting area size (aperture ratio) or the value of pixel per inch (PP) of the first display region DA1 or the second display region DA2 may be improved. As such, the split screen problem between different display regions may be suppressed, thereby improving the display performance of the display panel.

Figure 33:
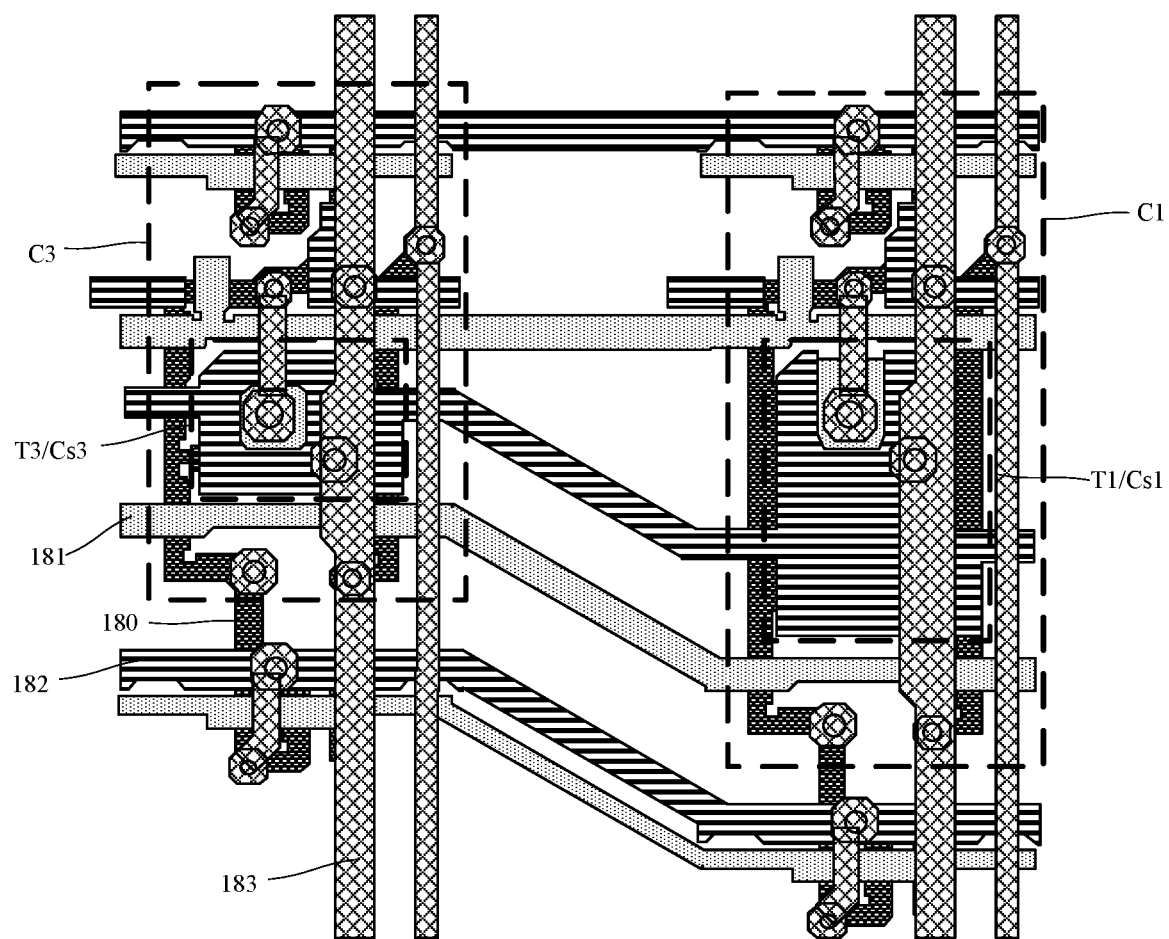
FIG. 33 illustrates a schematic structural diagram of an exemplary first pixel circuit and an exemplary third pixel circuit according to various embodiments of the present disclosure.
Figure 34:
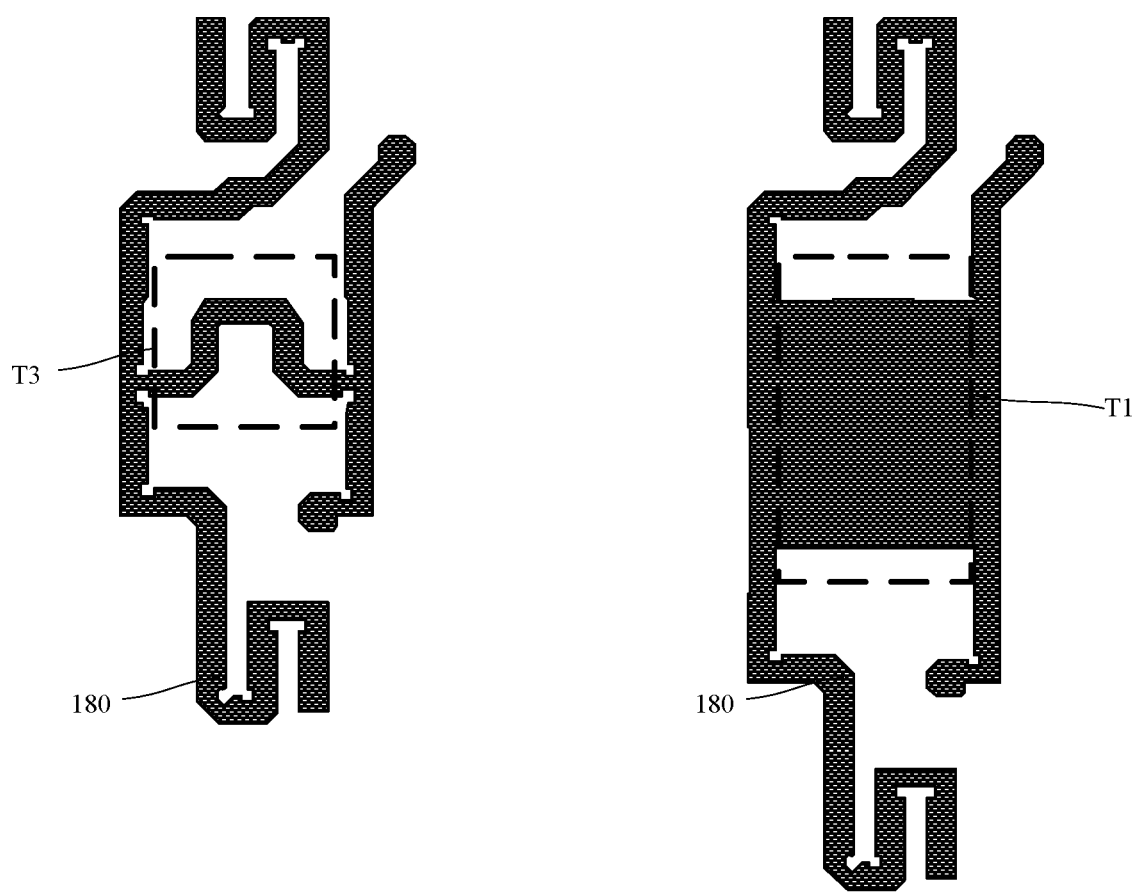
FIG. 34 illustrates a schematic structural diagram of a semiconductor layer of an exemplary first pixel circuit and an exemplary third pixel circuit according to various embodiments of the present disclosure.
Figure 35:
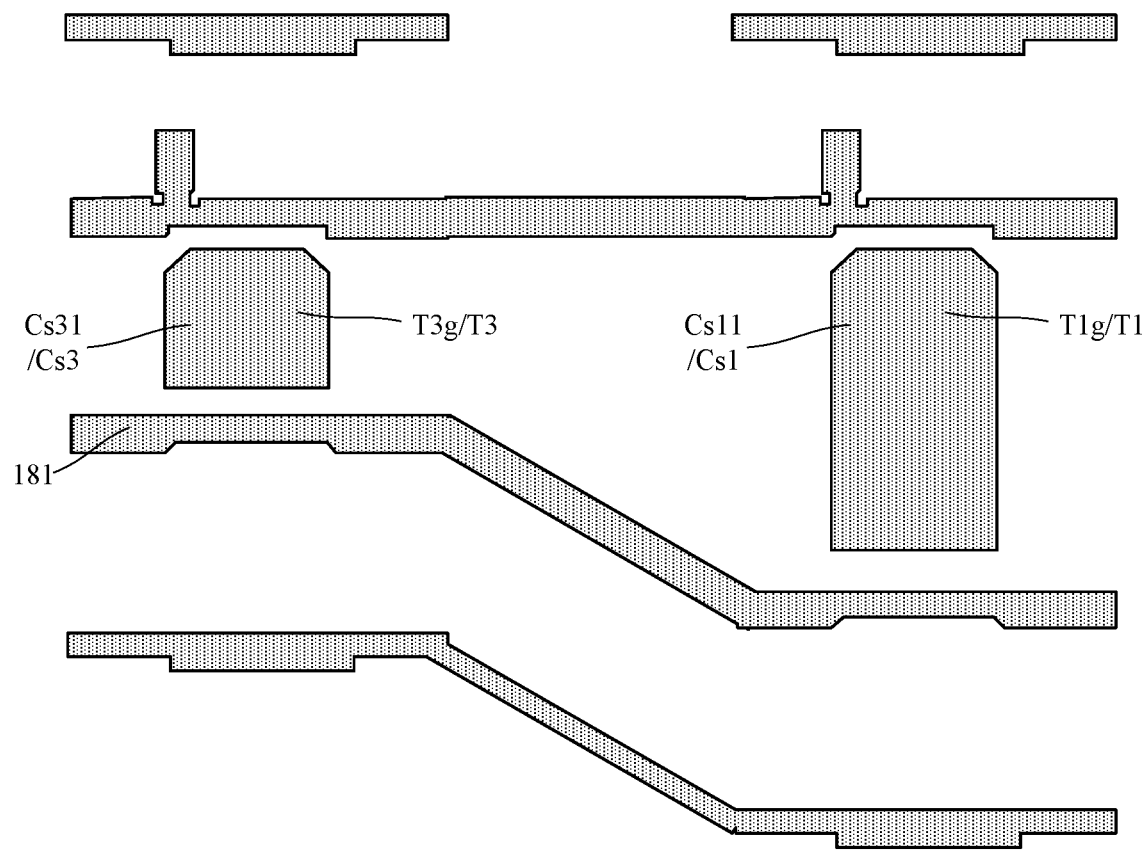
FIG. 35 illustrates a schematic structural diagram of a gate metal layer of an exemplary first pixel circuit and an exemplary third pixel circuit according to various embodiments of the present disclosure.
Figure 36:
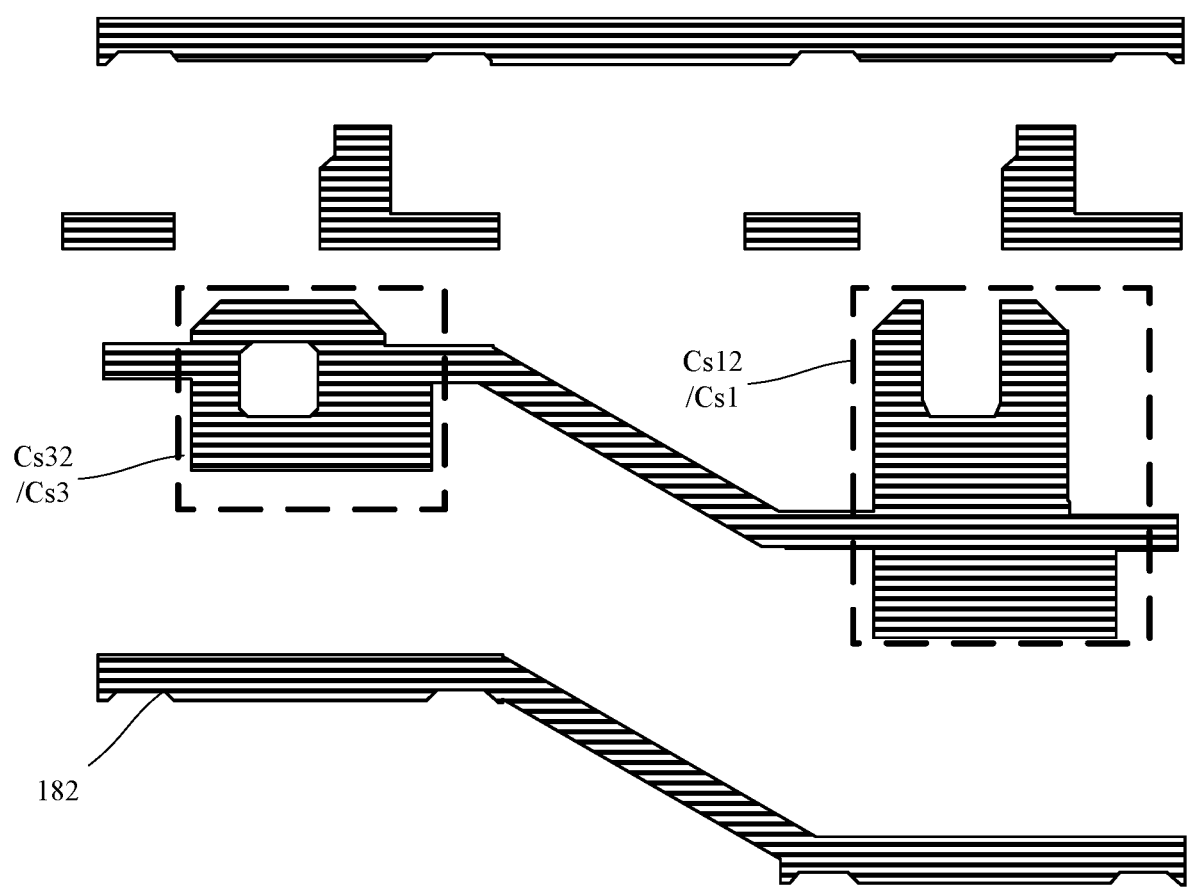
FIG. 36 illustrates a schematic structural diagram of a capacitor metal layer of an exemplary first pixel circuit and an exemplary third pixel circuit according to various embodiments of the present disclosure.
Figure 37:
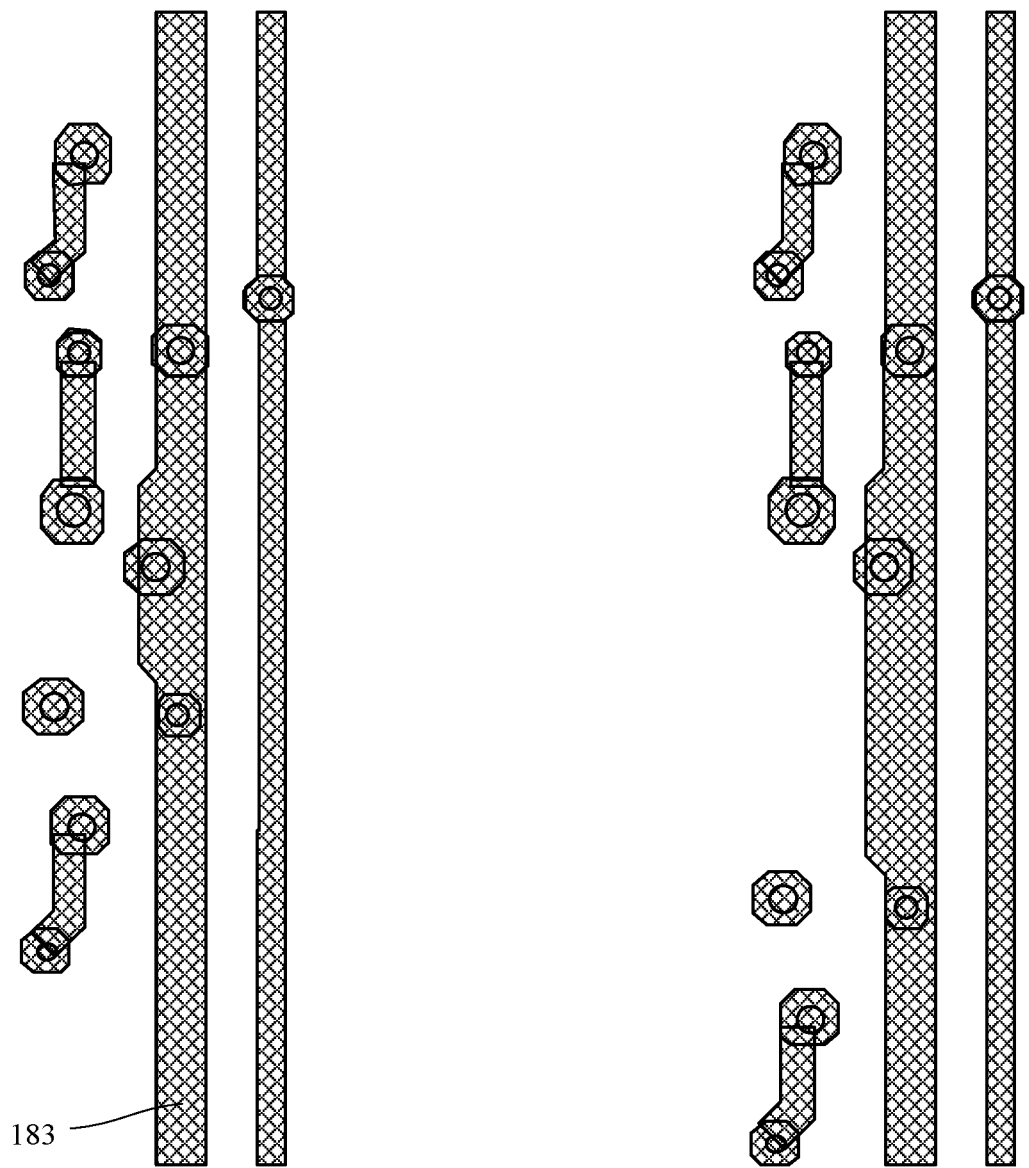
FIG. 37 illustrates a schematic structural diagram of a source/drain metal layer of an exemplary first pixel circuit and an exemplary third pixel circuit according to various embodiments of the present disclosure.

FIG. 33 illustrates a schematic structural diagram of an exemplary first pixel circuit and an exemplary third pixel circuit according to various embodiments of the present disclosure, while FIG. 34 illustrates a schematic structural diagram of a semiconductor layer of an exemplary first pixel circuit and an exemplary third pixel circuit according to various embodiments of the present disclosure. FIG. 35 illustrates a schematic structural diagram of a gate metal layer of an exemplary first pixel circuit and an exemplary third pixel circuit according to various embodiments of the present disclosure, FIG. 36 illustrates a schematic structural diagram of a capacitor metal layer of an exemplary first pixel circuit and an exemplary third pixel circuit according to various embodiments of the present disclosure, and FIG. 37 illustrates a schematic structural diagram of a source/drain metal layer of an exemplary first pixel circuit and an exemplary third pixel circuit according to various embodiments of the present disclosure.

It should be understood that the display panel include a substrate (now shown), a source layer (poly) 180, a gate electrode metal layer 181, a capacitor metal layer 182, and a source/drain metal layer 183.

Referring to FIGS. 33-35, the first pixel circuit C1 may include a first driving transistor T1, the second pixel circuit (not shown) may include a second driving transistor T1, and the third pixel circuit C3 may include a third driving transistor T3. The aspect ratio of the first driving transistor may be R1, the aspect ratio of the second driving transistor may be R2, and the aspect ratio of the third driving transistor may be R3, where R1>R3>0 and/or R2>R3>0.

It should be noted that, in FIGS. 33-35, only the first pixel circuit C1 and the third pixel circuit C3 are illustrated, and the second pixel circuit and the structure included therein are not illustrated. The second pixel circuit may adopt the same design as the first pixel circuit C1, or may adopt a design different from that of the first pixel circuit, which will not be specifically defined in the present disclosure.

It should be understood that the larger the aspect ratio of the first driving transistor T1 of the first pixel circuit C1 is designed, the stronger the driving capability of the first driving transistor T1 is, so that when each first pixel circuit C1 needs to be correspondingly connected to a plurality of first light-emitting elements of the same color, the working efficiency and the performance of the first pixel circuit C1 can be ensured to achieve desired display performance. Similarly, when the number of the second light-emitting elements L2 that are correspondingly connected to the second pixel circuit C2 is large, the aspect ratio of the second driving transistor may be increased, and the details are not repeated here. For the third pixel circuit unit CU3, the above parameters may also be adjusted according to the number of the third light-emitting elements that the third pixel circuit unit CU3 is connected to, and the details are not repeated here.

Referring to FIGS. 21 and 23, when each first pixel circuit C1 is correspondingly connected to four first light-emitting elements L1 of the same color, each second pixel circuit C2 is correspondingly connected to four second light-emitting elements L2 of the same color, and each third pixel circuit C3 is correspondingly connected to four third light-emitting elements L3 of the same color, the aspect ratio R1 of the first driving transistor T1 may be greater than the aspect ratio R3 of the third driving transistor T3, and the aspect ratio R2 of the second driving transistor may be greater than the aspect ratio R3 of the third driving transistor T3. As such, compared with the third driving transistor T3, the first driving transistor T1 and the second driving transistor may have greater driving capabilities, thereby improving the working efficiency and the performance of the first pixel circuit C1 and the second pixel circuit C2, and ensuring the display performance.

It should be understood that, the size of the first pixel circuit C1 or the second pixel circuit C2 may be designed larger to improve the driving capability, and the details will not be described here in the present disclosure.

The first pixel circuit C1 may include a first storage capacitor Cs1 electrically connected to the gate T1g of the first driving transistor T1, the second pixel circuit (not shown) may include a second storage capacitor electrically connected to the gate of the second driving transistor, and the third pixel circuit C3 may include a third storage capacitor Cs3 electrically connected to the gate T3g of the third driving transistor T3. The capacitance of the first storage capacitor Cs1 may be larger than the capacitance of the third storage capacitor Cs3, and/or the capacitance of the second storage capacitor may be larger than the capacitance of the third storage capacitor Cs3.

The first storage capacitor Cs1 may include a first electrode plate Cs11 (located on the gate metal layer 181) and a second electrode plate Cs12 (located on the capacitor metal layer 182), the second storage capacitor may include a first electrode plate (located on the gate metal layer 181) and a second electrode plate (located on the capacitor metal layer 182), and the third storage capacitor Cs3 may include a first electrode plate Cs31 (located on the gate metal layer 181) and a second electrode plate Cs32 (located on the capacitor metal layer 182). It should be understood that the first electrode plate Cs11 may be multiplexed as the gate T1g of the first driving transistor T1, and the second electrode plate Cs32 may be multiplexed as the gate T3g of the third driving transistor T3.

It should be understood that the second storage capacitor may adopt the same design as the first storage capacitor Cs1, or may adopt a design different from that of the first storage capacitor Cs1, which will not be specifically defined in the present disclosure.

The capacitance of a capacitor depends on the relative area between the two electrode plates of the capacitor. Referring to FIGS. 33 and 35-36 in conjunction with FIGS. 21 and 23, when each first pixel circuit C1 is correspondingly connected to four first light-emitting elements L1 of the same color, each second pixel circuit C2 is correspondingly connected to four second light-emitting elements L2 of the same color, and each third pixel circuit C3 is correspondingly connected to four third light-emitting elements L3 of the same color, the relative area between the two electrode plates of the first storage capacitor Cs1 may be larger than the relative area between the two electrode plates of the third storage capacitor Cs3, and the relative area between the two electrode plates of the second storage capacitor may be larger than the relative area between the two electrode plates of the third storage capacitor Cs3. As such, the storage capacitors of the first pixel circuit C1 and the second pixel circuit may be ensured to have a large capacitance, and thus the charging efficiency may be improved. As such, the display panel may demonstrate desired display performance.

Figure 38:
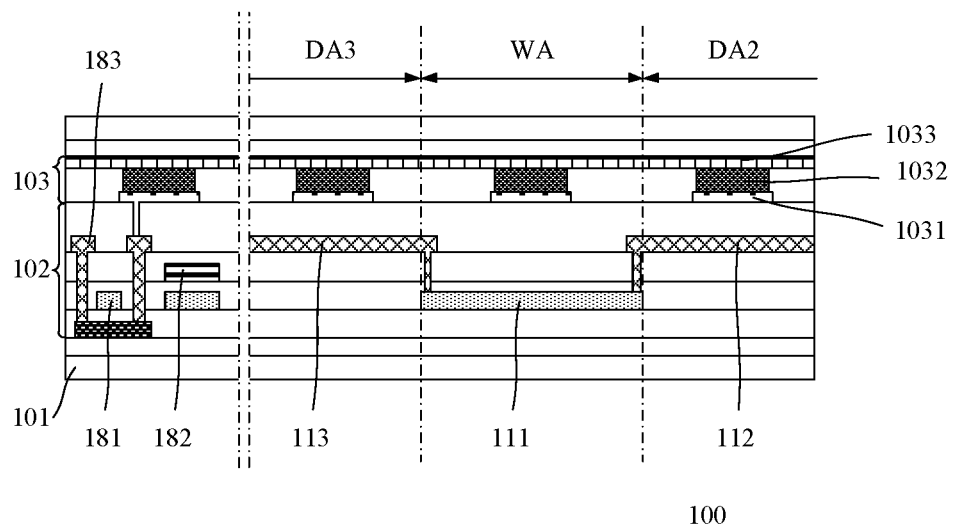
FIG. 38 illustrates a schematic cross-sectional view of another exemplary display panel according to various embodiments of the present disclosure.

FIG. 38 illustrates a schematic cross-sectional view of another exemplary display panel according to various embodiments of the present disclosure. Referring to FIG. 38, in one embodiment, the display panel 100 may include a substrate 101, a device layer 102, and a light-emitting element layer 103. The device layer 102 may be located on the substrate 101. In some embodiments, the display panel 100 may further include a buffer layer disposed between the substrate 101 and the device layer 102. The first pixel circuits C1, the second pixel circuits C2, and the third pixel circuits C3 may be disposed in the device layer 102. The light-emitting element layer 103 may be located on the side of the device layer 102 away from the substrate 101. The first light-emitting units LU1, the second light-emitting units LU2, and the third light-emitting units LU3 may be disposed in the light-emitting element layer 103. The light-emitting element layer 103 may include structures such as an anode 1031, a light-emitting structure 1032, and a cathode 1033, which will not be repeated here. In some embodiments, the display panel 100 may further include an encapsulation layer located on the side of the light-emitting element layer 103 away from the substrate 101, and a cover plate located on the side of the encapsulation layer away from the substrate 101.

In one embodiment, the device layer 102 may include a plurality of metal layers sequentially arranged in a direction away from the substrate 101. The first data lines 110 and the second data lines 120 may both be located in the plurality of metal layers, and the plurality of first sub-data lines 111 and at least one of the plurality of second sub-data lines 112 and the plurality of third sub-data lines 113 may be located in different metal layers. Arranging a part of the first data lines 110 in a metal layer different from the metal layer where the other part of the first data lines 110 is arranged may avoid having all the structures of the first data lines 110 disposed in a same metal layer, such that more metal layers may be able to provide space for wiring, which may increase the number of first data lines 110 that can be provided on the display panel 100, thereby conducive to providing stable data signals for the display panel 100 with a high pixel density.

Referring to FIG. 38, in one embodiment, the plurality of metal layers may include a gate metal layer 181, a capacitor metal layer 182, and a source/drain metal layer 183 arranged in a direction away from the substrate 101. The second data lines 120, the second sub-data lines 112, and the third sub-data lines 113 may be located in the source/drain metal layer 183, and the first sub-data lines 111 may be located in at least one of the gate metal layer 181 and the capacitor metal layer 182. For example, the second data lines 120, the second sub-data lines 112, and the third sub-data lines 113 may be located in the source/drain metal layer 183, and the first sub-data lines 111 may be located in the gate metal layer 181. In some embodiments, among the plurality of first data lines 110, a part of the first sub-data lines 111 of the first data lines 110 may be located in the gate metal layer 181, and a part of the first sub-data lines 111 of the first data lines 110 may be located in the capacitor metal layer 182. Therefore, the first data lines 110 may be distributed in different metal layers, and thus the number of the first data lines 110 that can be arranged on the display panel 100 may be further increased. As such, the requirements for providing data signals to the transparent display region of the display panel 100 with a high pixel density may be satisfied. In some embodiments, in each first data line 110, a part of the first sub-data line 111 may be located in the gate metal layer 181, and the other part of the first sub-data line 111 may be located in the capacitor metal layer 182.

Figure 39:
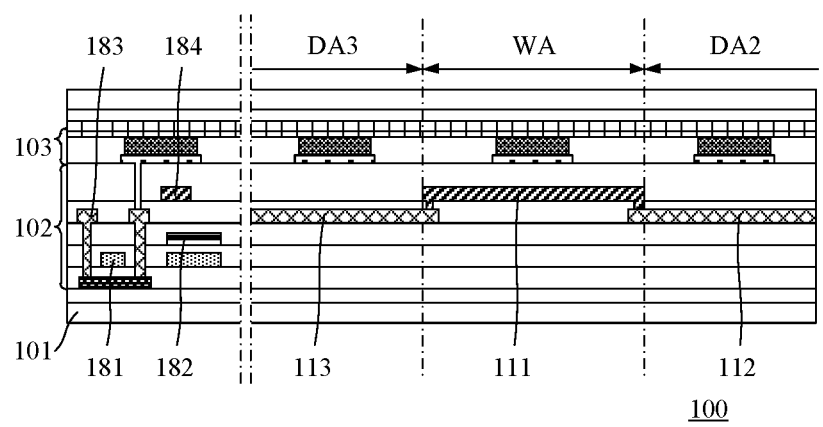
FIG. 39 illustrates a schematic cross-sectional view of another exemplary display panel according to various embodiments of the present disclosure.

FIG. 39 illustrates a schematic cross-sectional view of another exemplary display panel according to various embodiments of the present disclosure. Referring to FIG. 39, the plurality of metal layers may include a gate metal layer 181, a capacitor metal layer 182, a source/drain metal layer 183, and a third metal layer 184 arranged in a direction away from the substrate 101. The second data lines 120 and the third sub-data lines 113 may be located in the source/drain metal layer 183. The second sub-data lines 112 may be located in at least one of the source/drain metal layer 183 and the third metal layer 184. For example, in one embodiment, the second sub-data lines 112 may be located in the source/drain metal layer 183. The first sub-data lines 111 may be located in at least one of the gate metal layer 181, the capacitor metal layer 182, and the third metal layer 184. In one embodiment, the first sub-data lines 111 may be located in the third metal layer 184.

As described above, the pixel circuit may include thin film transistors and capacitors. In one embodiment, the gate metal layer 181 may be the metallic conductive layer where the gate of the thin film transistor is located, and the capacitor metal layer 182 may be the metallic conductive layer where one of the electrode plates of the capacitor is located. The source/drain metal layer 183 may be a metallic conductive layer where the source/drain of the thin film transistor are located, and the third metal layer 184 may be any metallic conductive layer on the side of the source/drain metal layer 183 away from the substrate 101 in the device layer 102, for example, the metallic conductive layer where the power supply line is located.

Figure 40:
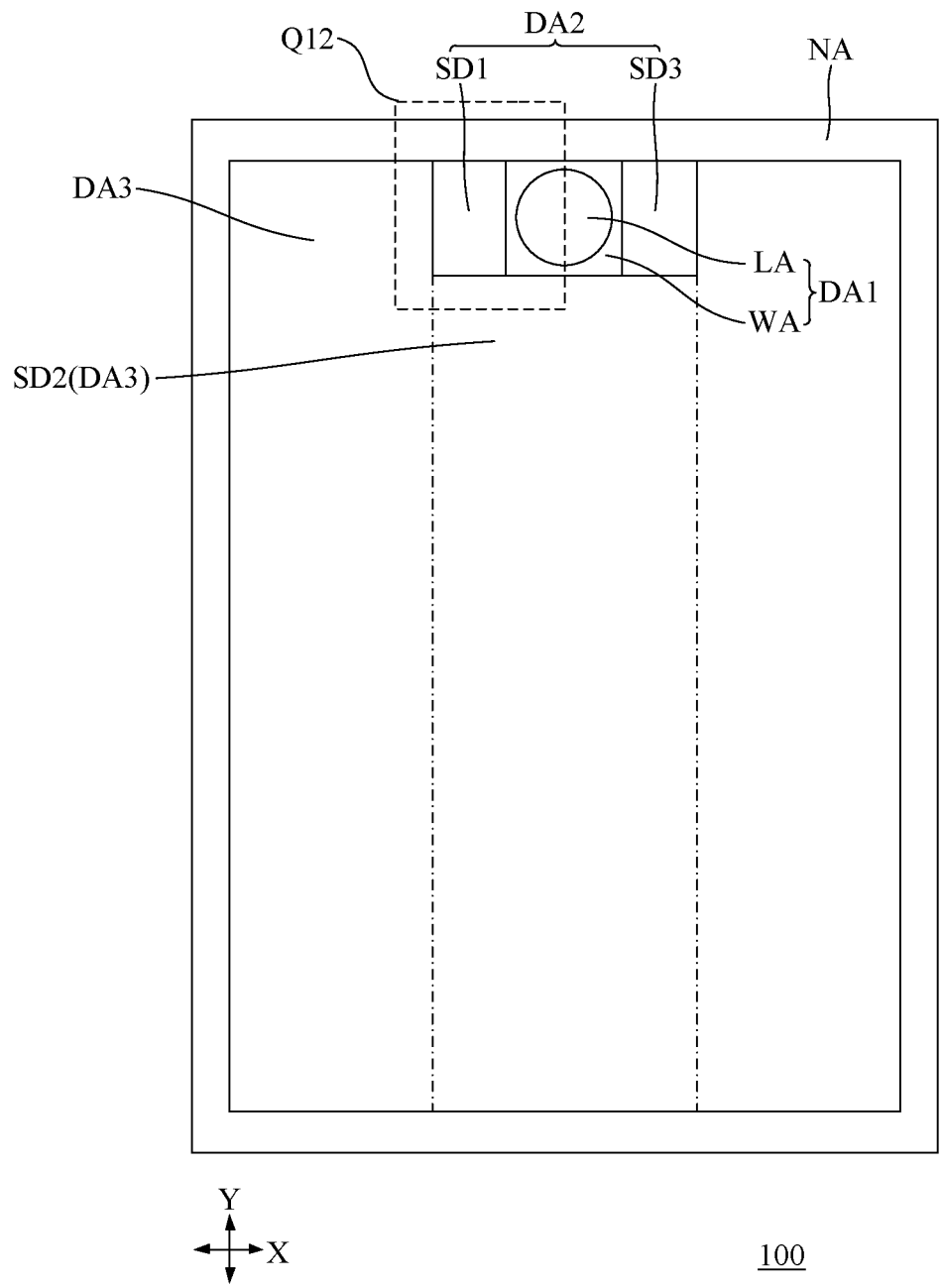
FIG. 40 illustrates a schematic top view of another exemplary display panel according to various embodiments of the present disclosure.
Figure 41:
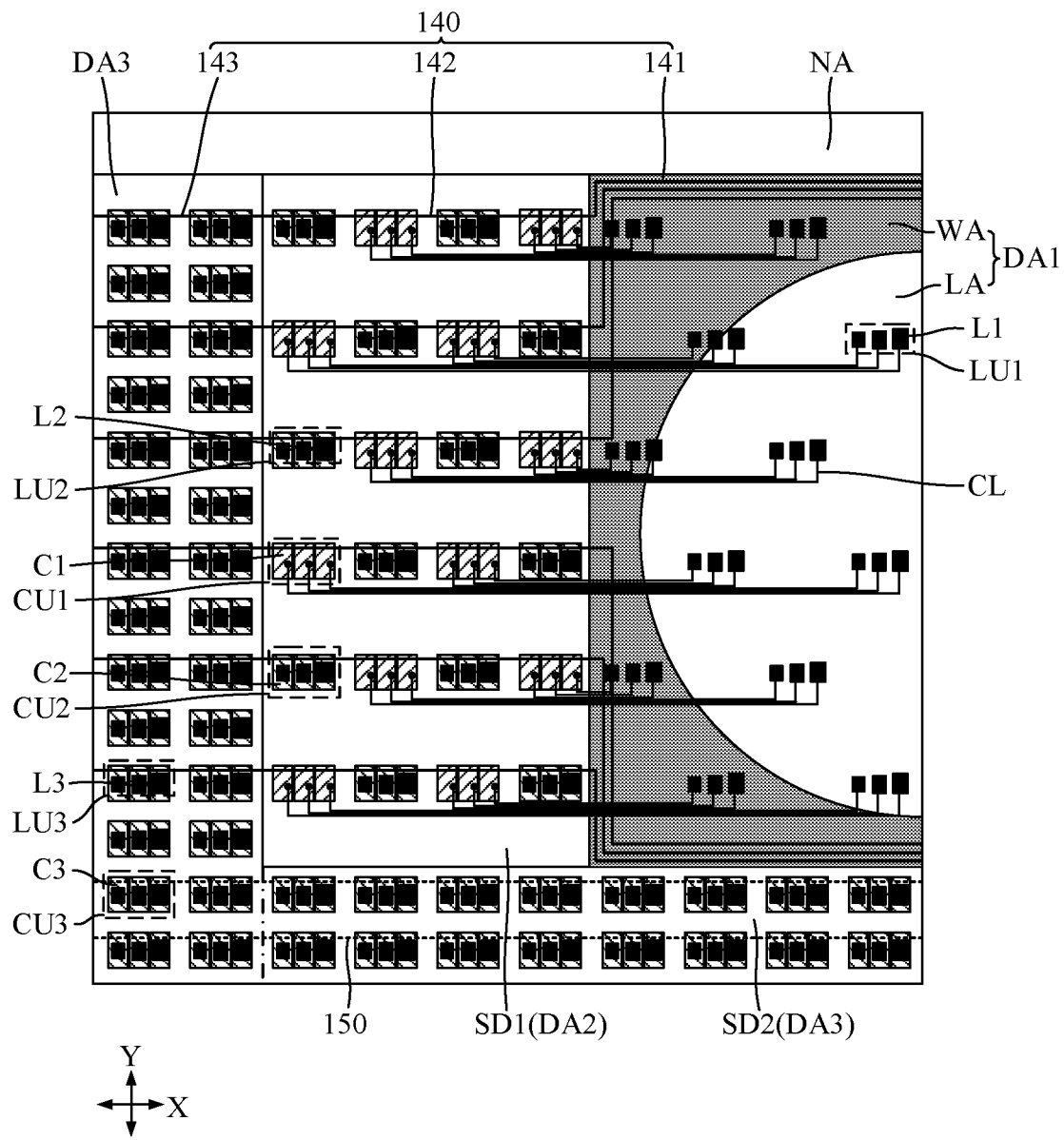
FIG. 41 illustrates a partial schematic top view of another exemplary display panel according to various embodiments of the present disclosure.

FIG. 40 illustrates a schematic top view of another exemplary display panel according to various embodiments of the present disclosure, and FIG. 41 illustrates a partial schematic top view of the exemplary display panel. Specifically, FIG. 41 shows, for example, a partial enlarged view of a Q12 region shown in FIG. 40.

Referring to FIGS. 40-41, in one embodiment, the display panel 100 may further include a plurality of first signal lines 140 and a plurality of second signal lines 150. Each first signal line 140 may include a first sub-signal line 141, a second sub-signal line 142, and a third sub-signal line 143. The first sub-signal line 141, the second sub-signal line 142, and the third sub-signal line 143 may be electrically connected together to form the first signal line 140. The wiring region WA may be provided with a plurality of first sub-signal lines 141, the second display region DA2 may be provided with a plurality of second sub-signal lines 142, and the third display region DA3 may be provided with a plurality of third sub-signal lines 143. Arranging the first sub-signal line of the first signal line 140 in the wiring region WA may be able to, while ensuring that the first sub-signal line 141 can be electrically connected to the second sub-signal line 142 and the third sub-signal line 143 of the same first signal line 140, prevent the first sub-signal line 141 from extending in the effective light-transmission region LA. As such, shielding the effective light-transmission region LA by the wiring structure may be reduced, and the light transmittance of the effective light-transmission region LA may be improved.

Each first signal line 140 may be connected with a first pixel circuit C1, a second pixel circuit C2, and a third pixel circuit C3. That is, each first signal line 140 may be indirectly connected to a first light-emitting element L1, a second light-emitting element L2, and a third light-emitting element L3. The first light-emitting element L1, the second light-emitting element L2, and the third light-emitting element L3 corresponding to each first signal line 140 may be substantially located in a same row, that is, the first light-emitting element L1, the second light-emitting element L2, and the third light-emitting element L3 corresponding to each first signal line 140 may be substantially located on a same straight line along the first direction X (e.g., passed by a same straight line extending in the first direction X).

The first signal lines 140, the second sub-signal lines 142, and the third sub-signal lines 143 may extend substantially along the first direction X, and a plurality of third sub-signal lines 143 may be arranged along the second direction Y.

The numbers of the first sub-signal lines 141, the second sub-signal lines 142, and the third sub-signal lines 143 included in each first signal line 140 may be adjusted according to the arrangement of the display region on the display panel 100. Referring to FIG. 40, in one embodiment, the second display region DA2 may include a first sub-display region SD1 and a third sub-display region SD3. The first display region DA1 and the third sub-display region SD3 may be respectively located on the two sides of the first display region DA1 along the first direction X. Each first signal line 140 may include two second sub-signal lines 142, one of the second sub-signal lines 142 may be located in the first sub-display region SD1, and the other second sub-signal line 142 may be located in the third sub-display region SD3. The first sub-signal line 141 may be electrically connected to the two second sub-signal lines 142 of the same first signal line 140.

The second signal line 150 may be connected to the third pixel circuit C3 corresponding to the third light-emitting element L3, and the second signal line 150 may extend in the third display region DA3. In one embodiment, each second signal line 150 may be electrically connected to a row of third pixel circuits C3 in the third display region DA3, thereby electrically connecting to a row of third light-emitting elements L3 in the third display region DA3 in an indirect manner. Each second signal line 150 may extend substantially along the first direction X, and the plurality of second signal lines 150 may be arranged along the second direction Y.

The first signal line 140 and the second signal line 150 may be a scan line, a reference voltage-signal line (a Vref line), or an emit line.

Figure 42:
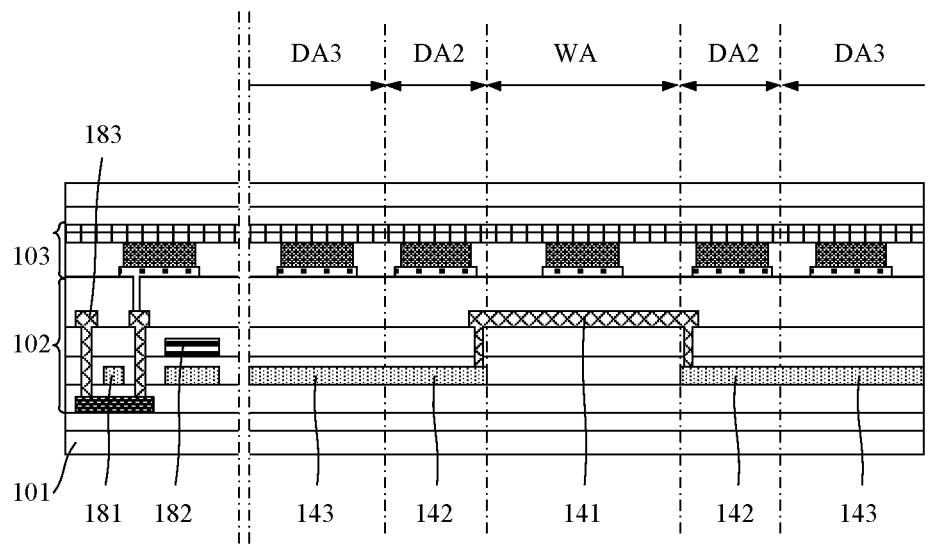
FIG. 42 illustrates a schematic cross-sectional view of another exemplary display panel according to various embodiments of the present disclosure.

FIG. 42 illustrates a schematic cross-sectional view of another exemplary display panel according to various embodiments of the present disclosure. Referring to FIG. 42, in one embodiment, the display panel 100 may also include a substrate 101, a device layer 102, and a light-emitting element layer 103. The device layer 102 may be located on the substrate 101. The first pixel circuits C1, the second pixel circuits C2, and the third pixel circuits C3 may be disposed in the device layer 102. The light-emitting element layer 103 may be located on the side of the device layer 102 away from the substrate 101. The first light-emitting units LU1, the second light-emitting units LU2, and the third light-emitting units LU3 may be disposed in the light-emitting element layer 103.

In one embodiment, the device layer 102 may include a plurality of metal layers sequentially arranged in a direction away from the substrate 101, and the first sub-signal lines 141 and at least one of the second sub-signal lines 142 and the third sub-signal lines 143 may be located in different metal layers. Arranging a part of the first data lines 110 in a metal layer different from the metal layer where the other part of the first data lines 110 is arranged may avoid having all the structures of the first data lines 110 disposed in a same metal layer, such that more metal layers may be able to provide space for wiring, which may increase the number of first data lines 110 that can be provided on the display panel 100, thereby conducive to providing stable data signals for the display panel 100 with a high pixel density.

Referring to FIG. 42, in one embodiment, the plurality of metal layers may include a gate metal layer 181, a capacitor metal layer 182, and a source/drain metal layer 183 arranged in a direction away from the substrate 101. The second sub-signal lines 142 and the third sub-signal lines 143 may be located in at least one of the gate metal layer 181 and the capacitor metal layer 182, and the first sub-signal line 141 may be located in the source/drain metal layer 183. For example, in one embodiment, the second sub-signal lines 142 and the third sub-signal lines 143 may be located in the gate metal layer 181, and the first sub-signal lines 141 may be located in the source/drain metal layer 183.

Figure 43:
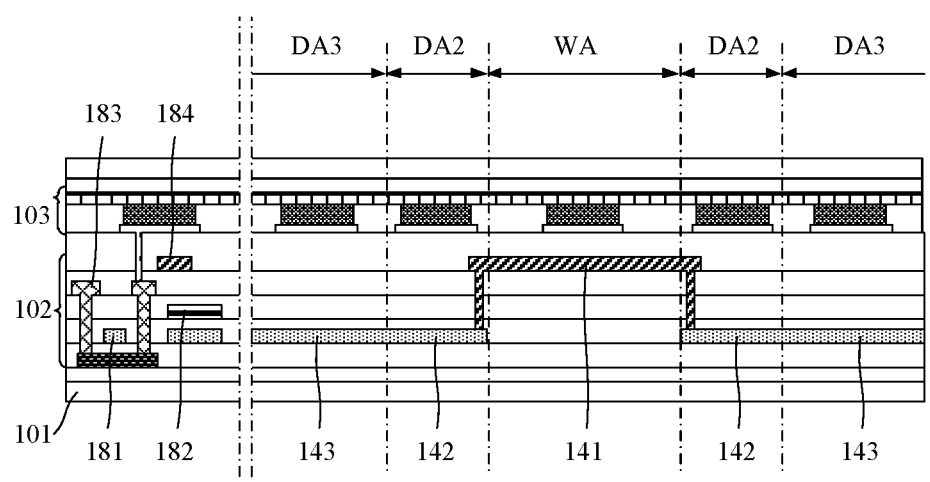
FIG. 43 illustrates a schematic cross-sectional view of another exemplary display panel according to various embodiments of the present disclosure.

FIG. 43 illustrates a schematic cross-sectional view of another exemplary display panel according to various embodiments of the present disclosure. Referring to FIG. 43, in one embodiment, the plurality of metal layers may include a gate metal layer 181, a capacitor metal layer 182, a source/drain metal layer 183, and a third metal layer 184 arranged in a direction away from the substrate 101. The third sub-signal lines 143 may be located in at least one of the gate metal layer 181 and the capacitor metal layer 182. The second sub-signal lines may be located in at least one of the gate metal layer 181, the capacitor metal layer 182, and the third metal layer 184. The first sub-signal lines 141 may be located in at least one of the source/drain metal layer 183 and the third metal layer 184. For example, in one embodiment, the second sub-signal lines 142 and the third sub-signal lines 143 may be located in the gate metal layer 181, and the first sub-signal lines 141 may be located in the third metal layer 184. In some embodiments, in the plurality of first signal lines 140, the first sub-signal lines of a part of the first signal lines 140 may be located in the third metal layer 184, and the first sub-signal lines 141 of another part of the first signal lines 140 may be located in the source/drain metal layer 183. As such, more metal layers may be able to provide space for arranging the first signal lines 140, which may increase the number of first data lines 110 that can be provided on the display panel 100, thereby meeting the requirements of the display panel 100 with a high pixel density. In some embodiments, in each first signal line 140, a part of the first sub-signal line 141 may be located in the third metal layer 184, and the other part may be located in the source/drain metal layer 183.

Figure 44:
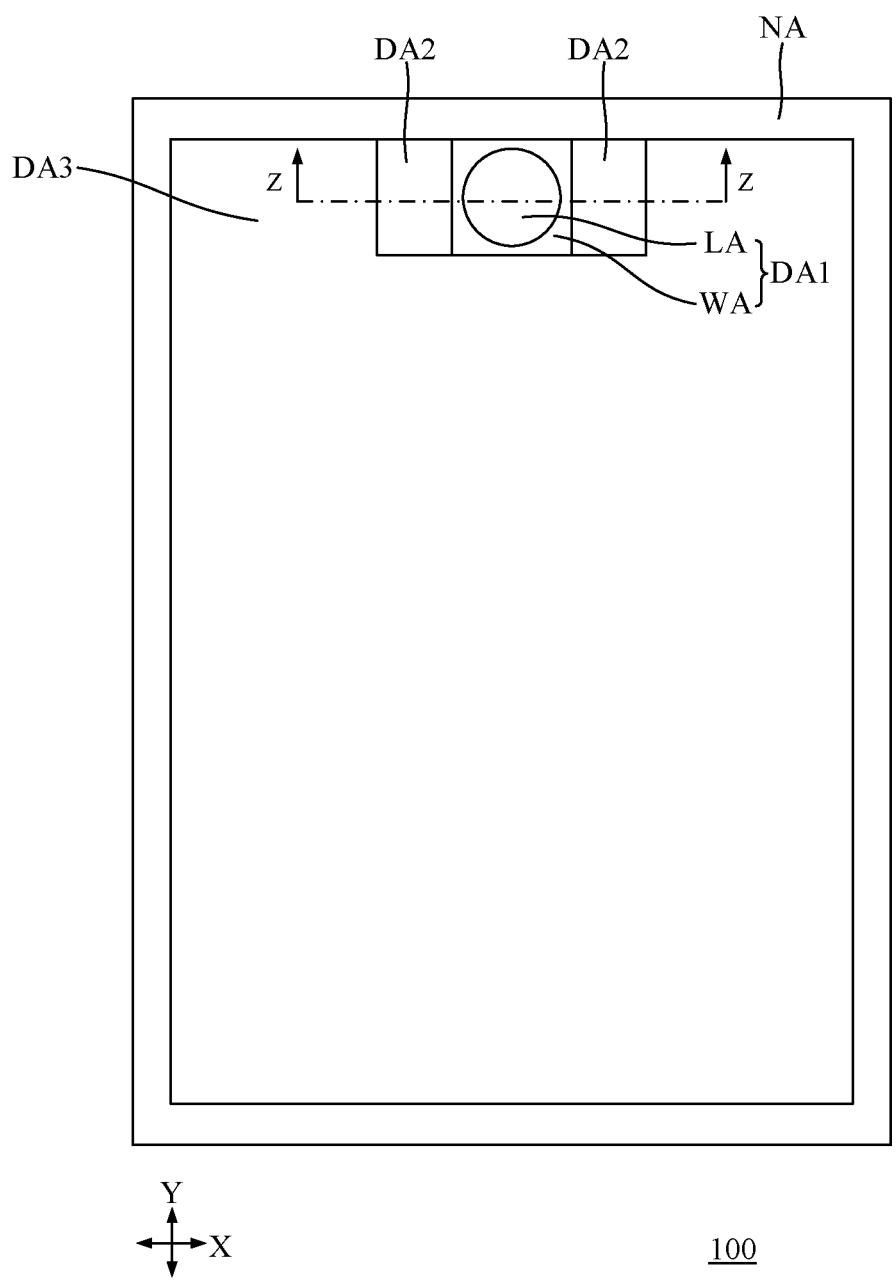
FIG. 44 illustrates a schematic top view of an exemplary display device according to various embodiments of the present disclosure.

The present disclosure also provides a display device, and the display device may include a display panel according to various embodiments described above. FIG. 44 illustrates a schematic top view of an exemplary display device according to various embodiments of the present disclosure, and FIG. 45 illustrates a schematic cross-sectional view of the display device shown in FIG. 44 in a Z-Z direction.

Figure 45:
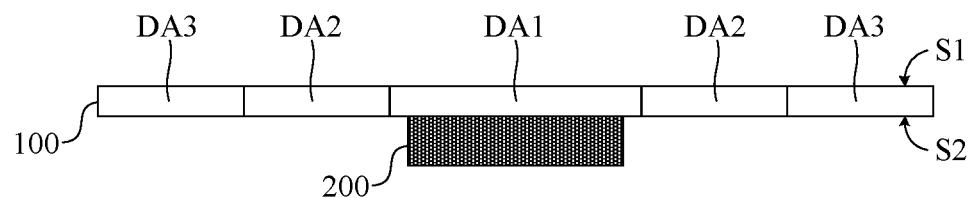
FIG. 45 illustrates a schematic cross-sectional view of the display device shown in FIG. 44 in a Z-Z direction.

Referring to FIGS. 44-45, the display device may include a display panel 100. The display panel 100 may be a display panel according to various embodiments of the present disclosure. The display panel may include a first display region DA1, a second display region DA2, and a third display region DA3. The light transmittance of the first display region DA1 may be greater than the light transmittance of the third display region DA3. The first display region DA1 may include an effective light-transmission region LA and a wiring region WA located on at least one side of the effective light-transmission region LA.

The display panel 100 may include a first surface 51 and a second surface S2 opposite to the first surface 51. The first surface 51 may be the display surface of the display panel 100. The display device may further include a photosensitive element 200. The photosensitive element 200 may be located on the second surface S2 side of the display panel 100. The photosensitive element 200 may correspond to the position of the first display region DA1. In one embodiment, the photosensitive surface of the photosensitive element 200 may correspond to the position of the effective light-transmission region LA.

The photosensitive element 200 may be an image acquisition device, configured to collect external image information. In one embodiment, the photosensitive element 200 may be a complementary metal-oxide-semiconductor (CMOS) image acquisition device. In other embodiments, the photosensitive element 200 may be a charge-coupled device (CCD) image acquisition device, or any other types of image acquisition device. It should be understood that the photosensitive element 200 may not be limited to an image acquisition device. For example, in some embodiments, the photosensitive element 200 may be an infrared sensor, a proximity sensor, or other light sensor.

According to the disclosed display device, the light transmittance of the first display region DA1 may be greater than the light transmittance of the third display region DA3, so that the display panel 100 may integrate the photosensitive element 200 on the back of the first display region DA1 to realize, for example, under-screen integration of the photosensitive element 200 in the image acquisition device, and in the meantime, the first display region DA1 may be able to display pictures. Therefore, the display area of the display panel 100 may be increased, and thus the full-screen design of the display device may be realized.

The display panel 100 may further include a plurality of first pixel circuits C1, a plurality of second pixel circuits C2, and a plurality of third pixel circuits C3. The plurality of first pixel circuits C1 and the second pixel circuits C2 may be located in the second display region DA2, and the third pixel circuits C3 may be located in the third display region DA3. The display panel 100 may also include a plurality of first light-emitting units LU1, a plurality of second light-emitting units LU2, and a plurality of third light-emitting units LU3. The first light-emitting units LU1 may be arranged in an array in the first display region DA1, the second light-emitting units LU2 may be arranged in an array in the second display region DA2, and the third light-emitting units LU3 may be arranged in an array in the third display region DA3.

The first light-emitting unit LU1 may include at least one first light-emitting element L1, the second light-emitting unit LU2 may include at least one second light-emitting element L2, and the third light-emitting unit LU3 may include at least one third light-emitting element L3. The first pixel circuit C1 may be electrically connected to at least one first light-emitting element L1, the second pixel circuit C2 may be electrically connected to at least one second light-emitting element L2, and the third pixel circuit C3 may be electrically connected to at least one third light-emitting element L3.

The display panel 100 may further include a plurality of first data lines 110, a plurality of second data lines 120, and a plurality of third data lines 130. The first data line 110 may be connected to the first pixel circuit C1 corresponding to a first light-emitting element L1 and the third pixel circuit C3 corresponding to a third light-emitting element L3. The first data line 110 may include a first sub-data line 111, a second sub-data line 112, and a third sub-data line 113 that are electrically connected together. The wiring region WA may be provided with a plurality of first sub-data lines 111, the second display region DA2 may be provided with a plurality of second sub-data lines 112, and the third display region DA3 may be provided with a plurality of third sub-data lines 113.

The second data line 120 may be connected to the second pixel circuit C2 corresponding to a second light-emitting element L2 and the third pixel circuit C3 corresponding to a third light-emitting element L3. The signals transmitted by the first data line 110, the second data line 120, and the third data line 130 may be the same type. For example, the first data line 110, the second data line 120, and the third data line 130 may all be used to transmit data signals.

According to the disclosed display device, the wiring region WA of the display panel may be provided with the first sub-data lines 111, the second display region DA2 may be provided with the second sub-data lines 112, and the third display region DA3 may be provided with the third sub-data lines 113. The first pixel circuits C1 and the first data lines 110 may be both arranged outside the effective light-transmission region LA. Therefore, the wiring structure in the effective light-transmission region LA may be reduced, and thus the light transmittance of the effective light-transmission region LA may be increased. When the photosensitive element 200 is integrated on the back of the effective light-transmission region LA to realize under-screen integration of the photosensitive element, the effective light-transmission region may be able to meet the higher requirements of the photosensitive element 200 on the light transmittance of the display panel. In each first data line 110, the first sub-data line 111 connecting to the second sub-data line 112 located in the second display region DA2 and the third sub-data line 113 located in the third display region DA3 may be disposed in the wiring region WA, so that the space on at least one side of the effective light-transmission region LA may be effectively used. The wiring region WA may accommodate a large number of first sub-data lines 111, and may thus be able to provide wiring feasibility for arranging data lines in the display panel 100 with a high pixel density and an effective light-transmission region LA.

It should be noted that the embodiments described above provide various implementations for improving the strength and wear resistance of the protective film in rollable screens, and also provide various implementations for adjusting the edge segment difference between the protective film and the telescopic bracket. Those skilled in the art may make any reasonable selection according to the actual rollable screen structure, which is not limited by the present disclosure.

It should be noted that the above are only some embodiments of the present disclosure and the applied technical principles. Those skilled in the art shall understand that the present disclosure is not limited to the specific embodiments described herein, and various obvious changes, readjustments, combinations and substitutions can be made without departing from the protection scope of the present disclosure. Therefore, although the present disclosure has been described in detail through the above embodiments, the present disclosure is not limited to the above embodiments, and can also include other equivalent embodiments without departing from the principle of the present disclosure. Any equivalent or modification thereof, without departing from the spirit and principle of the present disclosure, falls within the true scope of the present disclosure.

What is claimed is:

1. A display panel, comprising:
    a first display region, a second display region, and a third display region, wherein the second display region at least partially surrounds the first display region, the third display region at least partially surrounds the second display region and the first display region, and a light transmittance of the first display region is greater than a light transmittance of the third display region;
    a plurality of first pixel circuits, a plurality of second pixel circuits, and a plurality of third pixel circuits, wherein the plurality of first pixel circuits and the plurality of second pixel circuits are located in the second display region, and the plurality of third pixel circuits are located in the third display region;
    a plurality of first data lines, connected to the plurality of first pixel circuits and the plurality of third pixel circuits, wherein each first data line includes a first sub-data line, a second sub-data line, and a third sub-data line; and
    a plurality of second data lines, arranged along a first direction, extending along a second direction, connected to the plurality of second pixel circuits and the plurality of third pixel circuits, the first direction intersecting with the second direction;
    wherein:
        a plurality of second sub-data lines, a plurality of third sub-data lines, and a plurality of second data lines extend along the second direction; and
        a length of a first data line of the plurality of first data lines is greater than a length of a second data line of the plurality of second data lines.

2. The display panel according to claim 1, further including:
    a plurality of first light-emitting units, a plurality of second light-emitting units, and a plurality of third light-emitting units, wherein:
        the plurality of first light-emitting units are arranged in an array in the first display region, the plurality of second light-emitting units are arranged in an array in the second display region, and the plurality of third light-emitting units are arranged in an array in the third display region;
        each first light-emitting unit includes at least one first light-emitting element, each second light-emitting unit includes at least one second light-emitting element, and each third light-emitting unit includes at least one third light-emitting element;
        each first pixel circuit of the plurality of first pixel circuits is electrically connected to at least one corresponding first light-emitting element, each second pixel circuit of the plurality of second pixel circuits is electrically connected to at least one corresponding second light-emitting element, and each third pixel circuit of the plurality of third pixel circuits is electrically connected to at least one corresponding third light-emitting element;
        a first data line of the plurality of first data lines connects to the first pixel circuit corresponding to the at least one first light-emitting element and the third pixel circuit corresponding to the at least one third light-emitting element; and
        a second data line of the plurality of second data lines connects to the second pixel circuit corresponding to the at least one second light-emitting element and the third pixel circuit corresponding to the at least one third light-emitting element.

3. The display panel according to claim 2, wherein:
    the plurality of second data lines and the plurality of second sub-data lines are arranged alternatively along the first direction in the second display region.

4. The display panel according to claim 2, wherein:
one second sub-data line of the plurality of second sub-data lines is directly and electrically connected to the first pixel circuit;
one third sub-data line of the plurality of third sub-data lines is directly and electrically connected to the third pixel circuit; and
the second sub-data line and the third sub-data line belong to the same first data line at least partially overlap with each other along the first direction.

5. The display panel according to claim 4, wherein:
a total length of the plurality of third sub-data lines of the same first data line is shorter than a length of the second data line.

6. The display panel according to claim 2, wherein:
the first sub-data line extends along the first direction; and
two ends of the first sub-data line are connected to the second sub-data line and the third sub-data line.

7. The display panel according to claim 6, wherein the plurality of first sub-data lines are arranged along the second direction with lengths increasing or decreasing in sequence.

8. The display panel according to claim 2, further comprising a substrate, wherein:
along a direction perpendicular to a plane where the substrate is located, the first sub-data line at least overlaps with at least two second data lines of the plurality of second data lines.

9. The display panel according to claim 2, further comprising a substrate, wherein:
along a direction perpendicular to a plane where the substrate is located, the first sub-data line at least overlaps with at least two second sub-data lines of the plurality of second sub-data lines.

10. The display panel according to claim 2, further comprising a first non-display region, wherein:
along the second direction, the first non-display region is on a side of the first display region; and
at least one first sub-data line of the plurality of first sub-data lines are located in the first non-display region.

11. The display panel according to claim 10, wherein:
along the second direction, the first sub-data line is on a side of the first display region away from the first non-display region.

12. The display panel according to claim 2, wherein:
along the second direction, at least one first sub-data line of the plurality of first sub-data lines are located between the third pixel circuit and the first pixel circuit.

13. The display panel according to claim 2, wherein in the second display region and along the first direction, the plurality of first pixel circuits and the plurality of second pixel circuits are arranged alternatively.

14. The display panel according to claim 2, wherein:
along the second direction, the plurality of second sub-data lines is cut off in the second display region.

15. The display panel according to claim 2, further comprising:
a substrate;
a device layer, located on the substrate, wherein:
the plurality of first pixel circuits, the plurality of second pixel circuits, and the plurality of third pixel circuits are disposed in the device layer; and
the device layer includes a gate metal layer, a capacitor layer, and a source/drain metal layer arranged in a direction away from the substrate; and
a light-emitting element layer, located on a side of the device layer away from the substrate, wherein:
the plurality of first light-emitting units, the plurality of second light-emitting units, and the plurality of third light-emitting units are disposed in the light-emitting element layer;
the light-emitting element layer includes a first electrode layer, a light-emitting structure layer, and a second electrode layer arranged in the direction away from the substrate;
the first electrode layer includes a plurality of first electrodes;
each first light-emitting element includes a first electrode, the first display region includes a plurality of first connection lines, and each first connection line connects to first electrodes of adjacent first light-emitting units of the same color; and
at least one of the plurality first electrodes of the plurality of first light-emitting elements correspondingly connected to the same first pixel circuit are electrically connected by multiple first connection lines, and at least one of the multiple first connection lines is a transparent line.

16. The display panel according to claim 15, wherein:
the first electrode layer includes a first conductive layer, a second conductive layer, and a third conductive layer arranged in the direction away from the substrate, wherein:
the transparent line is located in at least one of the first conductive layer, the second conductive layer, or the third conductive layer.

17. The display panel according to claim 2, further comprising:
a plurality of third data lines, each third data line being connected to a third pixel circuit of the plurality of third pixel circuits corresponding to a third light-emitting element of the plurality of third light-emitting elements.

18. A display device comprising a display panel, including:
a first display region, a second display region, and a third display region, wherein the second display region at least partially surrounds the first display region, the third display region at least partially surrounds the second display region and the first display region, and a light transmittance of the first display region is greater than a light transmittance of the third display region;
a plurality of first pixel circuits, a plurality of second pixel circuits, and a plurality of third pixel circuits, wherein the plurality of first pixel circuits and the plurality of second pixel circuits are located in the second display region, and the plurality of third pixel circuits are located in the third display region;
a plurality of first data lines, connected to the plurality of first pixel circuits and the plurality of third pixel circuits, wherein each first data line includes a first sub-data line, a second sub-data line, and a third sub-data line; and
a plurality of second data lines, arranged along a first direction, extending along a second direction, connected to the plurality of second pixel circuits and the plurality of third pixel circuits, the first direction intersecting with the second direction;
wherein:
a plurality of second sub-data lines, a plurality of third sub-data lines, and a plurality of second data lines extend along the second direction; and a length of a first data line of the plurality of first data lines is greater than a length of a second data line of the plurality of second data lines.

19. The device according to claim 18, wherein the display panel further includes:
a plurality of first light-emitting units, a plurality of second light-emitting units, and a plurality of third light-emitting units, wherein:
the plurality of first light-emitting units are arranged in an array in the first display region, the plurality of second light-emitting units are arranged in an array in the second display region, and the plurality of third light-emitting units are arranged in an array in the third display region;
each first light-emitting unit includes at least one first light-emitting element, each second light-emitting unit includes at least one second light-emitting element, and each third light-emitting unit includes at least one third light-emitting element;
each first pixel circuit of the plurality of first pixel circuits is electrically connected to at least one corresponding first light-emitting element, each second pixel circuit of the plurality of second pixel circuits is electrically connected to at least one corresponding second light-emitting element, and each third pixel circuit of the plurality of third pixel circuits is electrically connected to at least one corresponding third light-emitting element;
a first data line of the plurality of first data lines connects to the first pixel circuit corresponding to the at least one first light-emitting element and the third pixel circuit corresponding to the at least one third light-emitting element; and
a second data line of the plurality of second data lines connects to the second pixel circuit corresponding to the at least one second light-emitting element and the third pixel circuit corresponding to the at least one third light-emitting element.

20. The device according to claim 19, wherein:
the plurality of second data lines and the plurality of second sub-data lines are arranged alternatively along the first direction in the second display region.

* * * * *